(12) United States Patent
Atsumi et al.

(10) Patent No.: US 11,972,790 B2
(45) Date of Patent: Apr. 30, 2024

(54) SEMICONDUCTOR DEVICE AND METHOD FOR DRIVING SEMICONDUCTOR DEVICE

(71) Applicant: Semiconductor Energy Laboratory Co., Ltd., Kanagawa-ken (JP)

(72) Inventors: Tomoaki Atsumi, Kanagawa (JP); Junpei Sugao, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 35 days.

(21) Appl. No.: 17/826,707

(22) Filed: May 27, 2022

(65) Prior Publication Data
US 2022/0293164 A1 Sep. 15, 2022

Related U.S. Application Data

(63) Continuation of application No. 16/732,555, filed on Jan. 2, 2020, now Pat. No. 11,355,179, which is a
(Continued)

(30) Foreign Application Priority Data

May 26, 2015 (JP) ................................ 2015-106761

(51) Int. Cl.
*G11C 11/401* (2006.01)
*G11C 11/4094* (2006.01)
(Continued)

(52) U.S. Cl.
CPC ........ *G11C 11/4094* (2013.01); *G11C 11/401* (2013.01); *G11C 11/4096* (2013.01);
(Continued)

(58) Field of Classification Search
CPC ............. G11C 11/4094; G11C 11/401; G11C 11/4097; G11C 11/4096; H01L 29/7869;
(Continued)

(56) References Cited

U.S. PATENT DOCUMENTS

| 5,528,032 A | 6/1996 | Uchiyama |
| 6,262,448 B1 | 7/2001 | Enders et al. |

(Continued)

FOREIGN PATENT DOCUMENTS

| JP | 06-275697 A | 9/1994 |
| JP | 2003-078044 A | 3/2003 |

(Continued)

*Primary Examiner* — Khamdan N. Alrobaie
(74) *Attorney, Agent, or Firm* — Husch Blackwell LLP

(57) ABSTRACT

The semiconductor device includes a first memory cell, and a second memory cell thereover. The first memory cell includes first and second transistors, and a first capacitor. The second memory cell includes third and fourth transistors, and a second capacitor. A gate of the first transistor is electrically connected to one of a source and a drain of the second transistor and the first capacitor. A gate of the third transistor is electrically connected to one of a source and a drain of the fourth transistor and the second capacitor. One of a source and a drain of the first transistor is electrically connected to one of a source and a drain of the third transistor. The second and fourth transistors include an oxide semiconductor. A channel length direction of the first and third transistors is substantially perpendicular to a channel length direction of the second and fourth transistors.

10 Claims, 26 Drawing Sheets

Related U.S. Application Data continuation of application No. 16/103,157, filed on Aug. 14, 2018, now Pat. No. 10,529,413, which is a continuation of application No. 15/164,133, filed on May 25, 2016, now Pat. No. 10,056,131.

(51) Int. Cl.
  *G11C 11/4096* (2006.01)
  *G11C 11/4097* (2006.01)
  *H01L 27/12* (2006.01)
  *H01L 29/786* (2006.01)
  *H10B 10/00* (2023.01)
  *H10B 41/70* (2023.01)

(52) U.S. Cl.
  CPC ...... *G11C 11/4097* (2013.01); *H01L 27/1225* (2013.01); *H01L 27/124* (2013.01); *H01L 27/1251* (2013.01); *H01L 27/1255* (2013.01); *H01L 29/78675* (2013.01); *H01L 29/7869* (2013.01); *H01L 29/78696* (2013.01); *H10B 10/12* (2023.02); *H10B 41/70* (2023.02)

(58) Field of Classification Search
  CPC ......... H01L 29/78696; H01L 29/78675; H01L 27/1225; H01L 27/124; H01L 27/1255; H01L 27/1251; H01L 27/1104; H01L 27/1156
  See application file for complete search history.

(56) References Cited

U.S. PATENT DOCUMENTS

| | | | |
|---|---|---|---|
| 6,727,544 B2 | 4/2004 | Endoh et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,330,208 B2 | 12/2012 | Alsmeier et al. |
| 8,349,681 B2 | 1/2013 | Alsmeier et al. |
| 8,372,720 B2 | 2/2013 | Fukuzumi et al. |
| 8,409,977 B2 | 4/2013 | Shim et al. |
| 8,450,791 B2 | 5/2013 | Alsmeier |
| 8,455,868 B2 | 6/2013 | Yamazaki et al. |
| 8,461,000 B2 | 6/2013 | Alsmeier et al. |
| 8,461,641 B2 | 6/2013 | Alsmeier et al. |
| 8,580,639 B2 | 11/2013 | Alsmeier et al. |
| 8,598,648 B2 | 12/2013 | Kato et al. |
| 8,610,187 B2 | 12/2013 | Yamazaki et al. |
| 8,729,624 B2 | 5/2014 | Fukuzumi. et al. |
| 8,765,543 B2 | 7/2014 | Alsmeier et al. |
| 8,829,591 B2 | 9/2014 | Alsmeier |
| 8,836,007 B2 | 9/2014 | Matsumoto et al. |
| 8,860,108 B2 | 10/2014 | Yamazaki et al. |
| 8,928,061 B2 | 1/2015 | Chien et al. |
| 8,946,810 B2 | 2/2015 | Alsmeier |
| 9,035,374 B2 | 5/2015 | Fukuzumi et al. |
| 9,048,321 B2 | 6/2015 | Kurata et al. |
| 9,059,029 B2 | 6/2015 | Arai |
| 9,070,589 B2 | 6/2015 | Kawai et al. |
| 9,076,685 B2 | 7/2015 | Kuge et al. |
| 9,117,923 B2 | 8/2015 | Shim et al. |
| 9,123,574 B2 | 9/2015 | Yamazaki et al. |
| 9,159,739 B2 | 10/2015 | Makala et al. |
| 9,165,940 B2 | 10/2015 | Chien et al. |
| 9,171,959 B2 | 10/2015 | Kurata et al. |
| 9,230,976 B2 | 1/2016 | Alsmeier |
| 9,312,257 B2 | 4/2016 | Yamazaki et al. |
| 9,349,735 B2 | 5/2016 | Yamazaki et al. |
| 9,356,042 B2 | 5/2016 | Fukuzumi et al. |
| 9,514,792 B2 | 12/2016 | Kajigaya |
| 9,514,944 B2 | 12/2016 | Masuoka et al. |
| 9,685,447 B2* | 6/2017 | Yamazaki ........... H01L 27/1255 |
| 9,748,273 B2 | 8/2017 | Yamazaki et al. |
| 9,806,079 B2 | 10/2017 | Yamazaki et al. |
| 9,978,757 B2 | 5/2018 | Yamazaki et al. |
| 9,991,265 B2 | 6/2018 | Yamazaki et al. |
| 10,038,011 B2 | 7/2018 | Yamazaki et al. |
| 10,103,154 B2 | 10/2018 | Masuoka et al. |
| 10,170,630 B2 | 1/2019 | Arai |
| 10,418,381 B2 | 9/2019 | Yamazaki et al. |
| 10,553,589 B2 | 2/2020 | Yamazaki et al. |
| 2008/0173933 A1 | 7/2008 | Fukuzumi et al. |
| 2011/0101332 A1 | 5/2011 | Yamazaki et al. |
| 2011/0101334 A1 | 5/2011 | Yamazaki et al. |
| 2011/0101351 A1 | 5/2011 | Yamazaki |
| 2011/0156027 A1 | 6/2011 | Yamazaki et al. |
| 2011/0233648 A1 | 9/2011 | Seol et al. |
| 2012/0001243 A1* | 1/2012 | Kato ..................... H10B 41/30 257/E27.06 |
| 2012/0275213 A1 | 11/2012 | Takemura |
| 2013/0070506 A1 | 3/2013 | Kajigaya |
| 2013/0221356 A1* | 8/2013 | Yamazaki ........... H01L 27/0688 257/296 |
| 2013/0228839 A1 | 9/2013 | Arai |
| 2013/0292671 A1 | 11/2013 | Yamazaki et al. |
| 2013/0334593 A1 | 12/2013 | Seol et al. |
| 2014/0151774 A1 | 6/2014 | Rhie |
| 2014/0225181 A1 | 8/2014 | Makala et al. |
| 2015/0179662 A1 | 6/2015 | Makala et al. |
| 2015/0311301 A1 | 10/2015 | Seol et al. |
| 2016/0104720 A1 | 4/2016 | Alsmeier |
| 2017/0040329 A1 | 2/2017 | Masuoka et al. |
| 2017/0271341 A1 | 9/2017 | Tanaka et al. |
| 2019/0371821 A1 | 12/2019 | Yamazaki et al. |
| 2022/0108985 A1* | 4/2022 | Nagatsuka ............. H10B 12/00 |

FOREIGN PATENT DOCUMENTS

| | | |
|---|---|---|
| JP | 2009-146954 A | 7/2009 |
| JP | 2011-066417 A | 3/2011 |
| JP | 2011-119674 A | 6/2011 |
| JP | 2011-151377 A | 8/2011 |
| JP | 2011-151383 A | 8/2011 |
| JP | 2011-211200 A | 10/2011 |
| JP | 2012-004473 A | 1/2012 |
| JP | 2013-065638 A | 4/2013 |
| JP | 2013-138187 A | 7/2013 |
| JP | 2013-153169 A | 8/2013 |
| JP | 2013-534058 | 8/2013 |
| JP | 2013-201396 A | 10/2013 |
| JP | 2013-211537 A | 10/2013 |
| JP | 2013-214729 A | 10/2013 |
| JP | 2014-175348 A | 9/2014 |
| JP | 2014-229740 A | 12/2014 |
| WO | WO-2011/074392 | 6/2011 |
| WO | WO-2011/077967 | 6/2011 |
| WO | WO-2011/114867 | 9/2011 |
| WO | WO-2014/184933 | 11/2014 |

* cited by examiner

FIG. 7

| | | Two-dimensional memory cell array 30[1] is erased at a time | Data is written to the first row of the two-dimensional memory cell array 30[1] | Data is read from the first row of the two-dimensional memory cell array 30[1] |
|---|---|---|---|---|
| WWL[1,1] | V3 / 0V | ‾‾⎍‾‾ | ‾‾⎍‾‾ | |
| WWL[2,1] -WWL[m₂,1] | V3 / 0V | ‾‾⎍‾‾ | | |
| WWL[1,2] -WWL[m₂,m₃] | V3 / 0V | | | |
| WBL[1] | V2 / 0V | | ‾‾⎍‾‾ | |
| WBL[2] -WBL[m₁] | V2 / 0V | | | |
| RWL[1,1] | V4 / 0V | | | |
| RWL[2,1] -RWL[m₂,1] | V4 / 0V | | | ‾‾⎍‾‾ |
| RBL[1] | Vdd / 0V | | | |
| RBL[2] -RBL[m₁] | Vdd / 0V | | | ‾‾‾‾ |
| SG1[1] | V1 / 0V | | | ‾‾⎍‾‾ |
| SG1[2] -SG1[m₃] | V1 / 0V | | | |
| SG2[1] | V1 / 0V | ‾‾⎍‾‾ | ‾‾⎍‾‾ | |
| SG2[2] -SG2[m₃] | V1 / 0V | | | |
| Vbias | Vdd / 0V | | | ⎍ |

FIG. 26A
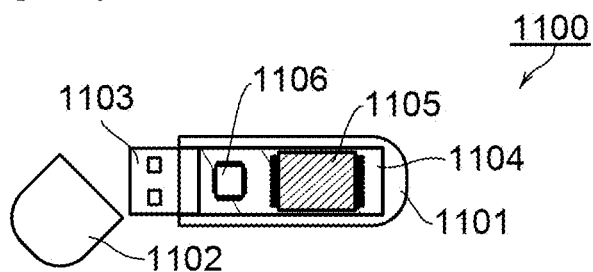
FIG. 26B  FIG. 26C
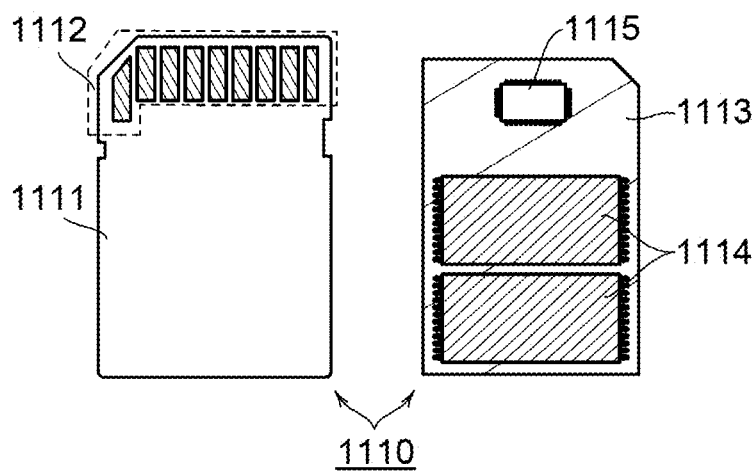
FIG. 26D
FIG. 26E
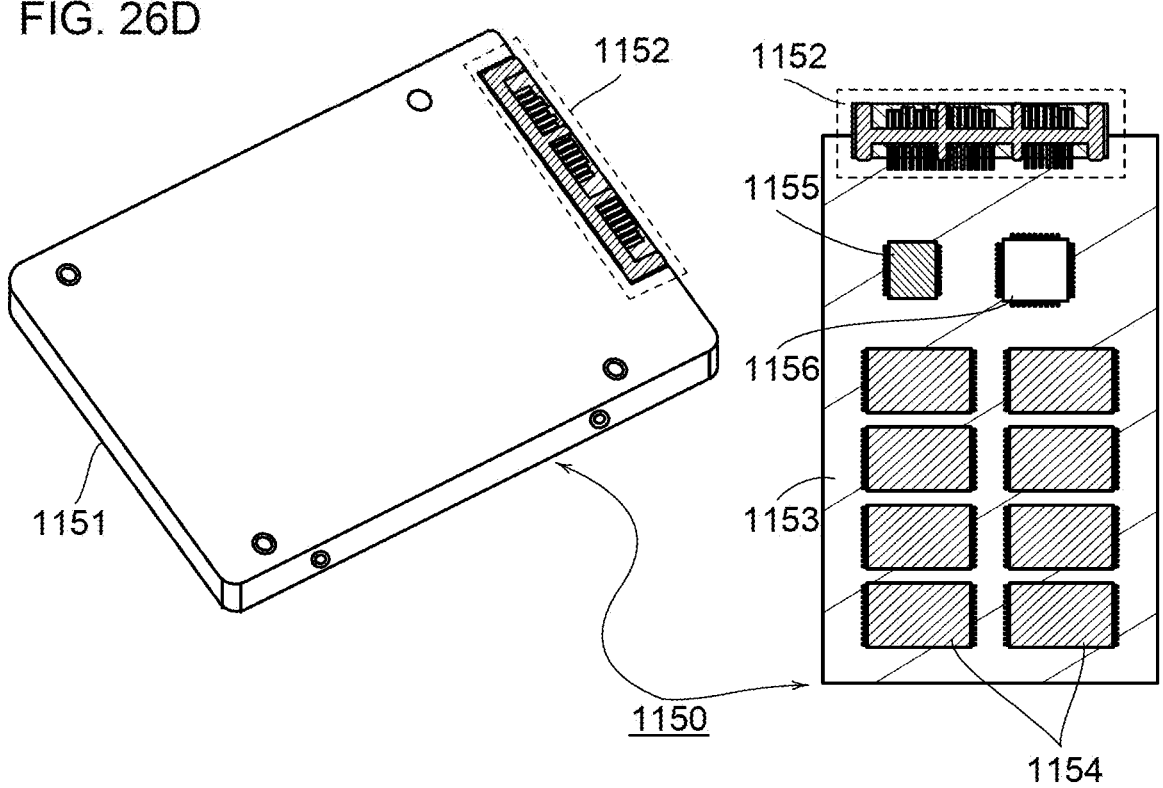

SEMICONDUCTOR DEVICE AND METHOD FOR DRIVING SEMICONDUCTOR DEVICE

This application is a continuation of copending U.S. application Ser. No. 16/732,555, filed on Jan. 2, 2020 which is a continuation of U.S. application Ser. No. 16/103,157, filed on Aug. 14, 2018 (now U.S. Pat. No. 10,529,413 issued Jan. 7, 2020) which is a continuation of U.S. application Ser. No. 15/164,133, filed on May 25, 2016 (now U.S. Pat. No. 10,056,131 issued Aug. 21, 2018) which are all incorporated herein by reference.

BACKGROUND OF THE INVENTION

1. Field of the Invention

The present invention relates to, for example, a transistor or a semiconductor device. The present invention relates to, for example, a method for manufacturing a transistor or a semiconductor device. The present invention relates to, for example, a display device, a light-emitting device, a lighting device, a power storage device, a storage device, a processor, or an electronic device. The present invention relates to a method for manufacturing a display device, a liquid crystal display device, a light-emitting device, a storage device, or an electronic device. The present invention relates to a method for driving a display device, a liquid crystal display device, a light-emitting device, a storage device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a storage device, a semiconductor circuit, and an electronic device include a semiconductor device in some cases.

2. Description of the Related Art

Much attention has been given to a semiconductor device that is capable of reading and writing data by using a combination of a transistor in which silicon (Si) is used for a semiconductor layer and a transistor in which an oxide semiconductor (OS) is used for a semiconductor layer (see Patent Document 1).

In recent years, with the increase in the amount of data dealt with, semiconductor devices having a larger storage capacity have been required. To increase storage capacity per unit area, stacking memory cells is effective (see Patent Document 2). Stacking memory cells can increase storage capacity per unit area in accordance with the number of the stacked memory cells.

[REFERENCE]

[Patent Document 1] Japanese Published Patent Application No. 2011-119674

[Patent Document 2] Japanese Published Patent Application No. 2011-066417

SUMMARY OF THE INVENTION

An object is to provide a semiconductor device with a large storage capacity per unit area. Another object is to provide a semiconductor device with a novel structure in which memory cells are stacked. Another object is to provide a method for driving a semiconductor device with a novel structure.

Another object is to provide a module including any of the above semiconductor devices. Another object is to provide an electronic device including any of the above semiconductor devices or the module. Another object is to provide a novel semiconductor device. Another object is to provide a novel module. Another object is to provide a novel electronic device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first memory cell, and a second memory cell over the first memory cell. The first memory cell includes a first transistor, a second transistor, and a first capacitor. The second memory cell includes a third transistor, a fourth transistor, and a second capacitor. A gate of the first transistor is electrically connected to one of a source and a drain of the second transistor. The one of the source and the drain of the second transistor is electrically connected to one electrode of the first capacitor. A gate of the third transistor is electrically connected to one of a source and a drain of the fourth transistor. The one of the source and the drain of the fourth transistor is electrically connected to one electrode of the second capacitor. One of a source and a drain of the first transistor is electrically connected to one of a source and a drain of the third transistor. The second transistor and the fourth transistor include an oxide semiconductor. A channel length direction of the first transistor and the third transistor is substantially perpendicular to a channel length direction of the second transistor and the fourth transistor.

Another embodiment of the present invention is a semiconductor device including a first memory cell over a substrate, and a second memory cell over the first memory cell. The first memory cell includes a first transistor, a second transistor, and a first capacitor. The second memory cell includes a third transistor, a fourth transistor, and a second capacitor. A gate of the first transistor is electrically connected to one of a source and a drain of the second transistor. The one of the source and the drain of the second transistor is electrically connected to one electrode of the first capacitor. A gate of the third transistor is electrically connected to one of a source and a drain of the fourth transistor. The one of the source and the drain of the fourth transistor is electrically connected to one electrode of the second capacitor. One of a source and a drain of the first transistor is electrically connected to one of a source and a drain of the third transistor. The second transistor and the fourth transistor include an oxide semiconductor. A channel length direction of the first transistor and the third transistor is substantially perpendicular to a top surface of the substrate.

Another embodiment of the present invention is a semiconductor device including a first memory cell over a substrate, and a second memory cell over the first memory cell. The first memory cell includes a first transistor, a second transistor, and a first capacitor. The second memory cell includes a third transistor, a fourth transistor, and a second capacitor. A gate of the first transistor is electrically connected to one of a source and a drain of the second transistor. The one of the source and the drain of the second transistor is electrically connected to one electrode of the first capacitor. A gate of the third transistor is electrically connected to one of a source and a drain of the fourth transistor. The one of the source and the drain of the fourth transistor is electrically connected to one electrode of the second capacitor. One of a source and a drain of the first transistor is electrically connected to one of a source and a drain of the third transistor. The second transistor and the fourth transistor include an oxide semiconductor. The first transistor and the third transistor include part of a semiconductor extending substantially perpendicularly to a top surface of the substrate.

In another embodiment of the present invention, the semiconductor extending substantially perpendicularly to the top surface of the substrate is preferably polycrystalline silicon. Furthermore, in another embodiment of the present invention, the semiconductor extending substantially perpendicularly to the top surface of the substrate is preferably cylindrical.

Another embodiment of the present invention is a semiconductor device including a plurality of memory cell arrays arranged in a first direction, a plurality of first wirings, and a plurality of second wirings. The plurality of first wirings and the plurality of second wirings extend in a second direction substantially perpendicular to the first direction. Each of the memory cell arrays includes a plurality of memory cell strings arranged in the second direction. The plurality of memory cell strings extend in a third direction substantially perpendicular to the first direction and the second direction. Each of the memory cell strings includes a plurality of memory cells and third to fifth wirings extending in the third direction. Each of the memory cells includes a first transistor, a second transistor, and a capacitor. A channel length direction of the first transistor is substantially parallel to the third direction. The second transistor includes an oxide semiconductor. A gate of the first transistor is electrically connected to one of a source and a drain of the second transistor. The one of the source and the drain of the second transistor is electrically connected to one electrode of the capacitor. In one of the plurality of memory cell strings, the plurality of memory cells are electrically connected to each other via the sources and the drains of the first transistors; the one of the source and the drain of the first transistor of the memory cell at one end of the memory cell string is electrically connected to the third wiring; the other of the source and the drain of the first transistor of the memory cell at the other end of the memory cell string is electrically connected to the fourth wiring; the other of the source and the drain of the second transistor of each of the plurality of memory cells is electrically connected to the fifth wiring. In one of the plurality of memory cell arrays, the other electrode of the capacitor of each of the memory cells in a same row is electrically connected to one of the plurality of first wirings; and a gate of the second transistor of each of the memory cells in a same row is electrically connected to one of the plurality of second wirings.

Another embodiment of the present invention is a method for driving the above semiconductor device. In a writing operation, one of the plurality of memory cell arrays is selected; the second transistor is turned on via one of the plurality of second wirings; a writing potential is supplied to the plurality of fifth wirings; and the second transistor is turned off via one of the plurality of second wirings, and data corresponding to the writing potential is held. In a reading operation, one of the plurality of memory cell arrays is selected; a first potential is supplied to the other electrode of the capacitor via one of the plurality of first wirings; a second potential different from the first potential is supplied to the other electrode of the capacitor via the first wiring in a row different from that of the one of the plurality of first wirings so that the first transistor is turned on; and a reading potential is supplied to the third wiring and the data is read from a change in the reading potential.

Another embodiment of the present invention is a storage device including the above semiconductor device.

A semiconductor device with a large storage capacity per unit area, a semiconductor device with a novel structure in which memory cells are stacked, or a method for driving a semiconductor device with a novel structure can be provided.

Alternatively, a module including any of the above semiconductor devices can be provided. An electronic device including any of the above semiconductor devices or the module can be provided. Alternatively, a novel semiconductor device can be provided. Alternatively, a novel module can be provided. Alternatively, a novel electronic device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIG. 7 is a timing chart showing a method for driving a semiconductor device of one embodiment of the present invention;

FIGS. 26A to 26E are schematic top views of storage devices of embodiments of the present invention.

DETAILED DESCRIPTION OF THE INVENTION

Figure 1A:
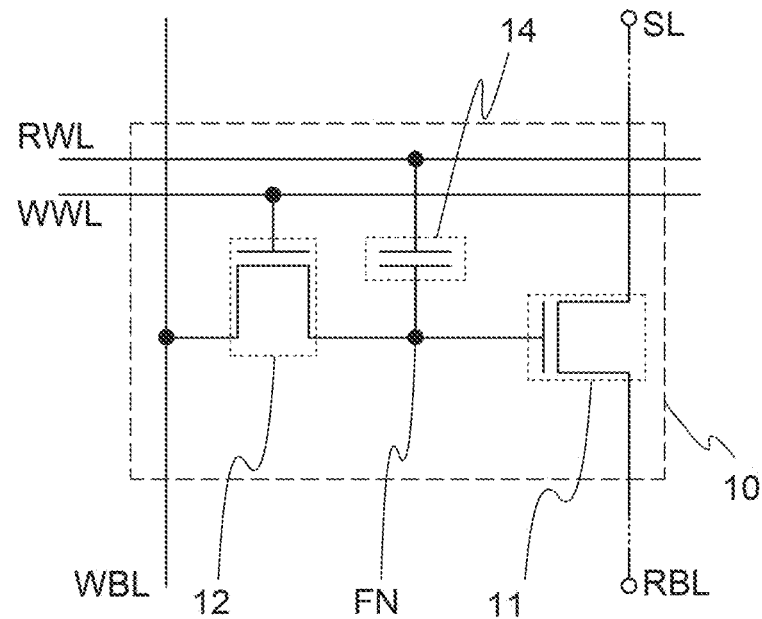
FIGS. 1A and 1B are circuit diagrams illustrating a semiconductor device of one embodiment of the present invention.

Embodiments of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to the description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

Note that a voltage refers to a potential difference between a certain potential and a reference potential (e.g., a ground potential (GND) or a source potential) in many cases. A voltage can be referred to as a potential and vice versa. In general, a potential (a voltage) is relative and is determined depending on the difference relative to a reference potential. Therefore, even a "ground potential," for example, is not necessarily 0 V. For example, in some cases, a "ground potential" is the lowest potential in a circuit. In other cases, a "ground potential" is a moderate potential in a circuit. In those cases, a positive potential and a negative potential are set using the potential as a reference.

Note that the ordinal numbers such as "first" and "second" are used for the sake of convenience and do not denote the order of steps or the stacking order of layers. Therefore, for example, description can be given even when "first" is replaced with "second" or "third", as appropriate. In addition, the ordinal numbers in this specification and the like are not necessarily the same as those which specify one embodiment of the present invention.

In this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that a "source" of a transistor in this specification means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity type of the transistor or the levels of potentials supplied to terminals. In general, in an n-channel transistor, a terminal to which a lower potential is supplied is called a source, and a terminal to which a higher potential is supplied is called a drain. In a p-channel transistor, a terminal to which a lower potential is supplied is called a drain, and a terminal to which a higher potential is supplied is called a source. In this specification, although connection relation of the transistor is described assuming that the source and the drain are fixed, for convenience in some cases, the names of the source and the drain actually interchange with each other depending on the relation of the potentials.

Unless otherwise specified, off-state current in this specification refers to the drain current of a transistor in an off state. Unless otherwise specified, the off state of an n-channel transistor means that a potential difference ($V_{GS}$) between its gate and source is lower than the threshold voltage ($V_{th}$), and the off state of a p-channel transistor means that $V_{GS}$ is higher than $V_{th}$. For example, the off-state current of an n-channel transistor sometimes refers to a drain current that flows when $V_{GS}$ is lower than $V_{th}$. The off-state current of a transistor depends on $V_{GS}$ in some cases. Thus, "the off-state current of a transistor is lower than or equal to $10^{-21}$ A" may mean that "there is $V_{GS}$ with which the off-state current of the transistor is lower than or equal to $10^{-21}$ A".

The off-state current of a transistor depends on a potential difference (VD's) between its drain and source in some cases. Unless otherwise specified, the off-state current in this specification may be an off-state current at $V_{DS}$ whose absolute value is 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{DS}$ at which the reliability of a semiconductor device or the like including the transistor is ensured or $V_{DS}$ at which the semiconductor device or the like including the transistor is used.

Note that a "semiconductor" may have the characteristics of an "insulator" when the conductivity is sufficiently low, for example. In addition, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" may have the characteristics of a "conductor" when the conductivity is sufficiently high, for example. In addition, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the density of states (DOS) might be formed in a semiconductor, the carrier mobility might be decreased, or the crystallinity might be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specifically, there are hydrogen (contained in water), lithium, sodium, silicon, boron, phosphorus, carbon, and nitrogen, for example. In the case where the semiconductor is an oxide semiconductor, oxygen vacancies might be formed by entry of an impurity. When the semiconductor is silicon, examples of an impurity which changes the characteristics of the semiconductor include oxygen, Group 1 elements except hydrogen, Group 2 elements, Group 13 elements, and Group 15 elements.

The channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not fixed to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel formation region formed in a side surface of a semiconductor is increased in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Thus, in this specification, in a top view of a transistor, an apparent channel width that is the length of a portion where a source and a drain face each other in a region where a semiconductor region and a gate electrode overlap with each other is referred to as a surrounded channel width (SCW) in some cases. Furthermore, in this specification, the term "channel width" may denote a surrounded channel width, an apparent channel width, or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate the field-effect mobility, the current value per channel width, and the like of a transistor. In this case, the obtained value is sometimes different from the value obtained by using an effective channel width for the calculation.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

In this specification, trigonal and rhombohedral crystal systems are included in a hexagonal crystal system.

Embodiment 1

In this embodiment, circuit configurations and operations of a semiconductor device of one embodiment of the disclosed invention will be described with reference to FIGS. 1A and 1B to FIG. 7.

<Memory Cell>

Figure 1B:
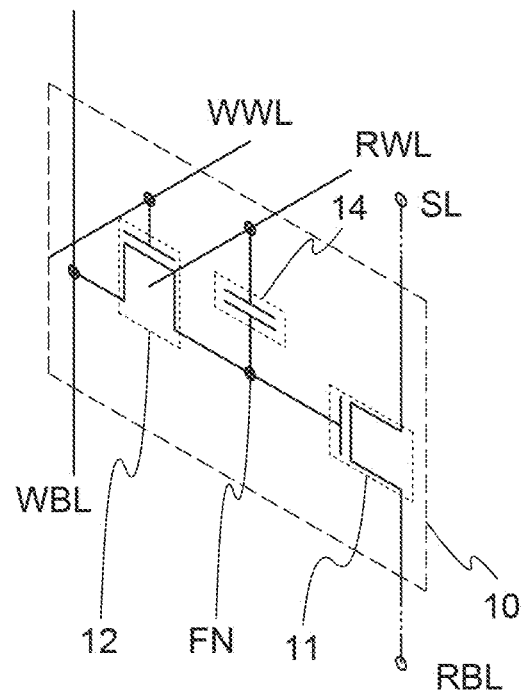

First, the circuit configuration and operations of a memory cell of a semiconductor device that is to be described later will be described with reference to FIGS. 1A and 1B. FIG. 1A is an example of a planar circuit diagram illustrating the circuit configuration of a memory cell 10. FIG. 1B is an example of a three-dimensional circuit diagram of the circuit configuration of the memory cell 10 that corresponds to the three-dimensional circuit configuration of the semiconductor device to be described later.

In the memory cell 10 illustrated in FIGS. 1A and 1B, a wiring SL and a source electrode (or a drain electrode) of a transistor 11 are electrically connected to each other, and a wiring RBL and the drain electrode (or the source electrode) of the transistor 11 are electrically connected to each other. In addition, a wiring WBL and a source electrode (or a drain electrode) of a transistor 12 are electrically connected to each other, and a wiring WWL and a gate electrode of the transistor 12 are electrically connected to each other. A gate electrode of the transistor 11 and the drain electrode (or the source electrode) of the transistor 12 are electrically connected to one electrode of a capacitor 14. A wiring RWL and the other electrode of the capacitor 14 are electrically connected to each other.

Here, a transistor using an oxide semiconductor is preferably used as the transistor 12. As will be described in detail later, a transistor including an oxide semiconductor has an extremely small off-state current. For that reason, the potential of the gate electrode of the transistor 11 can be held for an extremely long time when the transistor 12 is in an off state. Providing the capacitor 14 facilitates holding of charge given to the gate electrode of the transistor 11 and reading of stored data.

Note that there is no particular limitation on the transistor 11. In terms of increasing the speed of reading data, it is preferable to use a transistor with a high switching speed, such as a transistor using polycrystalline silicon or single crystal silicon, for example.

The memory cell 10 illustrated in FIGS. 1A and 1B utilizes a characteristic in which the potential of the gate electrode of the transistor 11 can be held, whereby writing, holding, and reading of data can be performed as follows.

Writing and holding of data will be described. First, the potential of the wiring WWL is set to a potential at which the transistor 12 is turned on, so that the transistor 12 is turned on. Thus, the potential of the wiring WBL is supplied to a node (also referred to as a node FN) where the drain electrode (or the source electrode) of the transistor 12, the gate electrode of the transistor 11, and one electrode of the capacitor 14 are electrically connected to each other. In other words, a predetermined charge is supplied to the gate electrode of the transistor 11 (data writing). Here, one of charges for supply of two different potentials (hereinafter, a charge for supply of a low potential is referred to as a charge $Q_L$ and a charge for supply of a high potential is referred to as a charge $Q_H$) is given. Note that charges for supply of three or more different potentials may be supplied to increase storage capacity. After that, the potential of the wiring WWL is set to a potential which allows the transistor 12 to be turned off, so that the transistor 12 is turned off. Thus, the charge supplied to the gate electrode of the transistor 11 is held (data holding).

Since the off-state current of the transistor 12 is extremely small, the charge of the gate electrode of the transistor 11 is held for a long time.

Next, data reading will be described. An appropriate potential (a reading potential) is supplied to the wiring RWL while a predetermined potential (a constant potential) is supplied to the wiring SL, whereby the potential of the wiring RBL varies depending on the amount of charge stored in the gate electrode of the transistor 11. This is because in general, when the transistor 11 is an n-channel transistor, an apparent threshold voltage $V_{th\_H}$ when $Q_H$ is given to the gate electrode of the transistor 11 is lower than an apparent threshold voltage $V_{th\_L}$ when $Q_L$ is given to the gate electrode of the transistor 11. Here, an apparent threshold voltage refers to the potential of the wiring RWL which is needed to turn on or off the transistor 11. Thus, the potential of the wiring RWL is set to a potential $V_0$ which is between $V_{th\_H}$ and $V_{th\_L}$, whereby a charge supplied to the gate electrode of the transistor 11 can be determined. For example, in the case where $Q_H$ is given in writing, when the potential of the wiring RWL is set to $V_0$ ($>V_{th\_H}$), the transistor 11 is turned on. In the case where $Q_L$ is given in writing, even when the potential of the wiring RWL is set to $V_0$ ($<V_{th\_L}$), the transistor 11 remains off. Note that when the transistor 11 is a p-channel transistor, the transistor 11 is turned on in the case where $Q_L$ is given, and the transistor 11 remains off in the case where $Q_H$ is given. Therefore, the data held can be read by measuring the potential of the wiring RBL.

Note that in the case where memory cells are arranged in a matrix, it is necessary that only data of a desired memory cell can be read. Thus, in order that data of predetermined memory cells can be read and data of the other memory cells cannot be read, in the case where the transistors 11 of the memory cells are connected to each other in series, a potential at which the transistor 11 is turned on regardless of a state of the gate electrode, that is, a potential lower than $V_{th\_L}$ is supplied to the wirings RWL of the memory cells from which data is not to be read. In this case, when a potential higher than $V_{th\_L}$ is supplied to the wiring RWL, a potential at which the transistor 11 is turned on is supplied to the gate electrode of the transistor 11 via the capacitor 14, so that the transistor 11 can be turned on without depending on data stored in the node FN.

Next, data rewriting will be described. Data rewriting is performed in a manner similar to that of the writing and holding of data. That is, the potential of the wiring WWL is set to a potential at which the transistor 12 is turned on, so that the transistor 12 is turned on. Consequently, the potential of the wiring WBL (a potential for new data) is supplied to the gate electrode of the transistor 11 and the capacitor 14. After that, the potential of the wiring WWL is set to a potential at which the transistor 12 is turned off, so that the transistor 12 is turned off. Thus, the charge for new data is stored in the gate electrode of the transistor 11.

Thus, in the semiconductor device of the disclosed invention, data can be directly rewritten by overwriting of new data. Therefore, extraction of charge from a floating gate with the use of a high voltage which is necessary for an erasing operation of a flash memory or the like is not needed, and thus a decrease in operation speed due to the erasing operation can be suppressed. That is, the high-speed operation of the semiconductor device can be achieved.

Note that the node (the node FN) where the drain electrode (or the source electrode) of the transistor 12, the gate electrode of the transistor 11, and one electrode of the capacitor 14 are electrically connected to each other has a function similar to that of a floating gate of a floating-gate transistor which is used as a nonvolatile memory element. When the transistor 12 is off, the node FN can be regarded as being embedded in an insulator and charge is held in the node FN. The off-state current of the transistor 12 including an oxide semiconductor is smaller than or equal to 1/100000 of the off-state current of a transistor including a silicon semiconductor; thus, the charge accumulated in the node FN can be stored for a long period. That is, with the transistor 12 including an oxide semiconductor, a storage device which can hold data for a long period without being supplied with power can be provided.

For example, when the off-state current of the transistor 12 at room temperature (25° C.) is 10 zA (1 zA (zeptoampere) is $1\times10^{-21}$ A) or less and the capacitance of the capacitor 14 is approximately 10 fF, data can be held for $10^4$ seconds or longer. It is needless to say that the storage time depends on transistor characteristics and the capacitance value.

Furthermore, the memory cell 10 illustrated in this embodiment does not have a problem of deterioration of a gate insulating film (a tunnel insulating film), which is a problem of a conventional floating gate transistor. That is to say, the deterioration of a gate insulating film due to injection of electrons into a floating gate, which has been regarded as a problem, can be solved. This means that there is no limit on the number of times of writing in principle. Moreover, a high voltage needed for writing or erasing data in a conventional floating gate transistor is not necessary.

In the memory cell 10, the node FN has a function similar to that of a floating gate of a floating gate transistor of a flash memory or the like, but the node FN of this embodiment has a feature that is essentially different from that of the floating gate of the flash memory or the like. In the case of a flash memory, since a potential supplied to a control gate is high, it is necessary to keep a proper distance between cells in order to prevent the potential from affecting a floating gate of an adjacent cell. This is a factor inhibiting high integration of the semiconductor device. The factor is attributed to a basic principle of a flash memory, in which a tunneling current flows in applying a high electrical field.

In contrast, the semiconductor device of this embodiment operates by switching of a transistor including an oxide semiconductor and does not use the above-described principle of charge injection by a tunneling current. That is, the semiconductor device of this embodiment does not require a high electrical field for charge injection unlike a flash memory. Accordingly, it is not necessary to consider an influence of a high electrical field from a control gate on an adjacent cell, which facilitates high integration.

Note that in order to increase the storage capacity of the semiconductor device, a multilevel technique can be employed instead of increasing integration degree. For example, three or more levels of data are written to one memory cell, whereby the storage capacity can be increased as compared with the case where two-level (one-bit) data is written. For example, a charge Q for supplying a different potential may be supplied to the gate electrode of the transistor 11 in addition to the charge $Q_L$ for supplying a low potential and the charge $Q_H$ for supplying a high potential, which are described above, whereby the multilevel technique can be achieved. It is acceptable as long as data such as 4-level (2-bit) data, 8-level (3-bit) data, or 16-level (4-bit) data can be held as multilevel data.

Note that, in the above description, an n-channel transistor using electrons as carriers is used; however, a p-channel transistor using holes as carriers, needless to say, can be used instead of an n-channel transistor.

In a memory cell array that is to be described later, the memory cell 10 is preferably provided such that the channel length direction of the transistor 11, the channel length direction of the transistor 12, the wiring SL, the wiring RBL, the wiring WBL, the wiring RWL, and the wiring WWL cross three-dimensionally, as illustrated in FIG. 1B.

The channel length direction of the transistor 11 is preferably substantially perpendicular to the channel length direction of the transistor 12. The channel length direction of the transistor 11 is preferably substantially perpendicular to the top surface of a substrate over which the memory cell 10 is provided, and the channel length direction of the transistor 12 is preferably substantially parallel to the top surface of the substrate.

Furthermore, the wiring WWL and the wiring RWL are preferably substantially perpendicular to the wiring RBL, the wiring SL, and the wiring WBL. The wiring RBL, the wiring SL, and the wiring WBL are preferably substantially perpendicular to the top surface of the substrate over which the memory cell 10 is provided, and the wiring WWL and the wiring RWL are preferably substantially parallel to the top surface of the substrate.

With such a configuration of the memory cell 10, a plurality of memory cells 10 can be stacked such that the transistors 11 are connected in series to each other as described later. This allows fabrication of a semiconductor device whose storage capacity per unit area can be increased in accordance with the number of stacked memory cells 10.

Furthermore, with a circuit configuration in which the transistor 11 is provided such that the channel length direction thereof is perpendicular to the top surface of the substrate in the aforementioned manner, an upright transistor whose gate electrode surrounds a semiconductor and whose source and drain electrodes are provided over and under the transistor (surrounding gate transistor (SGT)) can be easily used. Assuming that the minimum feature size is F, the area of a standard planar transistor is $8F^2$, whereas the area of an SGT is as small as $4F^2$. Thus, storage capacity per unit area can be further increased.

<Memory Cell Array>

Next, more specific circuit configurations to which the circuit illustrated in FIGS. 1A and 1B is used and operations thereof will be described with reference to FIGS. 2 to 7.

Figure 2:
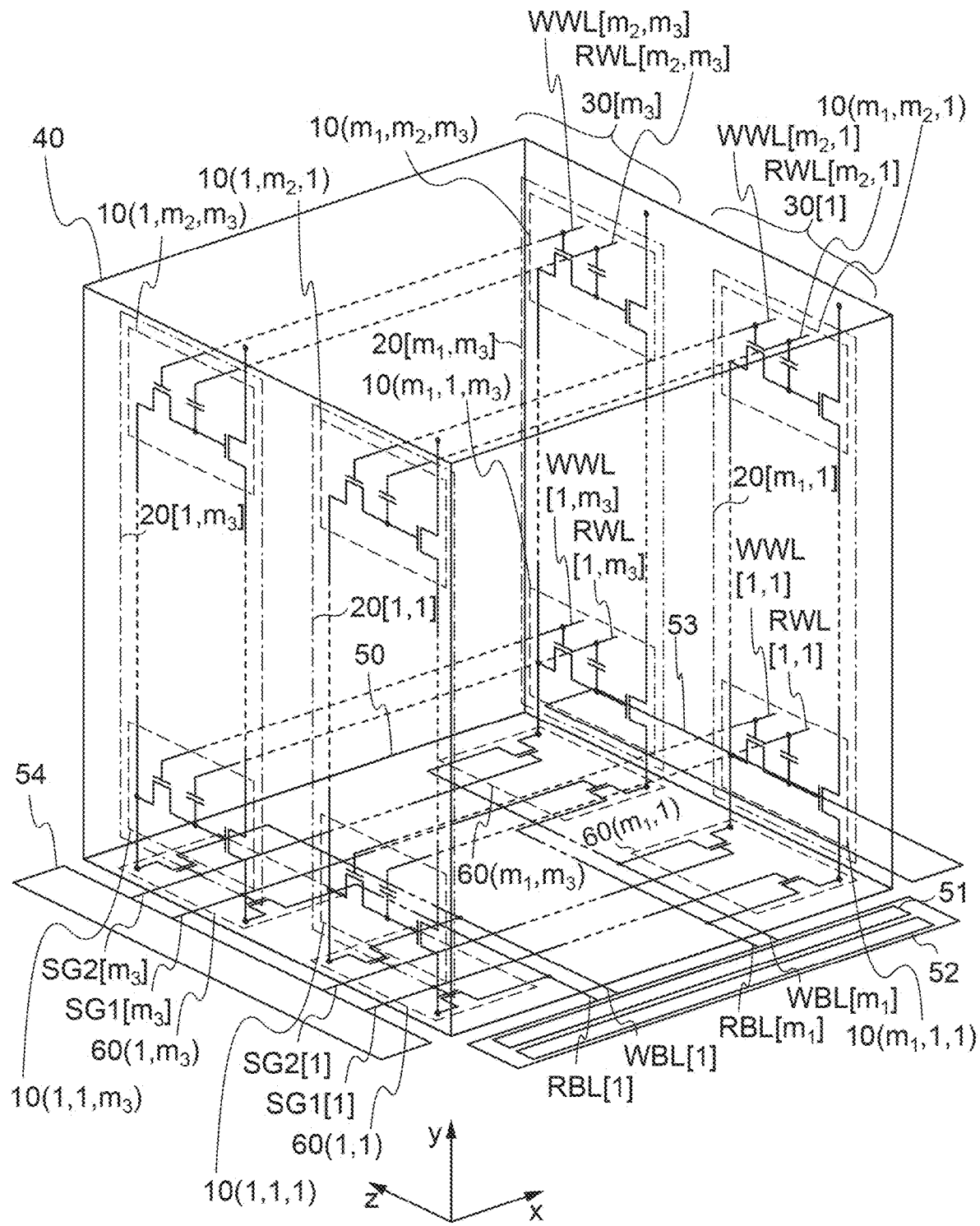
FIG. 2 is a circuit diagram illustrating a semiconductor device of one embodiment of the present invention.

FIG. 2 illustrates an example of a block circuit diagram of a semiconductor device including a three-dimensional memory cell array 40, a selection transistor array 50, a driver circuit 51, a read circuit 52, a driver circuit 53, and a driver circuit 54. Note that in the following description, rectangular coordinates using an x-axis, a y-axis, and a z-axis are set as illustrated in FIG. 2 for the sake of convenience.

Figure 3:
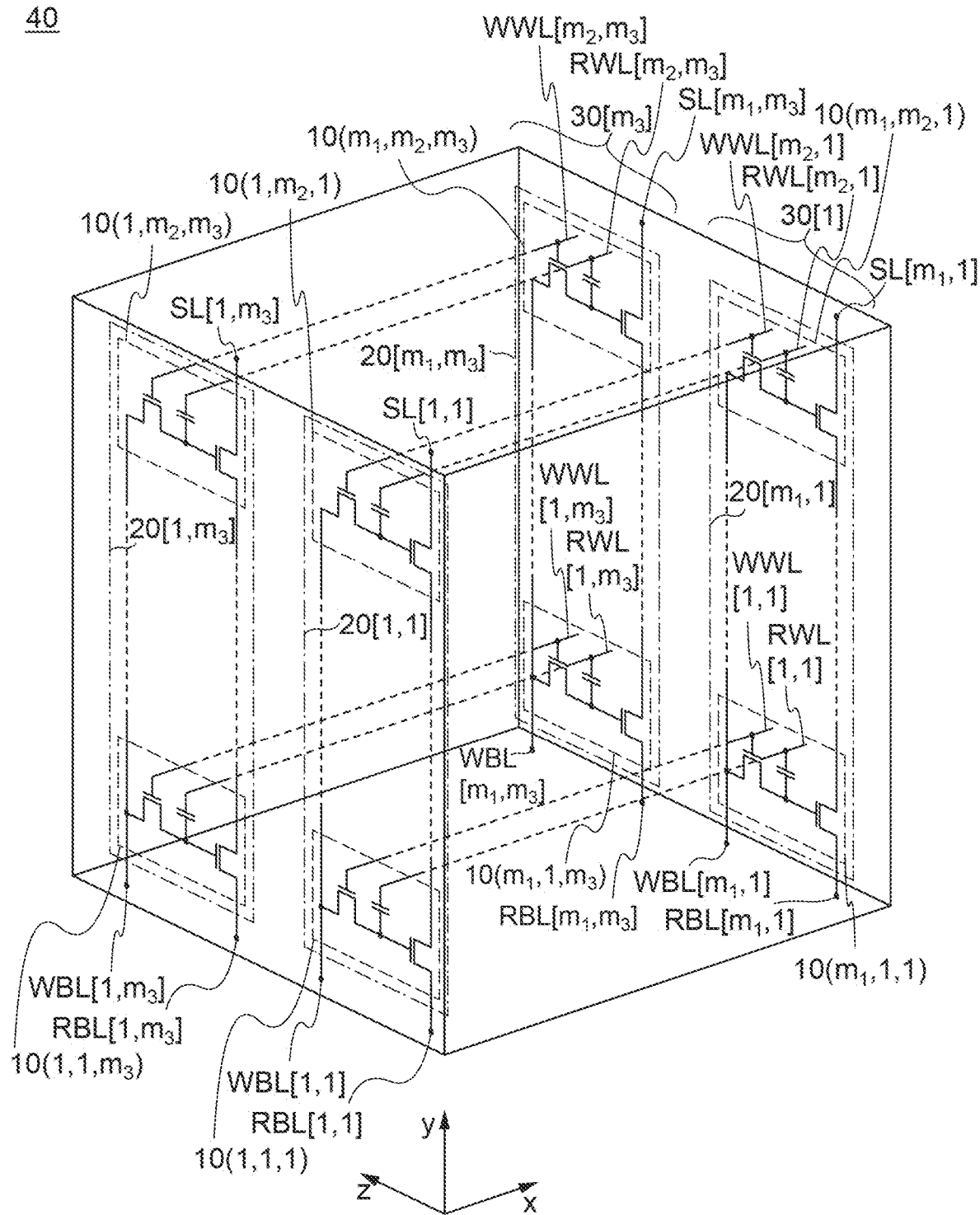
FIG. 3 is a circuit diagram illustrating a semiconductor device of one embodiment of the present invention.
Figure 4:
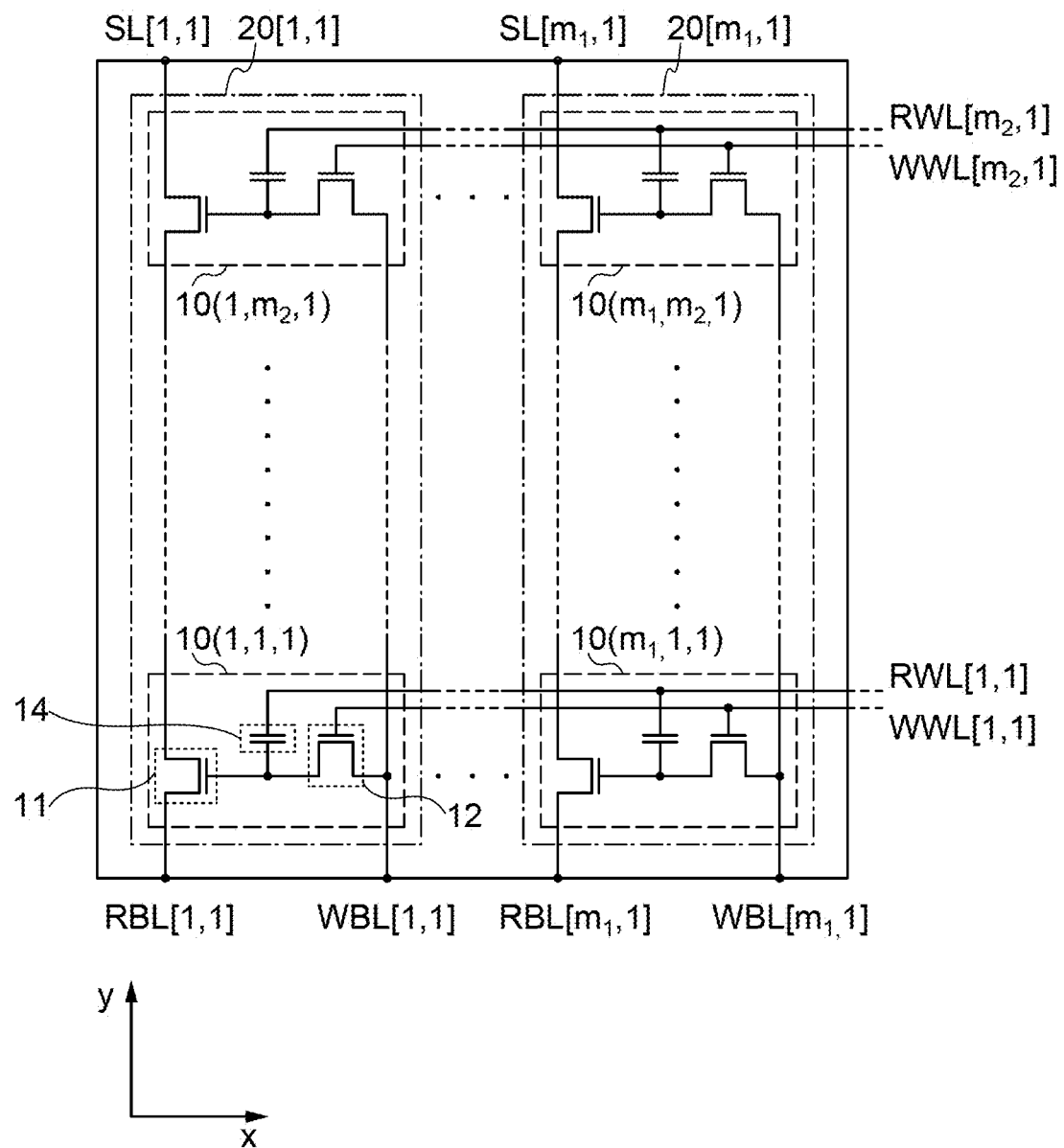
FIG. 4 is a circuit diagram illustrating a semiconductor device of one embodiment of the present invention.
Figure 5:
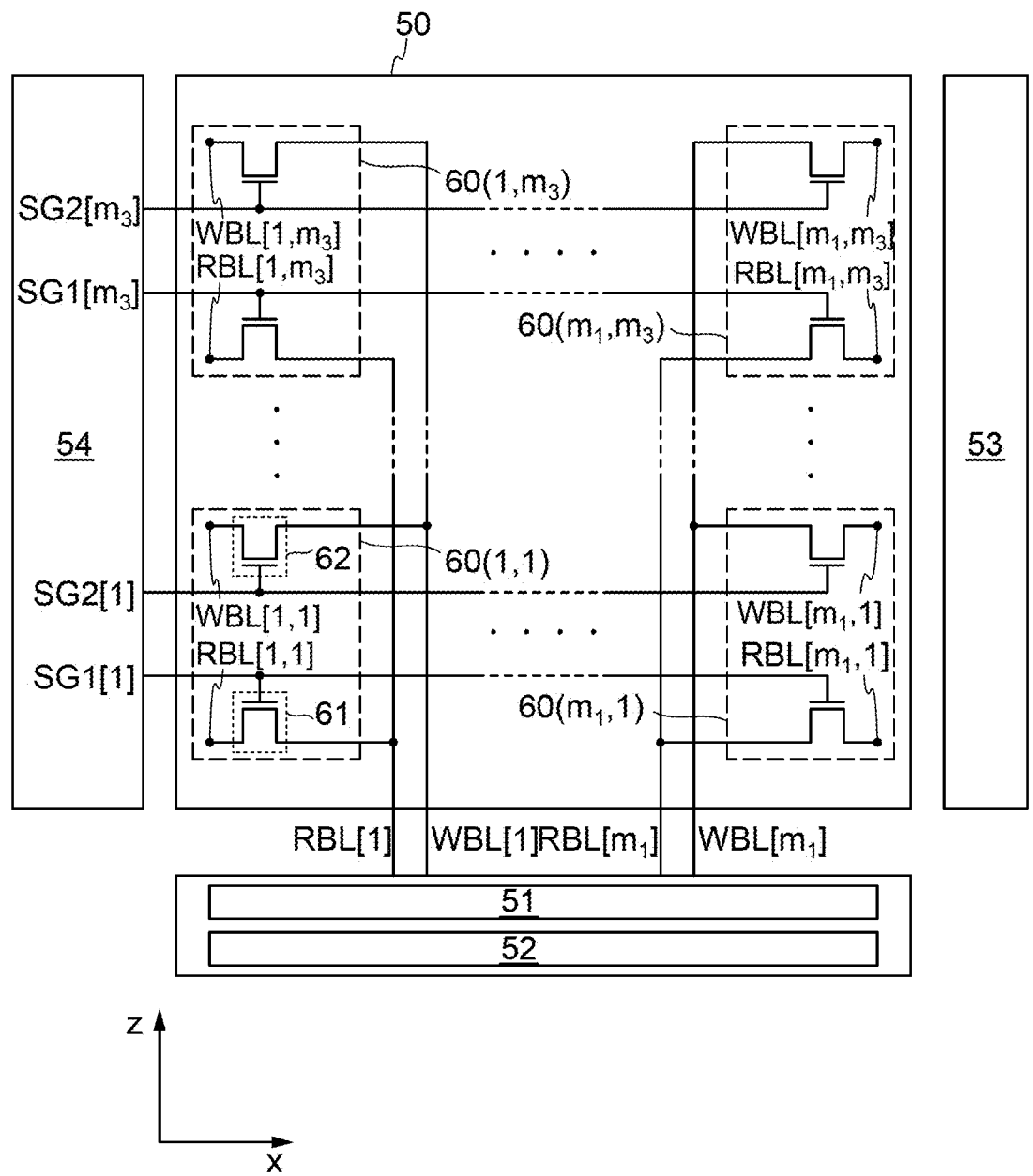
FIG. 5 is a circuit diagram illustrating a semiconductor device of one embodiment of the present invention.

Since the diagram in FIG. 2 is partly complicated, an example of a block circuit diagram of only the three-dimensional memory cell array 40 is illustrated in FIG. 3. Furthermore, FIG. 4 illustrates an example of a block circuit diagram of a two-dimensional memory cell array 30 [1] included in the three-dimensional memory cell array 40. Note that FIG. 4 is an example of a planar block circuit diagram of the two-dimensional memory cell array 30 [1], and a part of the configuration in the z-axis direction is artificially illustrated on the x-y plane. FIG. 5 illustrates an example of a block circuit diagram of the selection transistor array 50, the driver circuit 51, the read circuit 52, the driver circuit 53, and the driver circuit 54.

The selection transistor array 50, the driver circuit 51, the read circuit 52, the driver circuit 53, and the driver circuit 54 are provided over a substrate surface substantially parallel to the x-z plane, and the three-dimensional memory cell array 40 is provided over the selection transistor array 50.

The three-dimensional memory cell array 40 includes $m_1 \times m_2 \times m_3$ (in the x-axis direction, the y-axis direction, and the z-axis direction, respectively; $m_1$, $m_2$, and $m_3$ are natural numbers) memory cells 10 arranged to have a rectangular solid shape. In the following description, the memory cells 10 are indicated by coordinates (1,1,1) to $(m_1, m_2, m_3)$ in some cases as illustrated in FIG. 2.

Furthermore, the three-dimensional memory cell array 40 includes $m_1 \times m_3$ wirings SL, $m_1 \times m_3$ wirings RBL, and $m_1 \times m_3$ wirings WBL that extend in the y-axis direction, and $m_2 \times m_3$ wirings RWL and $m_2 \times m_3$ wirings WWL that extend in the x-axis direction as illustrated in FIG. 3. In the following description, the wirings SL are indicated by x and z coordinates [1,1] to [$m_1,m_3$] in some cases as illustrated in FIG. 3. Similarly, the wirings RBL are indicated by coordinates [1,1] to [$m_1,m_3$], and the wirings WBL are indicated by coordinates [1,1] to [$m_1,m_3$], in some cases. In addition, the wirings RWL are indicated by y and z coordinates [1,1] to [$m_2,m_3$] in some cases as illustrated in FIG. 3. Similarly, the wirings WWL are indicated by coordinates [1,1] to [$m_2,m_3$] in some cases.

The three-dimensional memory cell array 40 includes $m_3$ two-dimensional memory cell arrays 30 arranged in the z-axis direction. In the following description, the two-dimensional memory cell arrays 30 are indicated by z coordinates [1] to [$m_3$] in some cases as illustrated in FIG. 2.

Each of the two-dimensional memory cell arrays 30 includes $m_1$ memory cell strings 20 arranged in the x-axis direction. In the following description, the memory cell strings 20 are indicated by x and z coordinates [1,1] to [$m_1,m_3$] in some cases as illustrated in FIG. 2. Each of the memory cell strings 20 includes $m_2$ memory cells 10 arranged in the y-axis direction. Each of the two-dimensional memory cell arrays 30 includes $m_1$ memory cell strings 20; thus, in the two-dimensional memory cell array 30, $m_1 \times m_2$ (in the x-axis direction and the y-axis direction, respectively) memory cells 10 are arranged in a matrix.

The memory cell 10 includes the transistor 11, the transistor 12, and the capacitor 14 and is electrically connected to the wiring SL, the wiring RBL, the wiring WBL, the wiring RWL, and the wiring WWL as illustrated in FIG. 1B. Note that the transistors 11 of the memory cells 10 included in each of the memory cell strings 20 are connected in series in the y-axis direction as illustrated in FIGS. 2 to 4. Thus, only the memory cell 10 ($i_1$,1,$i_3$) ($i_1$ is a natural number of 1 or more and $m_1$ or less, and $i_3$ is a natural number of 1 or more and $m_3$ or less) is connected to the wiring RBL [$i_1,i_3$] without any other memory cell 10 interposed therebetween. In addition, only the memory cell 10 ($i_1,m_2,i_3$) is connected to the wiring SL [$i_1,i_3$] without any other memory cell 10 interposed therebetween. The other memory cells 10 are electrically connected to the wiring RBL and the wiring SL via another or other memory cells 10 in the same memory cell string 20.

Here, the configuration of the two-dimensional memory cell array 30 will be described with reference to the two-dimensional memory cell array 30 [1] in FIG. 4 as an example. The two-dimensional memory cell array 30 [1] in FIG. 4 includes $m_1$ wirings SL [1,1] to [$m_1$,1], $m_1$ wirings RBL [1,1] to [$m_1$,1], $m_1$ wirings WBL [1,1] to [$m_1$,1], $m_2$ wirings RWL [1,1] to [$m_2$,1], $m_2$ wirings WWL [1,1] to [$m_2$,1], and $m_1 \times m_2$ memory cells 10 (1,1,1) to ($m_1,m_2$,1) arranged in a matrix.

Note that the wirings and the memory cells 10 arranged in a matrix in the two-dimensional memory cell array 30 are expressed according to a matrix, in some cases. For example, the plurality of memory cells 10 with the same y coordinate in the same two-dimensional memory cell array 30 can be expressed as those in the same row. In addition, the plurality of memory cells 10 with the same x coordinate (constituting the same memory cell string 20) in the same two-dimensional memory cell array 30 can be expressed as those in the same column. The x-axis direction and the y-axis direction can also be referred to as the row direction and the column direction, respectively. Note that in the following description, in the two-dimensional memory cell array 30 illustrated in FIG. 4 and the like, rows are referred to as the first, second, . . . , $m_2$-th rows from below, and columns are referred to as the first, second, . . . , $m_1$-th columns from left.

The wiring SL [$i_1$,1] is electrically connected to the source electrode of the transistor 11 in the memory cell 10 ($i_1,m_2$,1), and the wiring RBL [$i_1$,1] is electrically connected to the drain electrode of the transistor 11 in the memory cell 10 ($i_1$,1,1).

The wiring WBL [$i_1$,1] is electrically connected to the source electrode of each of the transistors 12 in the memory cells 10 ($i_1$,1,1) to ($i_1,m_2$,1). In other words, the source electrode of each of the transistors 12 in the memory cells 10 in the same column is electrically connected to the wiring WBL of the corresponding column.

The wiring RWL [$i_2$,1] ($i_2$ is a natural number of 1 or more and $m_2$ or less) is electrically connected to the other electrode of each of the capacitors 14 in the memory cells 10 (1,$i^2$,1) to ($m_1,i_2$,1). In other words, the other electrode of each of the capacitors 14 of the memory cells 10 in the same row is electrically connected to the wiring RWL of the same row.

The wiring WBL [$i_2$,1] is electrically connected to the gate electrode of each of the transistors 12 in the memory cells 10 (1,$i_2$,1) to ($m_1,i_2$,1). In other words, the gate electrode of each of the transistors 12 in the memory cells 10 in the same row is electrically connected to the wiring WWL of the same row.

The source electrode of the transistor 11 in the memory cell 10 ($i_1,i_{2,4}$,1) ($i_{2,4}$ is a natural number of 1 or more and $m_2$−1 or less) is electrically connected to the drain electrode of the transistor 11 in the memory cell 10 ($i_1,i_{2,4}$+1,1). In other words, the source electrode of one transistor 11 and the drain electrode of another transistor 11 in the plurality of memory cells 10 in the same column are electrically connected to each other.

The memory cells 10 ($i_1$,1,1) to ($i_1,m_2$,1) in which the transistors 11 are thus connected in series between the wiring SL [$i_1$,1] and the wiring RBL [$i_1$,1] constitute the memory cell string 20 [$i_1$,1].

The memory cell string 20 includes the plurality of memory cells 10 as described above, and the memory cells 10 can be stacked such that the transistors 11 are connected in series. The storage capacity of the memory cell string 20 can be increased in accordance with the number of stacked memory cells 10. The storage capacity per unit area of the three-dimensional memory cell array 40 including the plurality of memory cell strings 20 can be increased in accordance with the number of stacked memory cells 10.

Here, the configuration of the selection transistor array 50 illustrated in FIG. 5 will be described. The selection transistor array 50 includes $m_1 \times m_3$ selection transistor cells 60 arranged in a matrix, $m_1$ wirings RBL and $m_1$ wirings WBL that extend in the z-axis direction, and $m_3$ wirings SG1 and $m_3$ wirings SG2 that extend in the x-axis direction. In the following description, the selection transistor cells 60 are indicated by coordinates (1,1) to ($m_1,m_3$) of the x-z plane in some cases. The wirings RBL and the wirings WBL are indicated by x coordinates [1] to [$m_1$] in some cases. The wirings SG1 and the wirings SG2 are indicated by z coordinates [1] to [$m_3$] in some cases.

Each of the selection transistor cells 60 includes a transistor 61 and a transistor 62. In the selection transistor cell 60 ($i_1,i_3$), the wiring RBL [$i_1$] is electrically connected to a drain electrode (or a source electrode) of the transistor 61, the wiring RBL [$i_1,i_3$] of the memory cell string [$i_1,i_3$] is electrically connected to the source electrode (or the drain electrode) of the transistor 61, and the wiring SG1 [$i_3$] is electrically connected to a gate electrode of the transistor 61. In the selection transistor cell 60 ($i_1,i_3$), the wiring WBL [$i_1$] is electrically connected to the drain electrode (or the source electrode) of the transistor 62, the wiring WBL [$i_1,i_3$] of the memory cell string [$i_1,i_3$] is electrically connected to the source electrode (or the drain electrode) of the transistor 62, and the wiring SG2 [$i_3$] is electrically connected to the gate electrode of the transistor 62.

The selection transistor cells 60 are provided for the corresponding memory cell strings 20, so that connection or disconnection between the wiring RBL [$i_1$] and each of the wirings RBL [$i_1$,1] to [$i_1,m_3$] can be selected by the transistor 61 of the corresponding selection transistor cell 60 and connection or disconnection between the wiring WBL [$i_1$] and each of the wirings WBL [$i_1$,1] to [$i_1,m_3$] can be selected by the transistor 62 of the corresponding selection transistor cell 60.

Furthermore, as illustrated in FIG. 5, the driver circuit 51, the read circuit 52, the driver circuit 53, and the driver circuit 54 are provided around the selection transistor array 50. The wirings RBL [1] to [$m_1$] and the wirings WBL [1] to [$m_1$] are connected to the driver circuit 51. The wirings RBL [1] to [$m_1$] are also connected to the read circuit 52. Although not illustrated, the wirings RWL [1,1] to [$m_2,m_3$] and the wirings WWL [1,1] to [$m_2,m_3$] are connected to the driver circuit 53. The wirings SG1 [1] to [$m_3$] and the wirings SG2 [1] to [$m_3$] are connected to the driver circuit 54.

Figure 6A:
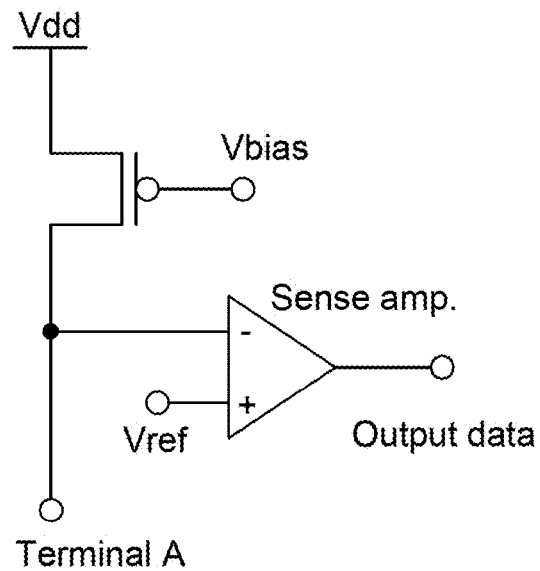
FIGS. 6A to 6C are circuit diagrams each illustrating a semiconductor device of one embodiment of the present invention.

An example of a read circuit that can be used as the read circuit 52 will be described below with reference to FIGS. 6A to 6C. FIG. 6A is a schematic diagram of the read circuit. The read circuit includes a transistor and a sense amplifier circuit.

At the time of reading, a terminal A is connected to the wiring RBL connected to a memory cell from which data is read. Further, a bias potential Vbias is supplied to a gate electrode of a transistor so that the potential of the terminal A is controlled.

The electrical resistance of the memory cell 10 varies depending on stored data. Specifically, when the transistor 11 in the selected memory cell 10 is in an on state, the memory cell 10 has low resistance, whereas when the transistor 11 in the selected memory cell 10 is in an off state, the selected memory cell 10 has high resistance.

When the memory cell has a high resistance, the potential of the terminal A is higher than a reference potential Vref and the sense amplifier circuit outputs a potential (data "0") corresponding to the potential of the terminal A. When the memory cell has a low resistance, the potential of the terminal A is lower than the reference potential Vref and the sense amplifier circuit outputs a potential (data "1") corresponding to the potential of the terminal A.

Thus, by using the read circuit, data can be read from the memory cell. Note that the read circuit of this embodiment is an example. Another known circuit may be used. The read circuit may further include a precharge circuit. The read circuit may be connected to a reference memory cell instead of being supplied with the reference potential Vref.

Figure 6B:
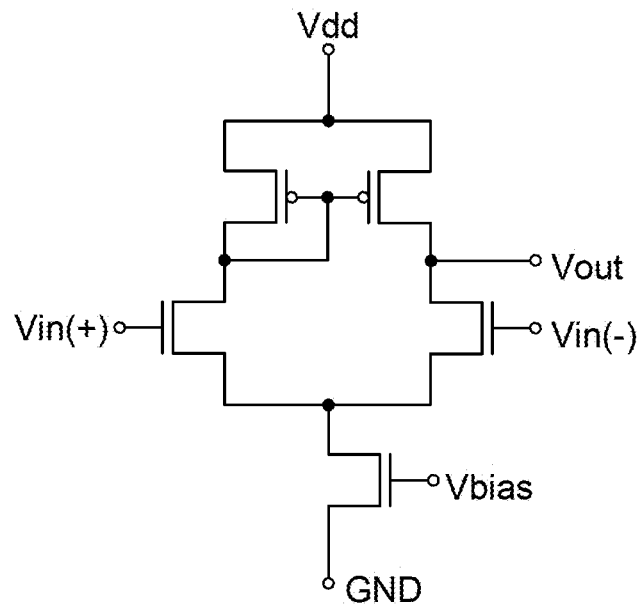

FIG. 6B illustrates a differential sense amplifier, which is an example of sense amplifier circuits. The differential sense amplifier has input terminals Vin(+) and Vin(−) and an output terminal Vout, and amplifies a difference between Vin(+) and Vin(−). If Vin(+)>Vin(−), the output from Vout is relatively high, whereas if Vin(+)<Vin(−), the output from Vout is relatively low.

Figure 6C:
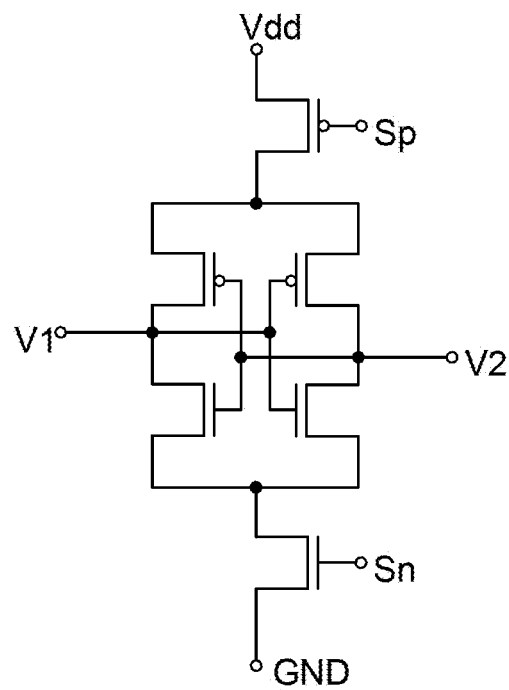

FIG. 6C illustrates a latch sense amplifier, which is an example of sense amplifier circuits. The latch sense amplifier has input/output terminals V1 and V2 and input terminals of control signals Sp and Sn. First, the signal Sp is set high and the signal Sn is set low, and a power supply potential (Vdd) is interrupted. Then, potentials to be compared are supplied to V1 and V2. After that, the signal Sp is set low and the signal Sn is set high, and the power supply potential (Vdd) is supplied. If the potentials V1in and V2in to be compared satisfy the relation V1in>V2in, the output from V1 is high and the output from V2 is low, whereas if the potentials satisfy the relation V1in<V2in, the output from V1 is low and the output from V2 is high. By utilizing such a relation, the difference between V1in and V2in can be amplified.

Although the driver circuit 51, the read circuit 52, the driver circuit 53, and the driver circuit 54 are independently provided according to functions in the above description, the semiconductor device described in this embodiment is not limited to this configuration and a plurality of circuits may be provided in one circuit. The arrangement of the driver circuit 51, the read circuit 52, the driver circuit 53, the driver circuit 54, and the wirings connected to the circuits is not limited to the configuration illustrated in FIG. 5, and can be set as appropriate for a semiconductor device.

Although the wirings SL [1,1] to [$m_1,m_3$] are separate in FIG. 3, one embodiment of the present invention is not limited to this configuration and, for example, a plurality of wirings SL may be electrically connected to each other or all the wirings SL may be electrically connected to each other. The wirings SL [1,1] to [$m_1,m_3$] are connected to a low power supply potential line for supplying a ground potential GND, 0 V, or the like, for example.

Although the three-dimensional memory cell array 40 is provided over the selection transistor array 50 in the semiconductor device illustrated in FIG. 2, the configuration of the semiconductor device described in this embodiment is not limited thereto. For example, the selection transistor array 50 may be provided over the three-dimensional memory cell array 40. In that case, the transistor 61 and the transistor 62 in the selection transistor cell 60 are formed using an oxide semiconductor in a manner similar to that of the transistor 12, for example.

Furthermore, some of the peripheral circuits such as the driver circuit 51, the read circuit 52, the driver circuit 53, and the driver circuit 54 may be provided under the three-dimensional memory cell array 40. For example, the read circuits may be provided in a matrix for corresponding memory cell strings 20, in which case the read circuits provided in a matrix and the selection transistor cells 60 may be stacked.

Data writing, holding, and reading are basically similar to those in the case of FIGS. 1A and 1B. Note that in the three-dimensional memory cell array 40, one of the two-dimensional memory cell arrays 30 [1] to [$m_3$] is selected first, and then, data is read or written. Note that data writing or reading in the two-dimensional memory cell arrays 30 [1] to [$m_3$] is performed at least row by row. That is to say, a specific writing operation will be described below. Note that although the case where either a potential V2 (a potential lower than a power supply potential VDD) or a reference potential GND (also expressed as 0 V) is supplied to the node FN is described here as an example, the relationship among potentials supplied to the node FN is not limited to this example. Data that is held when the potential V2 is supplied to the node FN is referred to as data "1", and data that is held when the reference potential GND is supplied to the node FN is referred to as data "0". The reference potential GND is supplied to the wiring SL.

In data writing, one of the plurality of two-dimensional memory cell arrays 30 is selected first. In selecting one of the two-dimensional memory cell arrays 30, the potential of the corresponding wiring SG2 is set to V1 (e.g., VDD) to turn on the transistor 62 electrically connected to the wiring so that electrical continuity between each of the wirings WBL [1] to [$m_1$] and the corresponding wiring WBL in the selected two-dimensional memory cell array 30 is established. At this time, the potential of the wirings SG2 that are not selected is set to GND (0 V) so that electrical continuity between each of the wirings WBL [1] to [$m_1$] and the corresponding wiring WBL in the two-dimensional memory cell arrays 30 that are not selected is broken.

Next, in the selected two-dimensional memory cell array 30, the potential of the wiring WWL connected to the memory cells 10 in a row to which data is to be written is set to V3 (a potential higher than V2, e.g., VDD) so that the transistors 12 in the memory cells 10 in the row are turned on. In writing data "0" to the memory cells 10, GND is supplied as a writing potential to the wiring WBL, and in writing data "1" to the memory cells 10, the potential V2 is supplied as a writing potential to the wiring WBL. Since the potential of the wiring WWL is V3 here, the potential V2 can be supplied to the node FN.

Data is held by setting the potential of the wiring WWL connected to the memory cell 10 in which data is to be held to GND so that the transistor 12 in the memory cell 10 is turned off. When the potential of the wiring WWL is fixed to GND, the potential of the node FN is fixed to the potential at the time of writing. In other words, when the potential V2 for data "1" is supplied to the node FN, the potential of the node FN is V2, and when GND for data "0" is supplied to the node FN, the potential of the node FN is GND.

Since GND is supplied to the wiring WWL, the transistor 12 is turned off regardless of whether data "1" or data "0" is written. Since the off-state current of the transistor 12 is significantly small, the charge of the gate electrode of the transistor 11 is held for a long time. In such a manner, data corresponding to a writing potential can be held in the node FN of the memory cell 10 in which data is to be held.

In data reading, one of the plurality of two-dimensional memory cell arrays 30 is selected first. In selecting one of the two-dimensional memory cell arrays 30, the potential of the corresponding wiring SG1 is set to V1 (e.g., VDD) to turn on the transistor 61 electrically connected to the wiring so that electrical continuity between each of the wirings RBL [1] to [$m_1$] and the corresponding wiring RBL in the selected two-dimensional memory cell array 30 is established. At this time, the potential of the wirings SG1 that are not selected is set to GND (0 V) so that electrical continuity between each of the wirings RBL [1] to [$m_1$] and the corresponding wiring RBL in the two-dimensional memory cell arrays 30 that are not selected is broken.

Next, in the selected two-dimensional memory cell array 30, the potential of the wiring RWL connected to the memory cells 10 in a row from which data is to be read is set to GND, and the potential of the other electrode of each of the capacitors 14 connected to the wiring RWL is set to GND. In addition, the potential of the wiring RWL connected to the memory cells 10 in a row from which data is not to be read is set to V5 (e.g., VDD), and the potential of the other electrode of each of the capacitors 14 connected to the wiring RWL is set to V5.

When the potential of the wiring RWL connected to the memory cells 10 in a row from which data is to be read is set to GND, the transistors 11 are turned on if the potential V2 for data "1" is supplied to the nodes FN of the memory cells 10 from which data is read. On the other hand, the transistors 11 are turned off if GND for data "0" is supplied to the nodes FN.

When the potentials of the wirings RWL connected to the memory cells 10 in a row from which data is not to be read are set to V5, the transistors 11 are turned on regardless of whether data "1" or data "0" is written to the memory cells 10 from which data is not to be read.

A reading potential (e.g., VDD) is supplied to the wiring RBL. When the transistor 11 in the memory cell 10 from which data is read is turned on, electrical continuity between the wiring RBL and the wiring SL is established, and the potential of the wiring RBL is lowered. When the transistor 11 in the memory cell 10 from which data is to be read is turned off, electrical continuity between the wiring RBL and the wiring SL is not established, and the reading potential of the wiring RBL is maintained. In such a manner, data in the memory cell from which data is to be read can be read from a change in the reading potential of the wiring RBL.

Moreover, the driving method preferably includes an operation of erasing data from each block at a time. For example, the two-dimensional memory cell array 30 can be regarded as one block. In that case, selection of the two-dimensional memory cell array 30 from which data is erased at a time can be performed by a method similar to the data writing method. When the wiring WWL connected to the two-dimensional memory cell array 30 is turned on, data in one block can be erased at a time.

FIG. 7 is an example of a timing chart for more detailed operations of the semiconductor device in FIG. 2. The timing chart in FIG. 7 shows the relation between the potentials of the wirings when data in the two-dimensional memory cell array 30 [1] is erased at a time, when data is written to the first row of the two-dimensional memory cell array 30 [1], and when data is read from the first row of the two-dimensional memory cell array 30 [1]. Erasing data in the two-dimensional memory cell array 30 [1] at a time is an operation of erasing data written to the memory cells 10 (1,1,1) to ($m_1$,$m_2$,1) included in the two-dimensional memory cell array 30 [1]. Writing data to the first row of the two-dimensional memory cell array 30 [1] is an operation of writing data "1" to the memory cell in the first row and the first column of the two-dimensional memory cell array 30 [1] and writing data "0" to the memory cells in the first row and the other columns (the second to $m_1$ columns) thereof. Reading data from the first row of the two-dimensional memory cell array 30 [1] is an operation of reading data written to the first row of the two-dimensional memory cell array 30 [1]. Note that in the data reading, data "1" is stored in the memory cell in the first row and the first column and data "0" is stored in the memory cells in the first row and the other columns (the second to $m_1$-th columns).

Note that the read circuit illustrated in FIG. 6A is provided in the read circuit 52.

In erasing data in the two-dimensional memory cell array 30 [1] at a time, a potential V1 is supplied to the wiring SG2 [1] first so that the transistors 62 in the selection transistor cells 60 (1,1) to ($m_{1,1}$) are turned on and electrical continuity between each of the wirings WBL [1] to [$m_1$] and the corresponding one of the wirings WBL [1,1] to [$m_{1,1}$] is established. In addition, the wirings SG2 [2] to [$m_3$] are set at GND so that the transistors 62 in the selection transistor cells 60 (1,2) to ($m_1$,$m_3$) are turned off and electrical continuity between each of the wirings WBL [1] to [$m_1$] and the corresponding one of the wirings WBL [1,2] to [$m_1$,$m_3$]

is broken. In such a manner, the two-dimensional memory cell array 30 [1] is selected as an object from which data is to be erased at a time.

In the two-dimensional memory cell array 30 [1], the potential V3 is supplied to the wirings WWL [1,1] to [$m_{2,1}$] so that the transistors 12 in the first to $m_2$-th rows are turned on, and the wirings WBL [1] to [$m_1$] are set at GND so that the potentials of the nodes FN in the first to $m_2$-th rows become GND.

Note that the wirings WWL [1,2] to [$m_2,m_3$] electrically connected to the two-dimensional memory cell arrays 30 [2] to [$m_3$] are set at GND so that the potentials of the nodes FN of the memory cells 10 (1,1,2) to ($m_1,m_2,m_3$) are held.

In writing data to the first row of the two-dimensional memory cell array 30 [1], the two-dimensional memory cell array 30 [1] is selected first as an object to which data is to be written, in a manner similar to that of the operation of erasing data at a time.

In the two-dimensional memory cell array 30 [1], the potential V3 is supplied to the wiring WWL [1,1] so that the transistors 12 in the first row are turned on, and the wirings WWL [2,1] to [$m_2,1$] are set at GND so that the transistors 12 in the second to $m_2$-th rows are turned off. At this time, the potential V2 is supplied to the wiring WBL [1], and the wirings WBL [2] to [$m_1$] are set at GND. In addition, the wirings RWL [1,1] to [$m_2,1$] are set at GND.

As a result, the potential V2 is supplied to the node FN in the memory cell 10 in the first row and the first column of the two-dimensional memory cell array 30 [1]. In other words, data "1" is written to the memory cell 10 in the first row and the first column of the two-dimensional memory cell array 30 [1]. In addition, 0 V is applied to the nodes FN in the memory cells 10 in the first row and the second to $m_1$-th columns of the two-dimensional memory cell array 30 [1]. In other words, data "0" is written to the memory cells 10 in the first row and the second to $m_1$-th columns of the two-dimensional memory cell array 30 [1].

Note that as in the case where data is erased in the two-dimensional memory cell array 30 [1] at a time, the wirings WWL [1,2] to [$m_2,m_3$] electrically connected to the two-dimensional memory cell arrays 30 [2] to [$m_3$] are set at GND so that the potentials of the nodes FN of the memory cells 10 (1,1,2) to ($m_1,m_2,m_3$) are held.

In reading data in the first row of the two-dimensional memory cell array 30 [1], the potential V1 is supplied to the wiring SG1 [1] first so that the transistors 61 in the selection transistor cells 60 (1,1) to ($m_1,1$) are turned on and electrical continuity between each of the wirings RBL [1] to [$m_1$] and the corresponding one of the wirings RBL [1,1] to [$m_1,1$] is established. In addition, the wirings SG1 [2] to [$m_3$] are set at GND so that the transistors 61 in the selection transistor cells 60 (1,2) to ($m_1,m_3$) are turned off and electrical continuity between each of the wirings RBL [1] to [$m_1$] and the corresponding one of the wirings RBL [1,2] to [$m_1,m_3$] is broken. In such a manner, the two-dimensional memory cell array 30 [1] is selected as an object from which data is to be read.

In the two-dimensional memory cell array 30 [1], the wiring RWL [1,1] connected to the memory cells 10 in the first row from which data is to be read is set at GND. In addition, a potential V4 is supplied to the wirings RWL [2,1] to [$m_2,1$] connected to the memory cells 10 from which data is not to be read so that the transistors 11 in the memory cells 10 are turned on.

Here, the bias potential Vbias of the read circuit in FIG. 6A is changed from the potential Vdd to GND, and a wiring for supplying the power supply potential Vdd and the wiring RBL are connected.

Consequently, electrical continuity between the wiring RBL [1] connected to the memory cell 10 (1,1,1) to which data "1" is written and the wiring SL [1,1] is established, and the potential of the wiring RBL [1] is lowered. Electrical continuity between the wirings RBL [2] to [$m_1$] connected to the memory cells 10 (2,1,1) to ($m_1,1,1$) to which data "0" is written and the wirings SL [2,1] to [$m_1,1$] is not established; thus, the potential Vdd is supplied to the wirings RBL [2] to [$m_1$].

Note that the wirings WWL [1,1] to [$m_2,m_3$] are set at GND so that the potentials of the nodes FN of the memory cells 10 (1,1,1) to ($m_1,m_2,m_3$) are held.

Note that, in the above description, an n-channel transistor using electrons as carriers is used; however, a p-channel transistor using holes as carriers can be used instead of an n-channel transistor. In this case, the transistor performs an inverted operation; thus, a potential to be supplied is set appropriately.

Although the case where 2-level (1-bit) data is written to the memory cell in the method for driving the semiconductor device is described, a multilevel technique in which any of three or more levels of data is written to one of the memory cells may be employed. For example, data such as 4-level (2-bit) data, 8-level (3-bit) data, or 16-level (4-bit) data may be held in the memory cell.

Since the off-state current of the transistors including an oxide semiconductor in the semiconductor device described in this embodiment is extremely small, stored data can be held for an extremely long time owing to such transistors. In other words, power consumption can be sufficiently reduced because refresh operation is unnecessary or the frequency of refresh operation can be extremely low. Moreover, stored data can be held for a long period even when power is not supplied (note that a potential is preferably fixed).

Furthermore, in the semiconductor device described in this embodiment, a high voltage is not needed for writing data and there is no problem of deterioration of elements. For example, unlike in the case of a conventional nonvolatile memory, it is not necessary to inject and extract electrons into and from a floating gate, and thus a problem such as deterioration of a gate insulating layer due to extraction of electrons does not occur. In other words, the semiconductor device of the disclosed invention does not have a limit on the number of times of writing, which is a problem in a conventional nonvolatile memory, and reliability thereof is drastically improved. Furthermore, data is written depending on whether the transistor is on or the transistor is off, whereby high-speed operation can be easily achieved.

In addition, since a transistor including a material other than an oxide semiconductor can operate at sufficiently high speed, sufficiently high operation speed of a semiconductor device (e.g., data reading operation) can be ensured by using the combination of the transistor including a material other than an oxide semiconductor with a transistor including an oxide semiconductor. Furthermore, a transistor including a material other than an oxide semiconductor favorably allows fabrication of a variety of circuits (such as a logic circuit or a driver circuit) which are required to operate at high speed.

A semiconductor device having a novel feature can be fabricated by providing both the transistor including a material other than an oxide semiconductor (in a broader sense, a transistor capable of operating at sufficiently high speed) and the transistor including an oxide semiconductor (in a broader sense, a transistor whose off-state current is sufficiently small).

Furthermore, stacking the memory cells in the semiconductor device described in this embodiment allows storage capacity per unit area to be increased in accordance with the number of the stacked memory cells. Thus, the memory cells can have favorable characteristics described above, and the semiconductor device with a storage capacity per unit area larger than or equal to that of a conventional memory can be provided. The memory cells are thus stacked in the semiconductor device described in this embodiment to increase storage capacity per unit area, whereby storage devices with storage capacities of 1 TByte or more, 5 TByte or more, and 10 TByte or more can be provided.

The structures, the methods, and the like described in this embodiment can be combined as appropriate with any of the structures, the methods, and the like described in the other embodiments.

Embodiment 2

In this embodiment, structures of semiconductor devices of embodiments of the present invention will be described with reference to FIGS. 8A to 8C to FIGS. 14A to 14F.
<Structure of Memory Cell>

First, the structure of the memory cell 10 described in the above embodiment will be described with reference to FIGS. 8A to 8C.

Figure 8A:
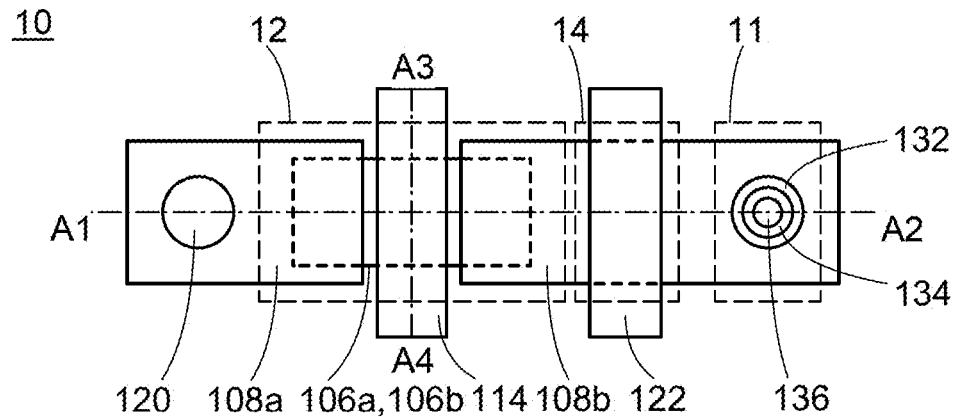
FIGS. 8A to 8C are a top view and cross-sectional views illustrating a semiconductor device of one embodiment of the present invention.
Figure 8B:
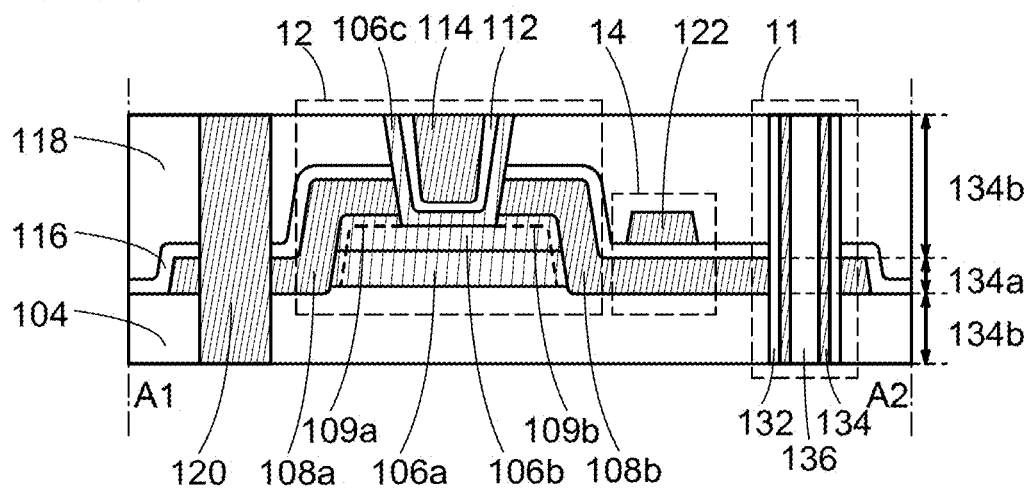
Figure 8C:
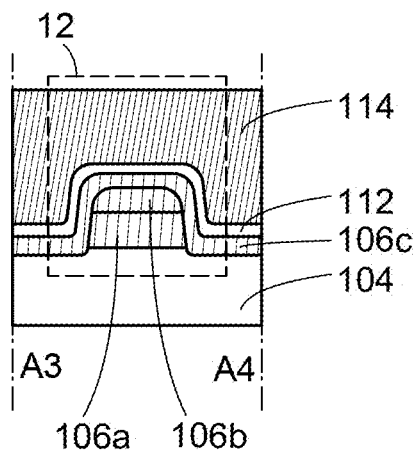

The memory cell 10 illustrated in FIGS. 8A to 8C includes the transistor 11, the transistor 12, and the capacitor 14. FIG. 8A is a top view of the memory cell 10. FIG. 8B is a cross-sectional view taken along the dashed-dotted line A1-A2 in FIG. 8A, and FIG. 8C is a cross-sectional view taken along the dashed-dotted line A3-A4 in FIG. 8A. Note that a region along the dashed-dotted line A1-A2 shows a structure of the transistor 12 in the channel length direction, and a region along the dashed-dotted line A3-A4 shows a structure of the transistor 12 in the channel width direction. Note that the channel length direction of the transistor 12 means the direction in which carriers move between a source (source region or source electrode) and a drain (drain region or drain electrode). The channel width direction of the transistor 12 means the direction perpendicular to the channel length direction in a plane parallel to a substrate.

Here, it is preferable that a semiconductor material of the transistor 11 and a semiconductor material of the transistor 12 be different from each other. For example, a semiconductor material (e.g., silicon) other than an oxide semiconductor can be used as a semiconductor material of the transistor 11, and an oxide semiconductor can be used as a semiconductor material of the transistor 12. A transistor including a material other than an oxide semiconductor, such as polycrystalline silicon, can operate at high speed easily. On the other hand, a transistor including an oxide semiconductor can store charge for a long time owing to its characteristics.

Although all the above transistors are n-channel transistors here, it is needless to say that p-channel transistors can be used. The technical feature of the disclosed invention lies in the use of a semiconductor material with which an off-state current can be sufficiently reduced, such as an oxide semiconductor, for the transistor 12 in order to hold data. It is therefore not necessary to limit specific conditions, such as materials, structures, and the like of the semiconductor device, to those given here.

The transistor 11 includes a conductor 108$b$, an insulator 132, a semiconductor 134, and an insulator 136. The insulator 132, the semiconductor 134, and the insulator 136 are formed in cylindrical openings formed in the insulator 104, the conductor 108$b$, the insulator 116, and the insulator 118. The insulator 132 is formed in contact with the interior wall of the opening so as to have a shape of a circular tube, the semiconductor 134 is formed so as to have a shape of a circular tube and be located inward from the insulator 132, and the insulator 136 is formed so as to have a shape of a circular tube and be located inward from the semiconductor 134. The insulator 132, the semiconductor 134, and the insulator 136 are formed so as to extend substantially perpendicularly to the top surface of a substrate over which the memory cell 10 is provided. Note that a structure may be employed in which the semiconductor 134 having a columnar shape is formed to be located inward from the insulator 132 without the insulator 136 formed to be located inward from the semiconductor 134.

Here, the conductor 108$b$ functions as a gate electrode of the transistor 11, the insulator 132 functions as a gate insulating film of the transistor 11, and the semiconductor 134 functions as an active layer and source and drain electrodes of the transistor 11. In the semiconductor 134, a region 134$a$ overlapping with the conductor 108$b$ functions as a channel formation region of the transistor 11, and a region 134$b$ not overlapping with the conductor 108$b$ functions as the source and drain electrodes of the transistor 11.

The transistor 11 is an SGT in which the conductor 108$b$ functioning as the gate electrode is formed so as to surround the region 134$a$ of the semiconductor 134 with the insulator 132 interposed therebetween, as described above. In the semiconductor 134 of the transistor 11, the region 134$a$ functioning as a channel formation region is located at the same level as the conductor 108$b$, and the region 134$b$ functioning as source and drain electrodes is located above and below the conductor 108$b$. Thus, the channel length of the transistor 11 is substantially equal to the thickness of the conductor 108$b$. The channel length direction of the transistor 11 is substantially perpendicular to the top surface of the substrate over which the memory cell 10 is provided. Furthermore, as illustrated in FIG. 8B, the channel length direction of the transistor 11 is substantially perpendicular to the channel length direction of the transistor 12. The channel width of the transistor 11 is substantially equal to the circumference of the cylindrical semiconductor 134.

In a standard planar transistor, a gate electrode, a source electrode, and a drain electrode are seen from above, and the area of the transistor is approximately $8F^2$. In contrast, in the SGT-type transistor 11, other components are formed so as to be located inward from the gate electrode when seen above; thus, the area of the transistor 11 is as small as approximately $4F^2$. This can reduce the area of the memory cell 10 and increase the storage capacity per unit area of the semiconductor device.

Although a source electrode and a drain electrode are not illustrated expressly as in the transistor 11 illustrated in FIGS. 8A to 8C, such an element is referred to as a transistor for convenience in some cases.

Note that the shape of the opening provided with the transistor 11 that is seen from above is, but not limited to, circular as illustrated in FIG. 8A; the shape seen from above can alternatively be, for example, an elliptical shape or a polygonal shape such as a triangle or a quadrangle. In the case where a polygonal shape is employed, corners thereof may be rounded. Furthermore, the shapes of the top surfaces of the insulator 132, the semiconductor 134, and the insulator 136 may depend on the shape of the opening seen from above. The opening may have a shape where a lower (on the semiconductor substrate 150 side) cross section perpendicular to the y-axis is smaller than an upper (on the insulator 170 side) cross section perpendicular to the y-axis.

The transistor 12 includes an insulator 106a over the insulator 104, a semiconductor 106b in contact with at least part of the top surface of the insulator 106a, an insulator 106c in contact with at least part of the top surface of the semiconductor 106b, the conductor 108a and the conductor 108b electrically connected to the semiconductor 106b, an insulator 112 over the insulator 106c, and a conductor 114 which is over the insulator 112 and at least part of which is between the conductor 108a and the conductor 108b. The insulator 116 is formed over the insulator 106a, the semiconductor 106b, the conductor 108a, and the conductor 108b, and the insulator 118 is formed over the insulator 116.

In the transistor 12, an opening that reaches the semiconductor 106b is formed in the insulator 118, and the insulator 106c, the insulator 112, and the conductor 114 are provided so as to be embedded in the opening. The conductor 108a and the conductor 108b are separated by the opening. In the transistor 12, the conductor 114 serving as a gate electrode is formed in a self-aligned manner by filling the opening formed in the insulator 118 and the like; thus, the transistor 12 can be called a trench gate self-aligned (TGSA) s-channel FET.

In the transistor 12, the top surfaces of the insulator 118, the insulator 106c, the insulator 112, and the conductor 114 are substantially aligned with and level with one another. This can be achieved by planarizing the top surfaces of the insulator 117, the insulator 106c, the insulator 112, and the conductor 114 by a CMP method or the like. In this structure, there is hardly any region where the conductor 114 and the conductor 108a or the conductor 108b overlap with each other; as a result, parasitic capacitance in the transistor 24 between a gate and a source and between the gate and a drain can be reduced.

Furthermore, the insulator 106c is preferably provided so as to cover side surfaces in the channel width direction of the insulator 106a and the semiconductor 106b as illustrated in FIG. 8C. As a result, in the vicinity of the end portion of the side surface in the channel width direction of the semiconductor 106b, continuous junction is formed between the insulator 106a and the semiconductor 106b or between the insulator 106c and the semiconductor 106b and the density of defect states is reduced. Thus, even when an on-state current easily flows due to low-resistance regions 109a and 109b, the end portion of the side surface in the channel width direction of the semiconductor 106b does not serve as a parasitic channel, which enables stable electrical characteristics.

Here, the conductor 108a functions as one of a source electrode and a drain electrode of the transistor 12, the conductor 108b functions as the other of the source electrode and the drain electrode of the transistor 12, and the insulator 112 functions as a gate insulating film of the transistor 12, and the conductor 114 functions as the gate electrode of the transistor 12.

Although end portions of the insulator 106a and the semiconductor 106b are substantially aligned in FIGS. 8B and 8C, the structure of the semiconductor device described in this embodiment is not limited to this example.

Furthermore, a cylindrical conductor 120 is formed in a cylindrical opening formed in the insulator 104, the conductor 108a, the insulator 116, and the insulator 118. That is, the conductor 120 is electrically connected to the conductor 108a. The conductor 120 is formed so as to extend substantially perpendicularly to the top surface of the substrate over which the memory cell 10 is provided. Note that a structure may be employed in which the conductor 120 is formed so as to have a shape of a circular tube and an insulator is embedded in a space surrounded by the conductor 120.

Note that the shape of the opening provided with the conductor 120 that is seen from above is, but not limited to, circular as illustrated in FIG. 8A; the shape seen from above can alternatively be, for example, an elliptical shape or a polygonal shape such as a triangle or a quadrangle. In the case where a polygonal shape is employed, corners thereof may be rounded. Furthermore, the shape of the top surface of the conductor 120 may depend on the shape of the opening seen from above. The opening may have a shape where a lower (on the semiconductor substrate 150 side) cross section perpendicular to the y-axis is smaller than an upper (on the insulator 170 side) cross section perpendicular to the y-axis.

The capacitor 14 includes the conductor 108b, the insulator 116, and the conductor 122. The conductor 108b functions as one electrode of the capacitor 14, and the conductor 122 functions as the other electrode of the capacitor 14. It is acceptable as long as the insulator 116 is formed in a region where the conductor 108b and the conductor 122 overlap with each other so that the insulator 116 functions as a dielectric of the capacitor 14.

As described above, the conductor 108b functions as the gate electrode in the transistor 11, functions as the one of the source electrode and the drain electrode in the transistor 12, and functions as the one electrode in the capacitor 14. That is, the conductor 108b functions as the node FN illustrated in FIGS. 1A and 1B. The wiring WBL, the wiring WWL, and the wiring RWL illustrated in FIGS. 1A and 1B correspond to the conductor 120, the conductor 114, and the conductor 122, respectively. The semiconductor 134 is provided so as to extend and is electrically connected to the conductor corresponding to the wiring SL and the conductor corresponding to the wiring RBL.

Note that each of the insulator 104, the insulator 106a, the insulator 106c, the insulator 112, the insulator 116, the insulator 118, the insulator 132, and the insulator 136 can also be referred to as an insulating film or an insulating layer. Each of the conductors 108a, 108b, 114, 120, and 122 can also be referred to as a conductive film or a conductive layer. In addition, each of the semiconductor 106b and the semiconductor 134 can also be referred to as a semiconductor film or a semiconductor layer.

Note that as will be described in detail later, the insulator 106a and the insulator 106c are sometimes formed using a substance that can function as a conductor, a semiconductor, or an insulator when they are used alone. However, when the transistor is formed using a stack including the insulator 106a, the semiconductor 106b, and the insulator 106c, electrons flow in the semiconductor 106b, in the vicinity of the interface between the semiconductor 106b and the insulator 106a, and in the vicinity of the interface between the semiconductor 106b and the insulator 106c; thus, the insulator 106a and the insulator 106c have a region not functioning as a channel of the transistor. For that reason, in the present specification and the like, the insulators 106a and 106c are not referred to as conductors or semiconductors but referred to as insulators.

<Semiconductor of Transistor 11>

The structure of the semiconductor 134 will be described in detail below.

For the semiconductor 134, crystalline silicon such as polycrystalline silicon or single crystal silicon can be used. Note that one embodiment of the present invention is not limited to these examples; microcrystalline silicon, amorphous silicon, germanium, silicon carbide, silicon germanium, gallium arsenide, indium phosphide, zinc oxide, gallium oxide may alternatively be used, for example. Still alternatively, a semiconductor that can be used as the semiconductor 106b and is to be described later may be used.

In the case where polycrystalline silicon is used as the semiconductor 134, the thickness of the semiconductor 134 is preferably thin, for example, smaller than or equal to 20 nm, more preferably smaller than or equal to 10 nm. This can suppress variations in the characteristics of the transistor 11.

Furthermore, in the case where polycrystalline silicon or the like is used as the semiconductor 134, hydrogen may be supplied to the semiconductor 134 to terminate a dangling bond in the semiconductor 134.

Note that the semiconductor 134 may include an impurity imparting p-type conductivity and an impurity imparting n-type conductivity. Examples of the impurity imparting p-type conductivity include boron (B) and aluminum (Al). Examples of the impurity imparting n-type conductivity include phosphorus and arsenic.

<Insulator of Transistor 11>

Detailed structures of the insulator 132 and the insulator 136 will be described below.

The insulator 132 may each be formed so as to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 112 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. Note that silicon nitride oxide means a substance that contains more nitrogen than oxygen and silicon oxynitride means a substance that contains more oxygen than nitrogen, in this specification and the like.

The insulator 132 preferably has a blocking effect against hydrogen, water, alkali metal, alkaline earth metal, and the like. As such an insulator, for example, a nitride insulating film can be used. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Particularly in the case where the dangling bond of the semiconductor 134 is terminated with hydrogen, the insulator 132 that has an effect of blocking hydrogen and water can prevent hydrogen from diffusing into and entering the semiconductor 106b. The entry of hydrogen into an oxide semiconductor used as the semiconductor 106b might cause deterioration of the electric characteristics of the transistor 12; this phenomenon will be described in detail later. That is to say, when the insulator 132 has an effect of blocking hydrogen and water, stable electric characteristics of the transistor 12 can be obtained.

Any of the above-described insulators that can be used as the insulator 132 can be basically used as the insulator 136. Note that in the case where the dangling bond of the semiconductor 134 is terminated with hydrogen, hydrogen that is made to be contained in the insulator 136 can be supplied to the semiconductor 134. In this case, examples of the insulator 136 include silicon nitride containing hydrogen.

<Semiconductor of Transistor 12>

The structure of the semiconductor 106b will be described in detail below. In this section, a detailed structure of each of the insulator 106a and the insulator 106c will be described in addition to that of the semiconductor 106b.

The semiconductor 106b is an oxide semiconductor containing indium, for example. The oxide semiconductor 106b can have high carrier mobility (electron mobility) by containing indium, for example. The semiconductor 106b preferably contains an element M. The element M is preferably Ti, Ga, Y, Zr, La, Ce, Nd, Sn, or Hf. Note that two or more of the above elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 106b preferably contains zinc. When the oxide semiconductor contains zinc, the oxide semiconductor is easily crystallized, in some cases.

Note that the semiconductor 106b is not limited to the oxide semiconductor containing indium. The semiconductor 106b may be, for example, an oxide semiconductor which does not contain indium and contains zinc, an oxide semiconductor which does not contain indium and contains gallium, or an oxide semiconductor which does not contain indium and contains tin, e.g., zinc tin oxide or gallium tin oxide.

For example, the insulator 106a and the insulator 106c are oxide semiconductors including one or more elements other than oxygen included in the semiconductor 106b. Since the insulator 106a and the insulator 106c each include one or more elements other than oxygen included in the semiconductor 106b, a defect state is less likely to be formed at the interface between the insulator 106a and the semiconductor 106b and the interface between the semiconductor 106b and the insulator 106c.

The insulator 106a, the semiconductor 106b, and the insulator 106c preferably include at least indium. In the case of using an In-M-Zn oxide as the insulator 106a, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor 106b, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the insulator 106c, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the insulator 106c may be an oxide that is of the same type as the insulator 106a. Note that the insulator 106a and/or the insulator 106c do/does not necessarily contain indium in some cases. For example, the insulator 106a and/or the insulator 106c may be gallium oxide or a Ga—Zn oxide. Note that the atomic ratios of the elements included in the insulator 106a, the semiconductor 106b, and the insulator 106c are not necessarily simple ratios of integers.

In the case of deposition using a sputtering method, typical examples of the atomic ratio between the metal elements of a target that is used for the insulator 106a or the insulator 106c include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and In:M:Zn=1:10:1. The atomic ratio between the metal elements of the target that is used for the insulator 106a or the insulator 106c may be M:Zn=10:1.

In the case of deposition using a sputtering method, typical examples of the atomic ratio between the metal elements of a target that is used for the semiconductor 106b include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:6, and In:M:Zn=5:1:7. In particular, when a sputtering target containing In, Ga, and Zn at an atomic ratio of 4:2:4.1 is used, the deposited semiconductor 106b may contain In, Ga, and Zn at an atomic ratio of around 4:2:3.

An indium gallium oxide has a small electron affinity and an excellent oxygen-blocking property. Therefore, the insulator 106c preferably includes an indium gallium oxide. The gallium atomic ratio [Ga/(In+Ga)] is, for example, higher than or equal to 70%, preferably higher than or equal to 80%, more preferably higher than or equal to 90%.

For the semiconductor 106b, an oxide with a wide energy gap is used, for example. For example, the energy gap of the semiconductor 106b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. Here, the energy gap of the insulator 106a is larger than that of the semiconductor 106b. The energy gap of the insulator 106c is larger than that of the semiconductor 106b.

As the semiconductor 106b, an oxide having an electron affinity higher than those of the insulators 106a and 106c is used. For example, as the semiconductor 106b, an oxide having an electron affinity higher than those of the insulators 106a and 106c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum. In other words, the energy level of the conduction band minimum of the insulator 106a or the insulator 106c is closer to the vacuum level than the energy level of the conduction band minimum of the semiconductor 106b is.

In that case, when a gate voltage is applied, a channel is formed in the semiconductor 106b having the highest electron affinity among the insulator 106a, the semiconductor 106b, and the insulator 106c. Note that when a high gate voltage is applied, a current also flows in the insulator 106a near the interface with the semiconductor 106b and in the insulator 106c near the interface with the semiconductor 106b in some cases.

The insulator 106a and the insulator 106c are formed using a substance that can function as a conductor, a semiconductor, or an insulator when they are used alone. However, when the transistor is formed using a stack including the insulator 106a, the semiconductor 106b, and the insulator 106c, electrons flow in the semiconductor 106b, in the vicinity of the interface between the semiconductor 106b and the insulator 106a, and in the vicinity of the interface between the semiconductor 106b and the insulator 106c; thus, the insulator 106a and the insulator 106c have a region not functioning as a channel of the transistor. For that reason, in this specification and the like, the insulator 106a and the insulator 106c are not referred to as a semiconductor but an insulator. Note that the reason why the insulator 106a and the insulator 106c are referred to as an insulator is because they are closer to an insulator than the semiconductor 106b is in terms of their function in the transistor; thus, a substance that can be used for the semiconductor 106b is used for the insulator 106a and the insulator 106c in some cases.

Here, in some cases, there is a mixed region of the insulator 106a and the semiconductor 106b between the insulator 106a and the semiconductor 106b. Furthermore, in some cases, there is a mixed region of the semiconductor 106b and the insulator 106c between the semiconductor 106b and the insulator 106c. The mixed region has a low density of interface states. For that reason, the stack including the insulator 106a, the semiconductor 106b, and the insulator 106c has a band structure where energy is changed continuously at each interface and in the vicinity of the interface (continuous junction). Note that the boundary between the insulator 106a and the semiconductor 106b and the boundary between the insulator 106c and the semiconductor 106b are not clear in some cases.

At this time, electrons move mainly in the semiconductor 106b, not in the insulator 106a and the insulator 106c. As described above, when the density of interface states at the interface between the insulator 106a and the semiconductor 106b and the density of interface states at the interface between the semiconductor 106b and the insulator 106c are decreased, electron movement in the semiconductor 106b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of the top surface or the bottom surface (a formation surface; here, the top surface of the insulator 106a) of the semiconductor 106b is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P—V) with the measurement area of 1 μm×1 μm is less than 10 nm, preferably less than 9 nm, more preferably less than 8 nm, still more preferably less than 7 nm. RMS roughness, Ra, and P—V can be measured using, for example, a scanning probe microscope SPA-500 manufactured by SII Nano Technology Inc.

Moreover, the thickness of the insulator 106c is preferably as small as possible to increase the on-state current of the transistor. It is preferable that the thickness of the insulator 106c be smaller than that of the insulator 106a and smaller than that of the semiconductor 106b. For example, the insulator 106c is formed to include a region having a thickness of less than 10 nm, preferably less than or equal to 5 nm, more preferably less than or equal to 3 nm. Meanwhile, the insulator 106c has a function of blocking entry of elements other than oxygen (such as hydrogen and silicon) included in the adjacent insulator into the semiconductor 106b where a channel is formed. For this reason, it is preferable that the insulator 106c have a certain thickness. For example, the insulator 106c is formed to include a region having a thickness of greater than or equal to 0.3 nm, preferably greater than or equal to 1 nm, more preferably greater than or equal to 2 nm.

To improve reliability, preferably, the thickness of the insulator 106a is large. For example, the insulator 106a includes a region with a thickness of, for example, greater than or equal to 10 nm, preferably greater than or equal to 20 nm, more preferably greater than or equal to 40 nm, still more preferably greater than or equal to 60 nm. When the thickness of the insulator 106a is made large, a distance from an interface between the adjacent insulator and the insulator 106a to the semiconductor 106b in which a channel is formed can be large. Since the productivity of the semiconductor device might be decreased, the insulator 106a has a region with a thickness of, for example, less than or equal to 200 nm, preferably less than or equal to 120 nm, more preferably less than or equal to 80 nm.

Silicon in the oxide semiconductor might serve as a carrier trap or a carrier generation source. Thus, the silicon concentration in the semiconductor 106b is preferably as low as possible. For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $2\times10^{18}$ atoms/cm$^3$ is provided between the semiconductor 106b and the insulator 106a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $2\times10^{18}$ atoms/cm$^3$ is provided between the semiconductor 106b and the insulator 106c.

It is preferable to reduce the hydrogen concentration in the insulator 106a and the insulator 106c in order to reduce the hydrogen concentration in the semiconductor 106b. The insulator 106a and the insulator 106c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, or still more preferably higher than or equal to $1\times10^{16}$ atoms/cm$^3$ and lower than or equal to $5\times10^{18}$ atoms/cm$^3$. It is preferable to reduce the nitrogen concentration in the insulator 106a and the insulator 106c in order to reduce the nitrogen concentration in the semiconductor 106b. The insulator 106a and the insulator 106c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, more preferably higher than or equal to $1\times10^{15}$ atoms/cm$^3$ and lower than or equal to $1\times10^{18}$ atoms/cm$^3$, or still more preferably higher than or equal to $1\times10^{15}$ atoms/cm$^3$ and lower than or equal to $5\times10^{17}$ atoms/cm$^3$.

The insulator 106a, the semiconductor 106b, and the insulator 106c described in this embodiment (in particular, the semiconductor 106b) are oxide semiconductors having a low impurity concentration and a low density of defect states (a small number of oxygen vacancies), and can be referred to as "highly purified intrinsic" or "substantially highly purified intrinsic" oxide semiconductors. A highly purified intrinsic or substantially highly purified intrinsic oxide semiconductor has few carrier generation sources, and thus has a low carrier density in some cases. Thus, a transistor including a channel region in the oxide semiconductor is less likely to have a negative threshold voltage (normally-on characteristics). A highly purified intrinsic or substantially highly purified intrinsic oxide semiconductor film has a low density of defect states and thus has a low density of trap states in some cases. Furthermore, a highly purified intrinsic or substantially highly purified intrinsic oxide semiconductor has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V even when an element has a channel width W of $1\times10^6$ μm and a channel length L of 10 μm Accordingly, the transistor in which the channel region is formed in the highly purified intrinsic or substantially highly purified intrinsic oxide semiconductor can have a small variation in electrical characteristics and high reliability. Charge trapped by the trap states in the oxide semiconductor takes a long time to be released and may behave like fixed charge. Thus, the transistor whose channel region is formed in the oxide semiconductor having a high density of trap states has unstable electrical characteristics in some cases. Examples of impurities are hydrogen, nitrogen, alkali metal, and alkaline earth metal.

Hydrogen contained in the insulator 106a, the semiconductor 106b, and the insulator 106c reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Hydrogen trapped by an oxygen vacancy might form a shallow donor level in a band structure of a semiconductor. Thus, a transistor including an oxide semiconductor that contains hydrogen is likely to be normally on. For this reason, it is preferable that hydrogen be reduced as much as possible in the insulator 106a, the semiconductor 106b, and the insulator 106c. Specifically, the hydrogen concentration in the insulator 106a, the semiconductor 106b, and the insulator 106c, which is measured by SIMS, is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$, yet more preferably lower than or equal to $1\times10^{18}$ atoms/cm$^3$, even more preferably lower than or equal to $5\times10^{17}$ atoms/cm$^3$, and more preferably lower than or equal to $1\times10^{16}$ atoms/cm$^3$.

In addition, the concentration of an alkali metal or alkaline earth metal in the insulator 106a, the semiconductor 106b, and the insulator 106c, which is measured by SIMS, is set to be lower than or equal to $1\times10^{18}$ atoms/cm$^3$, preferably lower than or equal to $2 \times 10^{16}$ atoms/cm³. An alkali metal and an alkaline earth metal might generate carriers when bonded to an oxide semiconductor, in which case the off-state current of the transistor might be increased. Thus, it is preferable to reduce the concentration of an alkali metal or alkaline earth metal in the insulator 106a, the semiconductor 106b, and the insulator 106c.

Furthermore, when containing nitrogen, the insulator 106a, the semiconductor 106b, and the insulator 106c easily become n-type by generation of electrons serving as carriers and an increase in carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm³.

As illustrated in FIG. 8B, regions of the semiconductor 106b that are in contact with the conductor 108a and the conductor 108b (which are denoted with dotted lines in FIG. 8B) include a low-resistance region 109a and a low-resistance region 109b in some cases. The low-resistance region 109a and the low-resistance region 109b are mainly formed when oxygen is extracted by the conductor 108a and the conductor 108b that are in contact with the semiconductor 106b, or when a conductive material in the conductor 108a or the conductor 108b is bonded to an element in the semiconductor 106b. The formation of the low-resistance region 109a and the low-resistance region 109b leads to a reduction in contact resistance between the conductor 108a or 108b and the semiconductor 106b, whereby the transistor 12 can have a large on-state current.

As illustrated in FIG. 8B, the semiconductor 106b might have a smaller thickness in a region between the conductor 108a and the conductor 108b than in regions overlapping with the conductor 108a and the conductor 108b. This is because part of the top surface of the semiconductor 106b is removed at the time of formation of the conductor 108a and the conductor 108b. In formation of the conductor to be the conductor 108a and the conductor 108b, a region with low resistance like the low-resistance regions 109a and 109b is formed on the top surface of the semiconductor 106b in some cases. By removal of a region of the top surface of the semiconductor 106b that is positioned between the conductor 108a and the conductor 108b, the channel can be prevented from being formed in the low-resistance region on the top surface of the semiconductor 106b. In the drawings, even when a thin region is not drawn in an enlarged view or the like, such a thin region might be formed.

Note that the three-layer structure including the insulator 106a, the semiconductor 106b, and the insulator 106c is an example. For example, a two-layer structure not including the insulator 106a or the insulator 106c may be employed. Alternatively, a single-layer structure including neither the insulator 106a nor the insulator 106c may be employed. Still alternatively, it is possible to employ an n-layer structure (n is an integer of four or more) that includes any of the insulator, semiconductor, and conductor given as examples of the insulator 106a, the semiconductor 106b, and the insulator 106c.

<Insulator and Conductor of Transistor 12>

Components other than the semiconductor of the transistor 12 will be described in detail below.

The amounts of hydrogen and water contained in the insulator 104 are preferably small. The insulator 104 preferably contains excess oxygen. For example, the insulator 104 may be formed so as to have a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used for the insulator 104. Preferably, silicon oxide or silicon oxynitride is used.

The insulator 104 is preferably an insulator containing excess oxygen. The insulator 104 makes it possible to supply oxygen from the insulator 104 to the insulator 106a, the semiconductor 106b, and the insulator 106c. The supplied oxygen can reduce oxygen vacancies which are to be defects in the insulator 106a, the semiconductor 106b, and the insulator 106c which are oxide semiconductors. As a result, the insulator 106a, the semiconductor 106b, and the insulator 106c can be oxide semiconductors with a low density of defect states and stable characteristics.

In this specification and the like, excess oxygen refers to oxygen in excess of that in the stoichiometric composition, for example. Alternatively, excess oxygen refers to oxygen released from a film or layer containing the excess oxygen by heating, for example. Excess oxygen can move inside a film or a layer. Excess oxygen moves between atoms in a film or a layer, or replaces oxygen that is a constituent of a film or a layer and moves like a billiard ball, for example.

The insulator 104 containing excess oxygen releases oxygen molecules, the number of which is preferably greater than or equal to $1.0 \times 10^{14}$ molecules/cm² and less than or equal to $1.0 \times 10^{16}$ molecules/cm², more preferably greater than or equal to $1.0 \times 10^{15}$ molecules/cm² and less than or equal to $5.0 \times 10^{15}$ molecules/cm² in thermal desorption spectroscopy (TDS) analysis in the range of surface temperatures of 100° C. to 700° C. or 100° C. to 500° C.

A method for measuring the amount of released molecules using TDS analysis is described below by taking the amount of released oxygen as an example.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH₃OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is not taken into consideration either because the proportion of such a molecule in the natural world is negligible.

$$N_{O2} = N_{H2}/S_{H2} \times S_{O2} \times \alpha$$

The value $N_{H2}$ is obtained by conversion of the amount of hydrogen molecules desorbed from the standard sample into densities. The value $S_{H2}$ is the integral value of ion intensity when the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the amount of the released oxygen atoms can also be estimated through the measurement of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in ESR.

The amounts of hydrogen and water contained in the insulator 104 are preferably small. For example, the number of water molecules released from the insulator 104 is preferably greater than or equal to $1.0 \times 10^{13}$ molecules/cm$^2$ and less than or equal to $1.4 \times 10^{16}$ molecules/cm$^2$, more preferably greater than or equal to $1.0 \times 10^{13}$ molecules/cm$^2$ and less than or equal to $4.0 \times 10^{15}$ molecules/cm$^2$, still more preferably greater than or equal to $1.0 \times 10^{13}$ molecules/cm$^2$ and less than or equal to $2.0 \times 10^{15}$ molecules/cm$^2$ in TDS analysis in the range of surface temperatures from 100° C. to 700° C. or from 100° C. to 500° C. The number of hydrogen molecules released from the insulator 104 is preferably greater than or equal to $1.0 \times 10^{13}$ molecules/cm$^2$ and less than or equal to $1.2 \times 10^{15}$ molecules/cm$^2$, more preferably greater than or equal to $1.0 \times 10^{13}$ molecules/cm$^2$ and less than or equal to $9.0 \times 10^{14}$ molecules/cm$^2$ in TDS analysis in the range of surface temperatures from 100° C. to 700° C. or from 100° C. to 500° C.

As described above, the top surface or the bottom surface of the semiconductor 106b preferably has high planarity. Thus, to improve the planarity, planarization treatment may be performed on the top surface of the insulator 104 by a chemical mechanical polishing (CMP) method or the like.

The conductors 108a and 108b serve as a source electrode and a drain electrode of the transistor 12.

The conductors 108a and 108b may be formed so as to have a single-layer structure or a layered structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 112 functions as a gate insulating film of the transistor 12. Like the insulator 104, the insulator 112 may be an insulator containing excess oxygen. The insulator 112 makes it possible to supply oxygen from the insulator 112 to the insulator 106a, the semiconductor 106b, and the insulator 106c.

The insulator 112 may be formed so as to have a single-layer structure or a layered structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 112 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 114 functions as the gate electrode of the transistor 12. For the conductor 114, the conductor that can be used for the conductors 108a and 108b can be used.

Here, as illustrated in FIG. 8C, the semiconductor 106b can be electrically surrounded by an electric field of the conductor 114 and the like (a structure in which a semiconductor is electrically surrounded by an electric field of a conductor is referred to as a surrounded channel (s-channel) structure). Therefore, a channel is formed in the entire semiconductor 106b (the top, bottom, and side surfaces). In the s-channel structure, a large amount of current can flow between a source and a drain of a transistor, so that a high on-state current can be obtained.

In the case where the transistor has the s-channel structure, a channel is formed also in the side surface of the semiconductor 106b. Therefore, as the semiconductor 106b has a larger thickness, the channel region is larger. In other words, the thicker the semiconductor 106b is, the larger the on-state current of the transistor is. In addition, when the semiconductor 106b is thicker, the proportion of the region with a high carrier controllability increases, leading to a smaller subthreshold swing value. For example, the semiconductor 106b has a region with a thickness greater than or equal to 10 nm, preferably greater than or equal to 20 nm, more preferably greater than or equal to 30 nm, still more preferably greater than or equal to 50 nm. Since the productivity of the semiconductor device might be decreased, the semiconductor 106b has a region with a thickness of, for example, less than or equal to 300 nm, preferably less than or equal to 200 nm, more preferably less than or equal to 150 nm.

The s-channel structure is suitable for a miniaturized transistor because a large on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

The insulator 116 preferably functions not only as a dielectric of the capacitor 14 but also as a protective insulating film of the transistor 12. Here, the thickness of the insulator 116 can be greater than or equal to 5 nm, or greater than or equal to 20 nm, for example. It is preferable that at least part of the insulator 116 be in contact with the top surface of the insulator 104.

The insulator 116 may be formed so as to have a single-layer structure or a layered structure including an insulator containing, for example, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 116 preferably has a blocking effect against oxygen, hydrogen, water, alkali metal, alkaline earth metal, and the like. As such an insulator, for example, a nitride insulating film can be used. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Here, it is preferable that the insulator 116 be formed by a sputtering method and it is more preferable that the insulator 116 be formed by a sputtering method in an atmosphere containing oxygen. When the insulator 116 is formed by a sputtering method, oxygen is added to the vicinity of a surface of the insulator 104 (after the formation of the insulator 116, the interface between the insulator 116 and the insulator 104) at the same time as the formation.

It is preferable that the insulator 116 be less permeable to oxygen than the insulator 104 and have a function of blocking oxygen. Providing the insulator 116 can prevent oxygen from being externally released to above the insulator 116 at the time of supply of oxygen from the insulator 104 to the insulator 106a, the semiconductor 106b, and the insulator 106c.

Aluminum oxide is preferably used as the insulator 116 because it is highly effective in preventing passage of both oxygen and impurities such as hydrogen and moisture.

The insulator 118 functions as an interlayer insulating film. The insulator 118 may be formed using the insulator that can be used as the insulator 104.

The conductor 120 functions as a wiring electrically connected to the source electrode and the drain electrode of the transistor 12. For the conductor 120, the conductor that can be used for the conductors 108a and 108b can be used. Alternatively, a semiconductor such as a polycrystalline silicon doped with an impurity, e.g., phosphorus may be used as the conductor 120.

The conductor 122 functions as the other electrode of the capacitor. For the conductor 122, the conductor that can be used for the conductors 108a and 108b can be used.

With the above structure, the transistor 12 with stable electrical characteristics can be provided. Alternatively, the transistor 12 having a small leakage current in an off state can be provided. Alternatively, the transistor 12 with high frequency characteristics can be provided. Alternatively, the transistor 12 with normally-off electrical characteristics can be provided. Alternatively, the transistor 12 having a small subthreshold swing value can be provided. Alternatively, the transistor 12 having high reliability can be provided. The use of the transistor 12 in the memory cell 10 allows fabrication of a semiconductor device capable of retaining stored data for a longer period.

<Structure of Memory Cell Array>

Next, a structural example of the three-dimensional memory cell array described in the above embodiment will be described with reference to FIG. 9 to FIGS. 11A and 11B.

Figure 9:
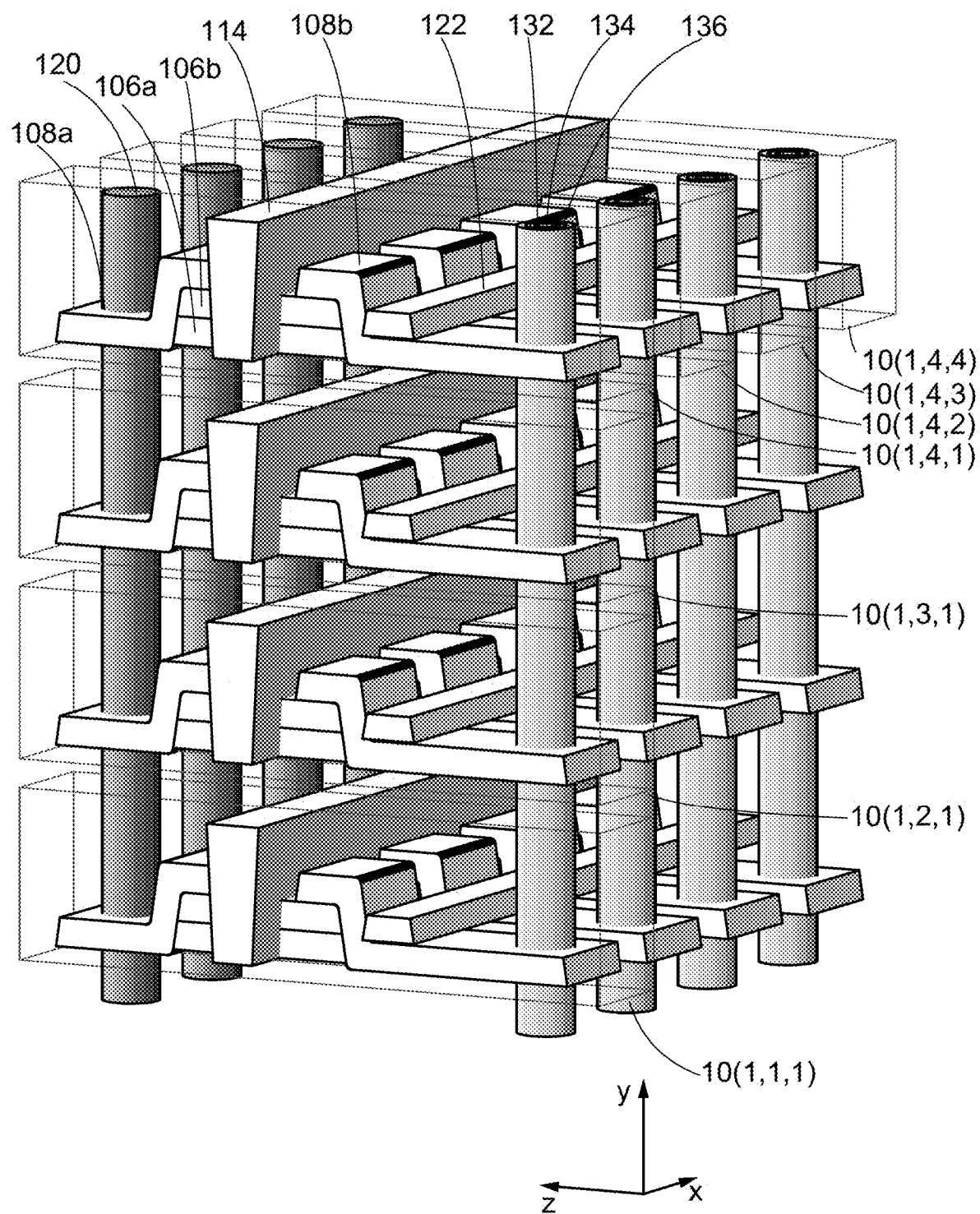
FIG. 9 is a schematic view illustrating a semiconductor device of one embodiment of the present invention.

The structure of the memory cells 10 (1,1,1) to (1,4,4) in the two-dimensional memory cell array 30 [1] is illustrated in FIG. 9 to FIGS. 11A and 11B as part of the three-dimensional memory cell array. FIG. 9 is a three-dimensional schematic diagram illustrating the memory cells 10 (1,1,1) to (1,4,4). Note that in FIG. 9, rectangular coordinates using an x-axis, a y-axis, and a z-axis are set as in FIG. 2 for the sake of convenience. Here, the top surface of a substrate over which the three-dimensional memory cell array is provided is substantially parallel to the x-z plane, and the y-axis is substantially perpendicular to the top surface of the substrate. Note that in FIG. 9, some components (e.g., the insulator 106c and the insulator 112) of the memory cell 10 are not illustrated.

Figure 10:
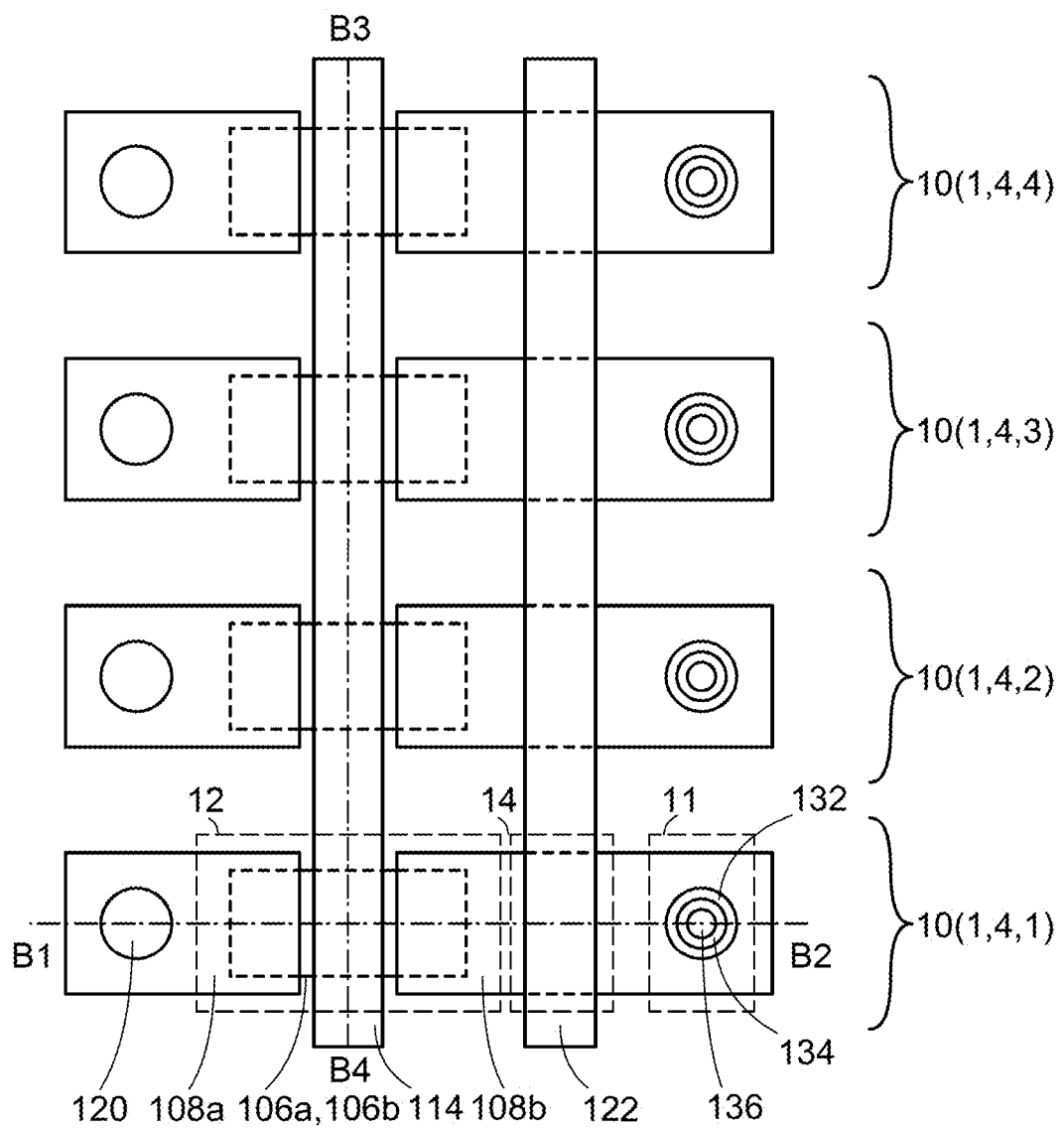
FIG. 10 is a top view illustrating a semiconductor device of one embodiment of the present invention.
Figure 11A:
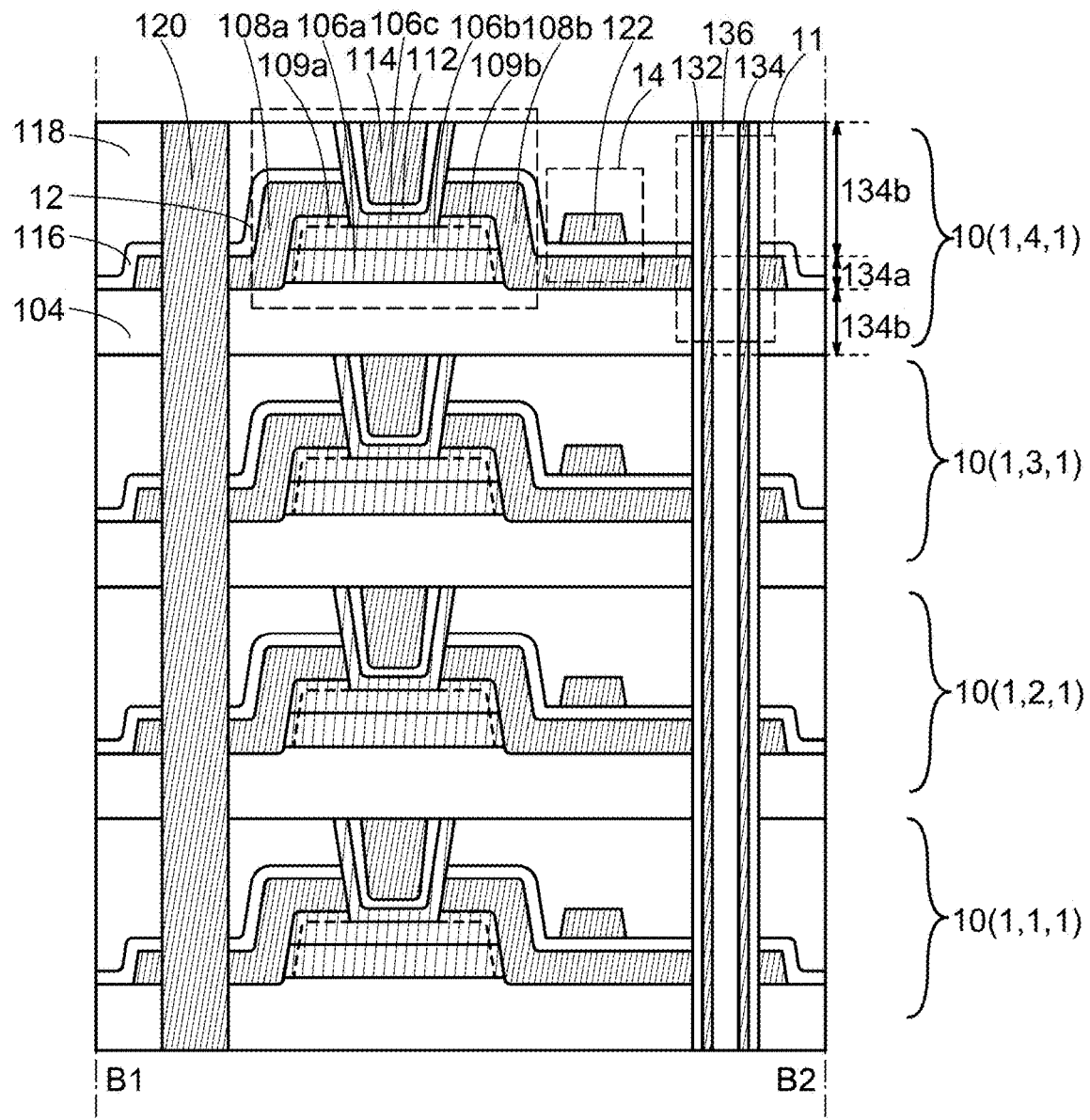
FIGS. 11A and 11B are cross-sectional views illustrating a semiconductor device of one embodiment of the present invention.
Figure 11B:
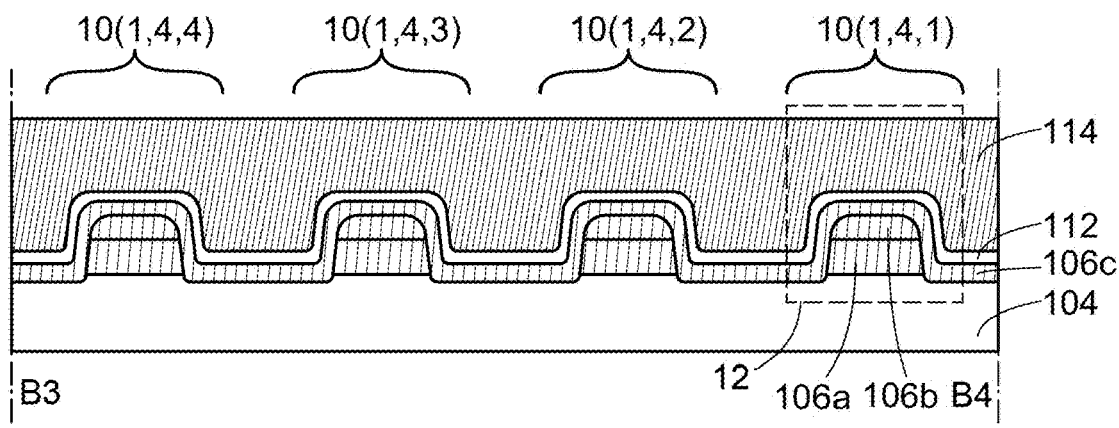

FIG. 10 is a top view illustrating the memory cells 10 (1,1,1) to (1,4,4). FIG. 11A is a cross-sectional view along the dashed-dotted line B1-B2 in FIG. 10, and illustrates the memory cells 10 (1,1,1) to (1,4,1). FIG. 11B is a cross-sectional view along the dashed-dotted line B3-B4 in FIG. 10, and illustrates the memory cells 10 (1,4,1) to (1,4,4). Note that a region along the dashed-dotted line B1-B2 shows a structure of the transistor 12 in the channel length direction, and a region along the dashed-dotted line B3-B4 shows structures of the transistors 12 in the channel width direction in the memory cells 10 (1,4,1) to (1,4,4).

The structures of the memory cells 10 are identical, and the description of the above structure of the memory cell 10 can be referred to. Note that in the memory cells 10 formed over the same plane (e.g., the memory cells 10 (1,1,1) to $(m_1,1,m_3)$ in FIG. 2), the insulator 104, the insulator 116, the insulator 118, and the like may be one insulator.

As illustrated in FIG. 11A, the insulator 132, the semiconductor 134, and the insulator 136 are formed so as to extend in the direction substantially parallel to the y-axis, and shared by the memory cells 10 (1,1,1) to (1,4,1). In other words, the insulator 132, the semiconductor 134, and the insulator 136 are shared by the memory cells 10 arranged in the y-axis direction. Thus, in the semiconductor 134, the region 134b functioning as a source electrode and a drain electrode of the transistor 11 in one memory cell 10 is in contact with the region 134b in another memory cell 10 adjacent to the one memory cell 10 in the y-axis direction. That is, in the memory cells 10 adjacent to each other in the y-axis direction, the transistors 11 are electrically connected in series.

In the afore-mentioned manner, the plurality of transistors 11 included in one memory cell string 20 are formed at a time using the insulator 132, the semiconductor 134, and the insulator 136. For example, in the case where the transistor 11 is a standard planar transistor, plugs and wirings are required to be formed in each layer. however, the use of an SGT as the transistor 11 enables self-aligned formation of a structure in which the source and drain electrodes of the plurality of transistors 11 are connected in series.

Note that a conductor that is electrically connected to a low power supply potential line and functions as the wiring SL can be formed in contact with the top surface of the semiconductor 134 in the memory cell 10 of the highest stage. The connection between the transistor 61 and the semiconductor 134 in the memory cell 10 of the lowest stage will be described later.

As illustrated in FIG. 11A, the conductor 120 is formed so as to extend in the direction substantially parallel to the y-axis, and shared by the memory cells 10 (1,1,1) to (1,4,1). In other words, the conductor 120 is shared by the memory cells 10 arranged in the y-axis direction. The conductor 120 is electrically connected to the other of the source electrode and the drain electrode of the transistor 12 in the memory cell 10, and functions as the wiring WBL illustrated in FIG. 2 and the like.

Note that the top surface of the conductor 120 in the memory cell 10 of the highest stage is preferably covered with an insulator or the like so as not to be in contact with the conductor functioning as the wiring SL, and the like. The connection between the transistor 62 and the conductor 120 in the memory cell 10 of the lowest stage will be described later.

As illustrated in FIG. 10 and FIG. 11B, the conductor 114 is formed so as to extend in the direction substantially parallel to the x-axis, and shared by the memory cells 10 (1,4,1) to (1,4,4). In other words, the conductor 114 is shared by the memory cells 10 arranged in the x-axis direction. The conductor 114 functions as the gate electrode of the transistor 11 in the memory cell 10, and also functions as the wiring WWL illustrated in FIG. 2 and other figures. Note that in the three-dimensional memory cell array 40 illustrated in FIG. 9 to FIGS. 11A and 11B, the insulator 106c and the insulator 112 are also patterned in a manner similar to that of the conductor 114. Thus, the insulator 106c and the insulator 112 are also shared by the memory cells 10 arranged in the x-axis direction. Note that one embodiment of the present invention is not limited thereto, and for example, a structure may be employed in which the conductor 114 and the insulator 112 are shared by the memory cells 10 arranged in the x-axis direction and the insulator 106c is not shared by the memory cells 10 arranged in the x-axis direction and is patterned into island shapes in the memory cells 10.

As illustrated in FIG. 10, the conductor 122 is formed so as to extend in the direction substantially parallel to the x-axis, and shared by the memory cells 10 (1,4,1) to (1,4,4). In other words, the conductor 122 is shared by the memory cells 10 arranged in the x-axis direction. The conductor 122 also functions as the other electrode of the capacitor 14 in the memory cell 10 and functions as the wiring RWL illustrated in FIG. 2 and the like.

With the above structure, a three-dimensional memory cell array in which the memory cells 10 are stacked in the direction perpendicular to the top surface of a substrate can be provided. Stacking the memory cells in such a manner can increase storage capacity per unit area in accordance with the number of the stacked memory cells. The memory cell includes two transistors and one capacitor; that is, the number of elements is relatively large. Thus, the storage capacity per unit area tends to be smaller than that of a conventional memory. However, with the structure of the semiconductor device described in this embodiment, a semiconductor device with a storage capacity larger than or equal to that of a conventional memory in addition to the favorable characteristics described above can be provided. The memory cells are thus stacked in the semiconductor device described in this embodiment to increase storage capacity per unit area, whereby storage devices with storage capacities of 1 TByte or more, 5 TByte or more, and 10 TByte or more can be provided.

<Structure of Selection Transistor Array>

Next, structural examples of transistors included in the selection transistor array described in the above embodiment will be described with reference to FIGS. 12A to 12D and FIGS. 13A to 13D.

Figure 12A:
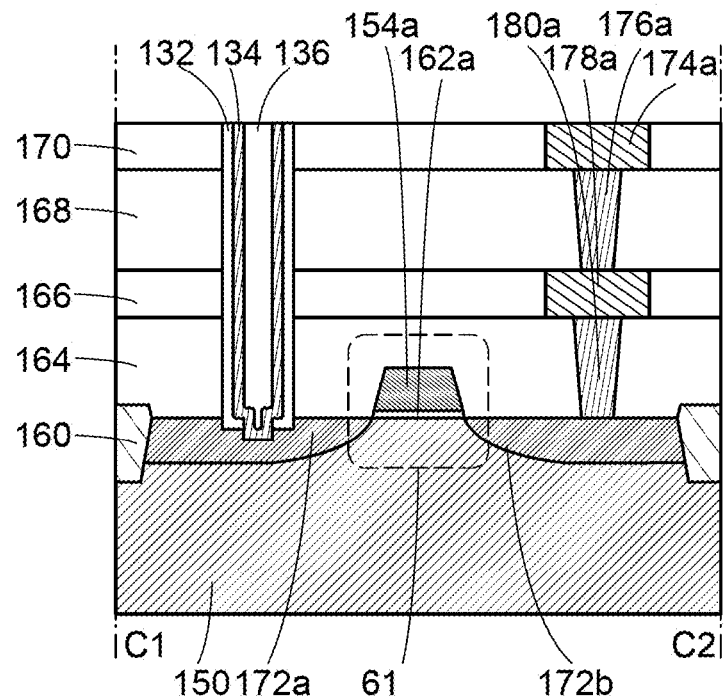
FIGS. 12A to 12D are cross-sectional views illustrating semiconductor devices of one embodiment of the present invention.
Figure 12B:
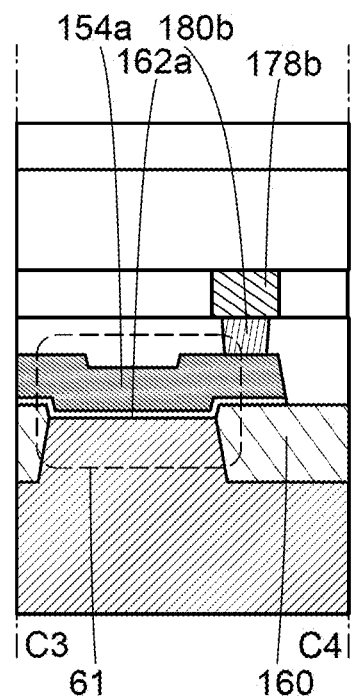

FIGS. 12A and 12B are cross-sectional views of the transistor 61 provided in the selection transistor array 50 illustrated in FIG. 5. The cross-sectional view along C1-C2 in FIG. 12A illustrates the transistor 61 in the channel length direction, and the cross-sectional view along C3-C4 in FIG. 12B illustrates the transistor 61 in the channel width direction.

The transistor 61 in FIGS. 12A and 12B is a transistor using the semiconductor substrate 150. The transistor 61 includes a region 172a in the semiconductor substrate 150, a region 172b in the semiconductor substrate 150, an insulator 162a, and a conductor 154a. Although not illustrated, sidewall insulators may be provided in contact with side surfaces of the conductor 154a. In that case, regions with a lower impurity concentration than that of regions not overlapping with the sidewall insulators might be formed in regions overlapping with the sidewall insulators, in the region 172a and the region 172b.

In the transistor 61, the regions 172a and 172b function as a source region and a drain region. The insulator 162a functions as a gate insulator. The conductor 154a functions as a gate electrode. Thus, the resistance of a channel formation region can be controlled by a potential supplied to the conductor 154a. In other words, conduction or non-conduction between the region 172a and the region 172b can be controlled by the potential supplied to the conductor 154a.

For the semiconductor substrate 150, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 150.

As the semiconductor substrate 150, a semiconductor substrate including impurities imparting p-type conductivity is used. However, a semiconductor substrate including impurities imparting n-type conductivity may be used as the semiconductor substrate 150. In that case, a well including impurities imparting p-type conductivity may be provided in a region where the transistor 61 is formed. Alternatively, the semiconductor substrate 150 may be an i-type semiconductor substrate.

Note that the substrate used in the semiconductor device described in this embodiment is not limited to a semiconductor substrate. For example, in the case where an active layer of the transistor 61 or the like is formed by deposition or the like, an insulator substrate, a conductor substrate, or the like can be used. As the insulator substrate, a glass substrate, a quartz substrate, a sapphire substrate, a stabilized zirconia substrate (e.g., an yttria-stabilized zirconia substrate), or a resin substrate is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate resistant to heat treatment performed in manufacture of the transistor may be used as the substrate. As a method for providing the transistor over a flexible substrate, there is a method in which the transistor is formed over a non-flexible substrate and then the transistor is separated and transferred to the flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The thickness of the substrate is, for example, greater than or equal to 5 µm and less than or equal to 700 µm, preferably greater than or equal to 10 µm and less than or equal to 500 µm, and further preferably greater than or equal to 15 µm and less than or equal to 300 µm. When the substrate has a small thickness, the weight of the semiconductor device can be reduced. When the substrate has a small thickness, even in the case of using glass or the like, the substrate may have elasticity or a property of returning to its original shape when bending or pulling is stopped. Therefore, an impact applied to the semiconductor device over the substrate due to dropping or the like can be reduced. That is, a durable semiconductor device can be provided.

The regions 172a and 172b are regions including impurities imparting n-type conductivity. Accordingly, the transistor 61 has a structure of an n-channel transistor.

Note that the transistor 61 is separated from the adjacent transistor by a region 160 and the like. The region 160 is an insulating region.

The semiconductor device illustrated in FIGS. 12A and 12B includes the insulator 132, the semiconductor 134, the insulator 136, an insulator 164, an insulator 166, an insulator 168, the insulator 170, a conductor 180a, a conductor 180b, a conductor 178a, a conductor 178b, a conductor 176a, and a conductor 174a. Note that the insulator 132, the semiconductor 134, and the insulator 136 are ones formed in the three-dimensional memory cell array 40 described above.

The insulator 164 is formed over the transistor 61. The insulator 166 is formed over the insulator 164. The insulator 168 is formed over the insulator 166. The insulator 170 is formed over the insulator 168.

The insulator 164, the insulator 166, the insulator 168, and the insulator 170 have a cylindrical opening reaching the region 172a, and the insulator 132, the semiconductor 134, and the insulator 136 are formed in the opening. The insulator 132 is formed in contact with the interior wall of the opening so as to have a shape of a circular tube, the semiconductor 134 is formed so as to have a shape of a circular tube and be located inward from the insulator 132, and the insulator 136 is formed so as to have a cylindrical shape and be located inward from the insulator 134. The insulator 132, the semiconductor 134, and the insulator 136 are formed so as to extend substantially perpendicularly to the top surface of the semiconductor substrate 150.

An opening is formed in at least part of the bottom surface of the insulator 132, and the semiconductor 134 is in contact with the region 172a through the opening. Here, the semiconductor 134 illustrated in FIGS. 12A and 12B corresponds to any one of the wirings RBL [1,1] to $[m_1,m_3]$ illustrated in FIG. 3 and the like, and the region 172a functions as a source region or a drain region of the transistor 61. With the above structure, the wiring RBL of a bottom portion of the memory cell string can be electrically connected to the source region or the drain region of the transistor 61 in the selection transistor cell 60.

The insulator 164 further has an opening reaching the region 172b and an opening reaching the conductor 154a. The conductor 180a and the conductor 180b are embedded in the opening reaching the region 172b and the opening reaching the conductor 154a, respectively. The insulator 166 further has an opening reaching the conductor 180a and an opening reaching the conductor 180b. The conductor 178a and the conductor 178b are embedded in the opening reaching the conductor 180a and the opening reaching the conductor 180b, respectively. The insulator 168 further has an opening reaching the conductor 178a. The conductor 176a is embedded in the opening. The insulator 170 further has an opening reaching the conductor 176a. The conductor 174a is embedded in the opening.

Here, the conductor 174a is electrically connected to the region 172b functioning as the source region or the drain region of the transistor 61, and functions as any of the wirings RBL [1] to $[m_1]$ illustrated in FIG. 5 and the like. The conductor 178b is electrically connected to the conductor 154a functioning as a gate electrode of the transistor 61, and functions as the wiring SG1 illustrated in FIG. 5 and the like. Any of the two-dimensional memory cell arrays 30 [1] to $[m_3]$ can be selected in reading data via the wiring SG1 and the transistor 61 formed in the aforementioned manner.

The insulators 164, 166, 168, and 170 may each be formed so as to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

At least one of the insulators 164, 166, 168, and 170 preferably has a function of blocking oxygen and impurities such as hydrogen. An insulator having a function of blocking oxygen and an impurity such as hydrogen is provided below the transistor 12 included in the three-dimensional memory cell array 40, whereby stable electric characteristics of the transistor 12 can be achieved.

An insulator with a function of blocking oxygen and impurities such as hydrogen may have a single-layer structure or a layered structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used.

The conductors 180a, 180b, 178a, 178b, 176a, and 174a may each be formed so as to have a single-layer structure or a layered structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 12C:
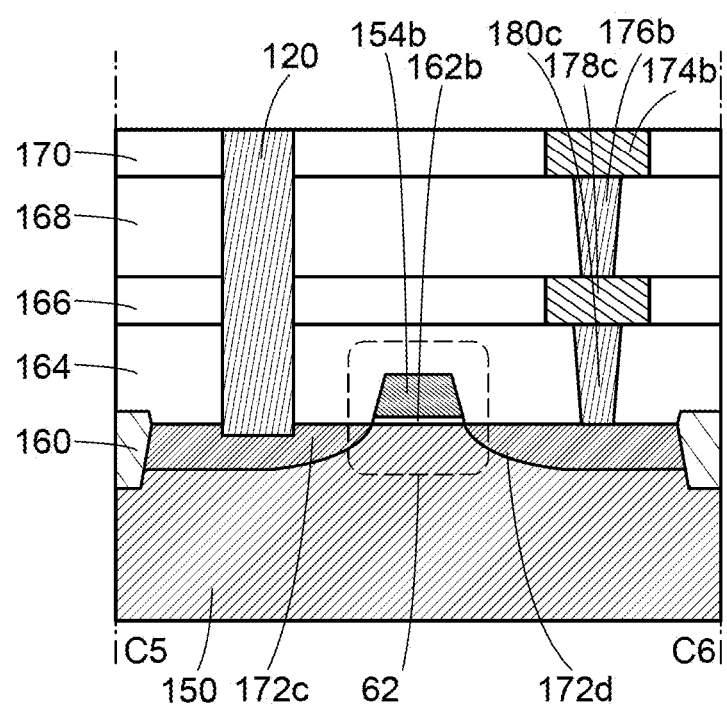
Figure 12D:
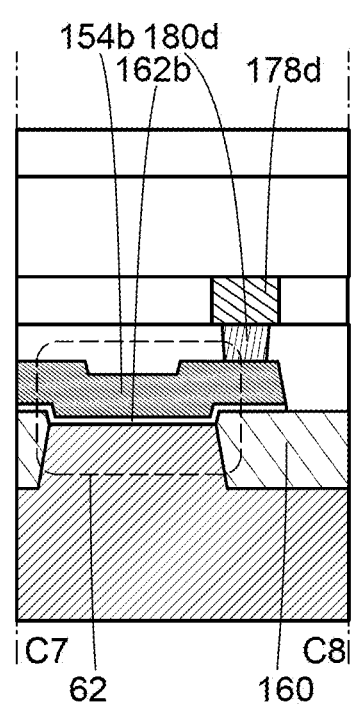
Figure 13A:
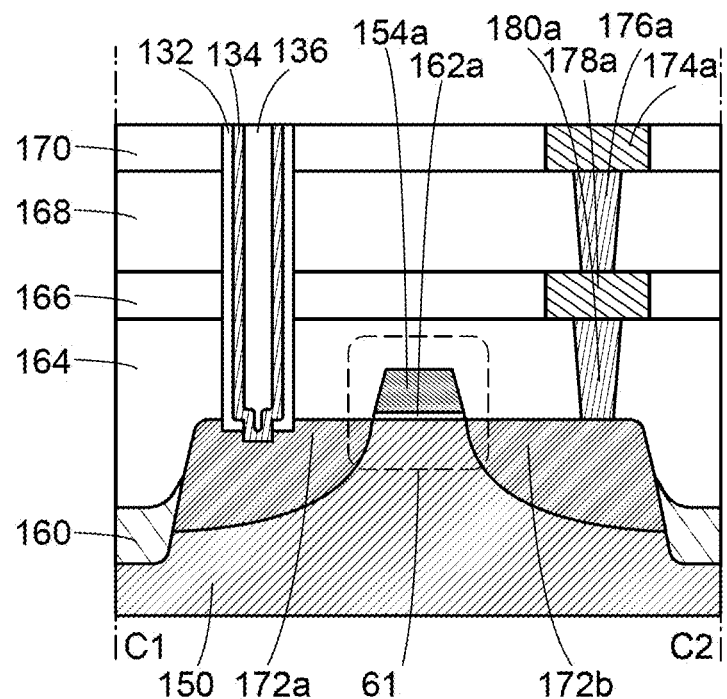
FIGS. 13A to 13D are cross-sectional views illustrating semiconductor devices of one embodiment of the present invention.
Figure 13B:
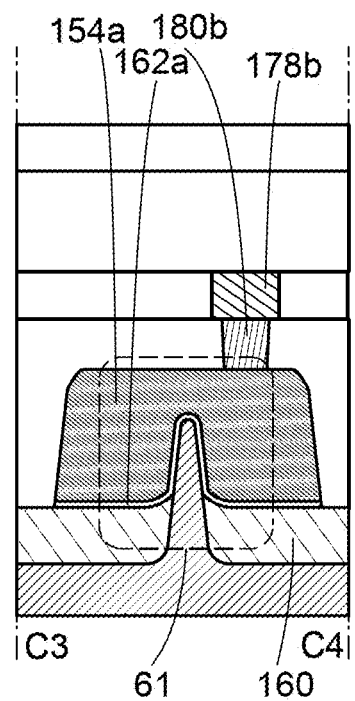
Figure 13C:
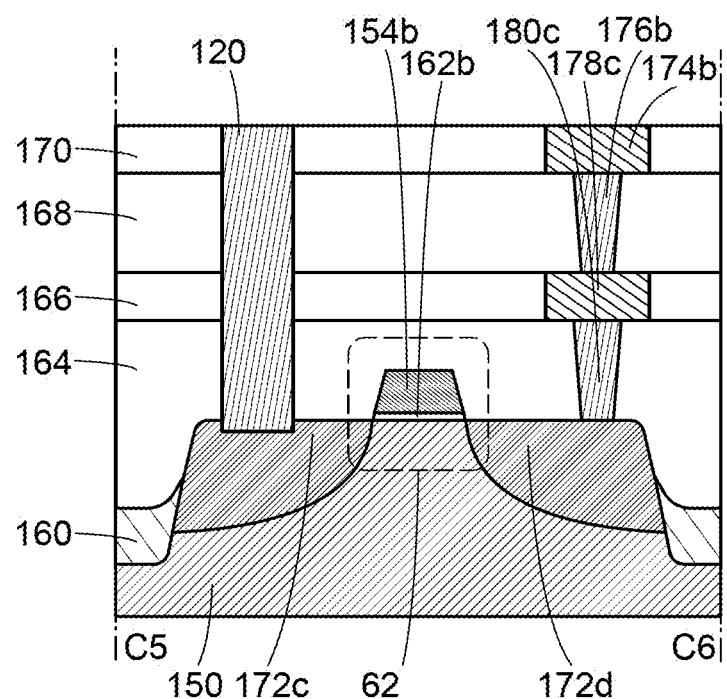
Figure 13D:
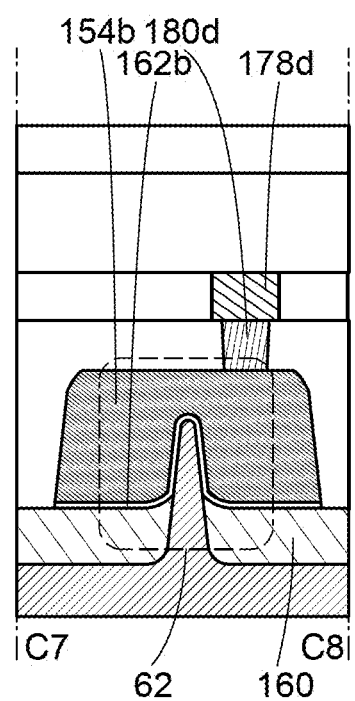

FIGS. 12C and 12D are cross-sectional views of the transistor 62 provided in the selection transistor array 50 illustrated in FIG. 5. The cross-sectional view along C5-C6 in FIG. 12C illustrates the transistor 62 in the channel length direction, and the cross-sectional view along C7-C8 in FIG. 12D illustrates the transistor 62 in the channel width direction.

The structure of the semiconductor device illustrated in FIGS. 12C and 12D is the same as that of the semiconductor device illustrated in FIGS. 12A and 12B except that the conductor 120 is formed instead of the insulator 132, the semiconductor 134, and the insulator 136. The transistor 62 includes a region 172c and a region 172d in the semiconductor substrate 150, an insulator 162b, and a conductor 154b; the structures of the region 172a and the region 172b can be referred to for the region 172c and the region 172d, the structure of the insulator 162a can be referred to for the insulator 162b, and the structure of the conductor 154a can be referred to for the conductor 154b.

In addition, the structures of the conductor 180a, the conductor 180b, the conductor 178a, the conductor 178b, the conductor 176a, and the conductor 174a can be referred to for the conductor 180c, the conductor 180d, the conductor 178c, the conductor 178d, the conductor 176b, and the conductor 174b.

The insulator 164, the insulator 166, the insulator 168, and the insulator 170 have a cylindrical opening reaching the region 172c, and the conductor 120 is formed in the opening. The conductor 120 is formed in contact with the interior wall of the opening so as to have a cylindrical shape. The conductor 120 is formed so as to extend substantially perpendicularly to the top surface of the semiconductor substrate 150. Here, the conductor 120 illustrated in FIGS. 12C and 12D corresponds to any one of the wirings WBL [1,1] to [$m_1$,$m_3$] illustrated in FIG. 3 and other figures, and the region 172c functions as a source region or a drain region of the transistor 62. With the above structure, the wiring WBL electrically connected to the transistor 12 in the memory cell 10 can be electrically connected to the source region or the drain region of the transistor 62 in the selection transistor cell 60.

In addition, the conductor 174b is electrically connected to the region 172d functioning as the source region or the drain region of the transistor 62, and functions as any of the wirings WBL [1] to [$m_1$] illustrated in FIG. 5 and other figures. The conductor 178d is electrically connected to the conductor 154b functioning as a gate electrode of the transistor 62, and functions as the wiring SG2 illustrated in FIG. 5 and other figures. Any of the two-dimensional memory cell arrays 30 [1] to [$m_3$] can be selected in writing data via the wiring SG2 and the transistor 62 formed in the aforementioned manner.

Note that a semiconductor device illustrated in FIGS. 13A to 13D is different from that illustrated in FIGS. 12A to 12D only in the structure of the transistor 61 or the transistor 62. The description of the semiconductor device illustrated in FIGS. 12A to 12D can be referred to for the semiconductor device illustrated in FIGS. 13A to 13D. Specifically, in the semiconductor device illustrated in FIGS. 13A to 13D, the transistor 61 or the transistor 62 is a Fin-type transistor. When the transistor 61 or the transistor 62 is a Fin-type transistor, the effective channel width increases, leading to improvement in the on-state characteristics of the transistor 61 or the transistor 62. In addition, since contribution of the electric field of the gate electrode can be increased, the off-state characteristics of the transistor 61 or 62 can be improved.

Modification Examples of Memory Cell

Modification examples of the transistor 12 will be described below with reference to FIGS. 14A to 14E. FIGS. 14A to 14E are cross-sectional views of the transistor 12 in the channel length direction and those in the channel width direction like FIGS. 8B and 8C.

Figure 14A:
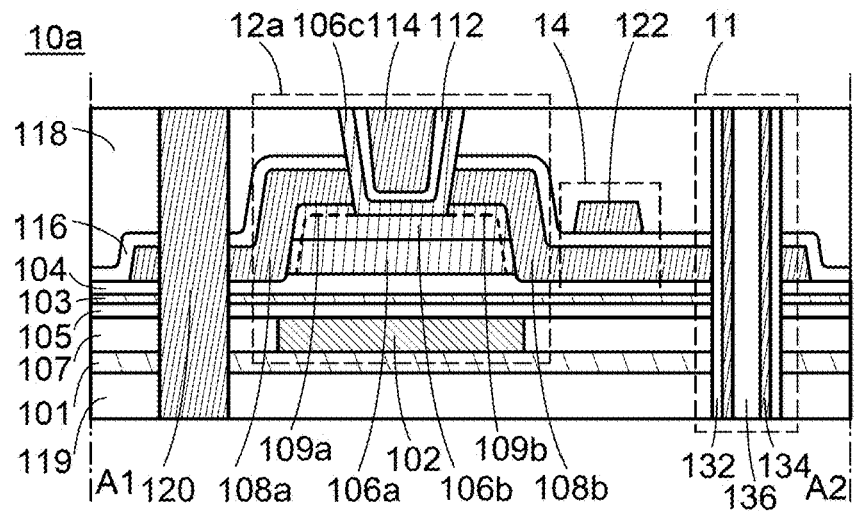
FIGS. 14A to 14F are cross-sectional views illustrating semiconductor devices of embodiments of the present invention.
Figure 14B:
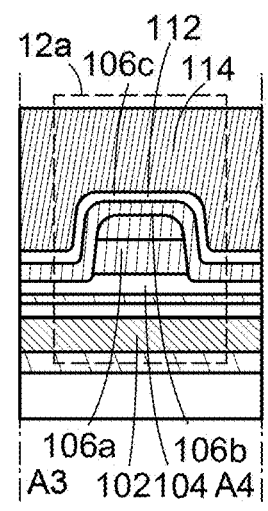

The memory cell 10a illustrated in FIGS. 14A and 14B is different from the memory cell 10 mainly in that the structure of the transistor 12a is different from that of the transistor 12. The transistor 12a is different from the transistor 12 in that an insulator 119, an insulator 101, an insulator 107, a conductor 102, an insulator 103, and an insulator 105 are formed under the insulator 104. The insulator 101 is formed over the insulator 119. The insulator 107 is formed over the insulator 101. The conductor 102 is embedded in an opening in the insulator 107. The insulator 105 is formed over the insulator 107 and the conductor 102. The insulator 103 is formed over the insulator 105. The insulator 104 is formed over the insulator 103.

As the insulator 119, the insulator that can be used as the insulator 104 can be used.

As the insulator 101, an insulator having a function of blocking hydrogen or water is used. Hydrogen or water in the insulator provided near the insulator 106a, the semiconductor 106b, and the insulator 106c is one of the factors of carrier generation in the insulator 106a, the semiconductor 106b, and the insulator 106c which also function as oxide semiconductors. Because of this, the reliability of the transistor 12 might be decreased. It is more effective to provide the insulator 101 particularly in the memory cells 10 (1,1,1) to ($m_1$,1,$m_3$) provided at the lowest stage of the three-dimensional memory cell array 40 because the memory cells 10 are closest to the selection transistor array 50.

In the case where a silicon-based semiconductor element is provided in the selection transistor array 50, hydrogen is used to terminate a dangling bond of the semiconductor element, and the hydrogen might diffuse to the transistor 12. However, if such a structure includes the insulator 101 having a function of blocking hydrogen or water, diffusion of hydrogen or water from below the transistor 12 can be inhibited, leading to an improvement in the reliability of the transistor 12.

The insulator 101 preferably has a function of blocking oxygen. If oxygen diffused from the insulator 104 can be blocked by the insulator 101, oxygen can be effectively supplied from the insulator 104 to the insulator 106a, the semiconductor 106b, and the insulator 106c.

The insulator 101 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 101 to function as an insulating film having an effect of blocking diffusion of oxygen, hydrogen, and water. The insulator 101 can be formed using, for example, silicon nitride or silicon nitride oxide. The use of such a material enables the insulator 101 to function as an insulating film having an effect of blocking diffusion of hydrogen and water.

At least part of the conductor 102 preferably overlaps with the semiconductor 106b in a region where the semiconductor 106b is positioned between the conductor 108a and the conductor 108b. The conductor 102 functions as a back gate of the transistor 12. The conductor 102 can control the threshold voltage of the transistor 12. Control of the threshold voltage can prevent the transistor 12 from being turned on when voltage applied to the gate (conductor 114) of the transistor 12 is low, e.g., 0 V or lower. Thus, the electrical characteristics of the transistor 12 can be easily made normally-off characteristics. The conductor 114 can be formed using the conductor that can be used as the conductor 102.

The length in the channel length direction of the conductor 102 is preferably made longer than that in the channel length direction of the semiconductor 106b so that the conductor 102 covers the bottom surface of the semiconductor 106b. The conductor 102 provided in such a manner can block an electric field generated in the memory cell below the conductor 102, preventing the electric field from influencing the semiconductor 106b.

The insulator 107 can be formed with the insulator that can be used as the insulator 104. It is preferable that top surfaces of the insulator 107 and the conductor 102 be subjected to planarization treatment such as a CMP method in order to improve its planarity. In that case, the planarity of the surface over which the semiconductor 106b is formed is not lowered by the conductor 102 serving as the back gate; thus, carrier mobility can be improved and the transistor 12 can have an increased on-state current. Moreover, since there is no surface unevenness of the insulator 104 caused by the shape of the conductor 102, a leakage current generated between the conductor 108a or 108b serving as a drain and the conductor 102 through an uneven portion of the insulator 104 can be reduced. Thus, the off-state current of the transistor 12 can be reduced.

The insulator 105 can be formed using the insulator that can be used as the insulator 104.

The insulator 103 preferably has a function of blocking oxygen. Providing the insulator 103 can prevent extraction of oxygen from the insulator 104 by the conductor 102. Accordingly, oxygen can be effectively supplied from the insulator 104 to the insulator 106a, the semiconductor 106b, and the insulator 106c. By improving the coverage with the insulator 103, extraction of oxygen from the insulator 104 can be further reduced and oxygen can be more effectively supplied from the insulator 104 to the insulator 106a, the semiconductor 106b, and the insulator 106c.

As the insulator 103, an oxide or a nitride containing boron, aluminum, silicon, scandium, titanium, gallium, yttrium, zirconium, indium, lanthanum, cerium, neodymium, hafnium, or thallium is used. It is preferable to use hafnium oxide or aluminum oxide.

Of the insulators 105, 103, and 104, the insulator 103 preferably includes an electron trap region. When the insulators 105 and 104 have a function of inhibiting release of electrons, the electrons trapped in the insulator 103 behave as if they are negative fixed charge. Thus, the insulator 103 has a function of a floating gate.

Note that the structure of the memory cell 10a is not limited to that illustrated in FIGS. 14A and 14B. For example, a structure in which the insulator 107, the insulator 105, and the insulator 104 are not provided and the insulator 104 protrudes so as to conform to the shape of the conductor 102 or a structure in which the insulator 101 is not provided may alternatively be employed.

Figure 14C:
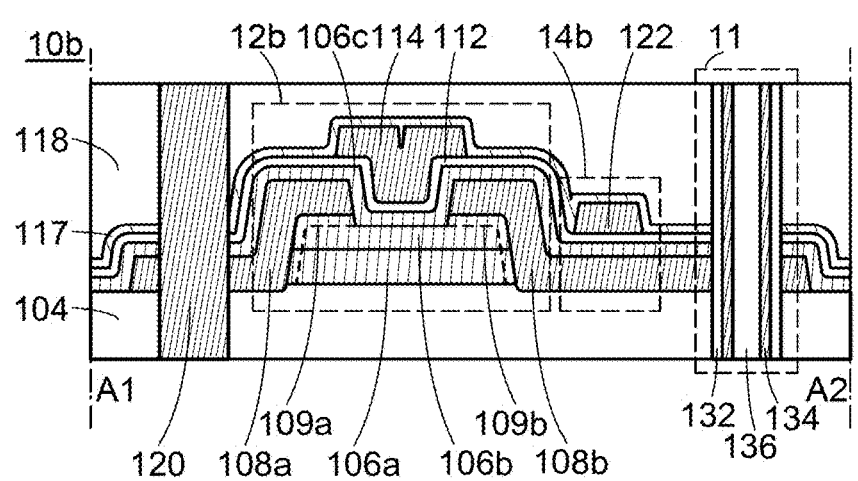
Figure 14D:
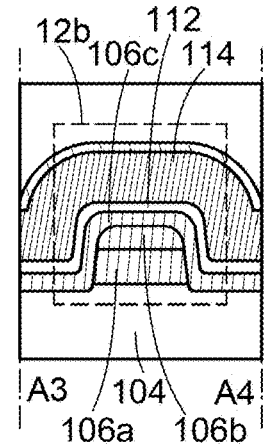

The memory cell 10b illustrated in FIGS. 14C and 14D is different from the memory cell 10 mainly in that the structure of the transistor 12b is different from that of the transistor 12. The transistor 12b is different from the transistor 12 in that the insulator 106c and the insulator 112 are formed so as to cover the semiconductor 106b, the conductor 108a, the conductor 108b, and the like, the insulator 117 is formed over the insulator 112, the conductor 114, and the like, and the insulator 118 is formed over the insulator 117.

A capacitor 14b is different from the capacitor 14 in that the insulator 112 and the insulator 106c are used as dielectrics.

The insulator 117 can be formed using the insulator that can be used as the insulator 116. Here, it is preferable that the insulator 117 be formed by a sputtering method and it is more preferable that the insulator 117 be formed by a sputtering method in an atmosphere containing oxygen. When the insulator 117 is formed by a sputtering method, oxygen is added to the vicinity of a surface of the insulator 112 (after the formation of the insulator 117, the interface between the insulator 117 the insulator 112) at the same time as the formation.

It is preferable that the insulator 117 be less permeable to oxygen than the insulator 112 and have a function of blocking oxygen. Providing the insulator 117 can prevent oxygen from being externally released to above the insulator 112 at the time of supply of oxygen from the insulator 112 to the insulator 106a, the semiconductor 106b, and the insulator 106c. Aluminum oxide is preferably used for the insulator 117 because it is highly effective in preventing passage of both oxygen and impurities such as hydrogen and moisture.

Note that the structure of the memory cell 10b is not limited to that illustrated in FIGS. 14C and 14D. For example, the insulator 106 or the insulator 112 may be partly formed by patterning.

Figure 14E:
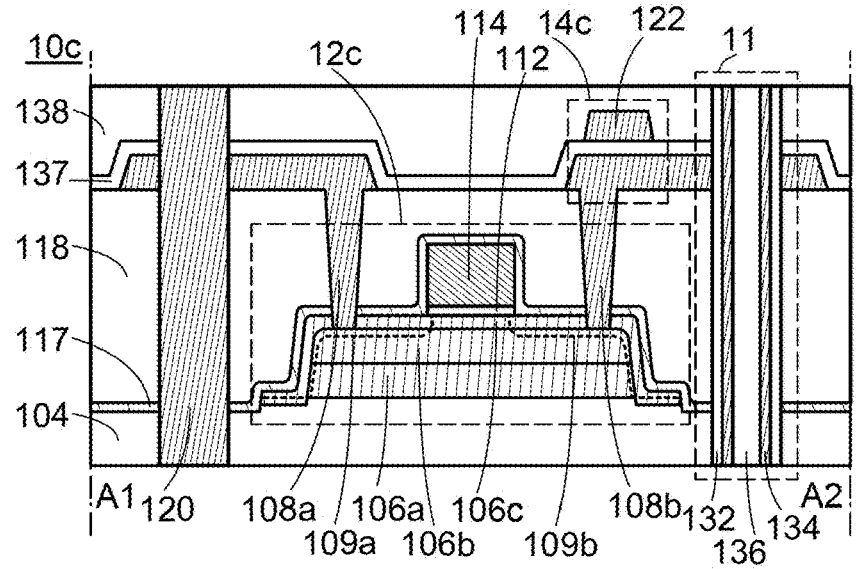
Figure 14F:
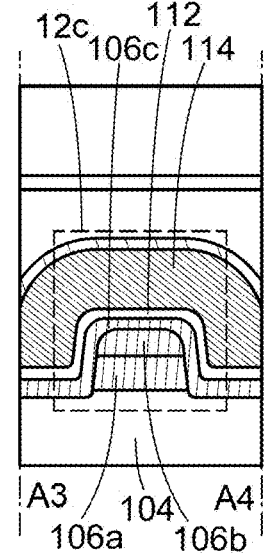

The memory cell 10c illustrated in FIGS. 14E and 14F is different from the memory cell 10 mainly in that the structure of the transistor 12c is different from that of the transistor 12. The transistor 12c is different from the transistor 12 in the following points: the conductor 108a and the conductor 108b are formed over the insulator 118 and are in contact with the semiconductor 106b through openings formed in the insulator 118; an insulator 137 is formed over the conductor 108a and the conductor 108b; the conductor 122 is formed over the insulator 137; an insulator 138 is formed over the insulator 137 and the conductor 122; the insulator 117 covers the insulator 106c and the like; and side surfaces of end portions of the conductor 114 and the insulator 112 are substantially aligned with each other. The above-described transistors such as the transistor 12 are formed by a gate-last method by which the low-resistance regions 109a and 109b serving as a source region and a drain region are formed before the conductor 114 serving as a gate is formed in the process for fabricating a transistor. In contrast, the transistor 12c is formed by a gate-first method by which the low-resistance regions 109a and 109b serving as a source region and a drain region are formed after the conductor 114 serving as a gate is formed in the process for fabricating a transistor.

The low-resistance regions 109a and 109b in the transistor 12c include at least one of elements included in the insulator 117. It is preferable that part of the low-resistance regions 109a and 109b be substantially in contact with a region of the semiconductor 106b overlapping with the conductor 114 (a channel formation region) or overlap with part of the region.

Since an element included in the insulator 117 is added to the low-resistance regions 109a and 109b, the concentration of the element, which is measured by SIMS, in the low-resistance regions 109a and 109b is higher than that in a region of the semiconductor 106b other than the low-resistance regions 109a and 109b (for example, a region of the semiconductor 106b overlapping with the conductor 114).

Preferable examples of the element that is added to the low-resistance regions 109a and 109b are boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. These elements relatively easily form oxides and the oxides can serve as a semiconductor or an insulator; therefore, these elements are suitable as an element that is added to the insulator 106a, the semiconductor 106b, or the insulator 106c. For example, the concentration of the element in the low-resistance regions 109a and 109b is preferably higher than or equal to $1\times10^{14}$/cm$^2$ and lower than or equal to $2\times10^{16}$/cm$^2$. The concentration of the element in the low-resistance regions 109a and 109b in the insulator 106c is higher than that in the region of the semiconductor 106c other than the low-resistance regions 109a and 109b (for example, the region of the semiconductor 106c overlapping with the conductor 114).

Since the low-resistance regions 109a and 109b can become n-type by containing nitrogen, the concentration of nitrogen, which is measured by SIMS, in the low-resistance regions 109a and 109b is higher than that in a region of the semiconductor 106b other than the low-resistance regions 109a and 109b (for example, the region of the semiconductor 106b overlapping with the conductor 114).

The formation of the low-resistance region 109a and the low-resistance region 109b leads to a reduction in contact resistance between the conductor 108a or 108b and the insulator 106a, the semiconductor 106b, or the insulator 106c, whereby the transistor 12c can have a large on-state current.

In the transistor 12c, the semiconductor 106b is surrounded by the insulator 106a and the insulator 106c. Accordingly, the end portion of the side surface of the semiconductor 106b, especially, the vicinity of the end portion of the side surface thereof in the channel width direction is in contact with the insulator 106a and the insulator 106c. As a result, in the vicinity of the end portion of the side surface of the semiconductor 106b, continuous junction is formed between the insulator 106a and the semiconductor 106b or between the insulator 106c and the semiconductor 106b and the density of defect states is reduced. Thus, even when on-state current easily follows owing to the low-resistance regions 109a and 109b, the end portion of the side surface of the semiconductor 106b in the channel width direction does not serve as a parasitic channel, which enables stable electrical characteristics.

A capacitor 14c is different from the capacitor 14 in that the insulator 137 is used as a dielectric. Note that the insulators 137 and 138 can be formed using the insulator that can be used as the insulator 118.

The structures, the methods, and the like described in this embodiment can be combined as appropriate with any of the structures, the methods, and the like described in the other embodiments.

Embodiment 3

In this embodiment, a method for manufacturing a semiconductor device of one embodiment of the present invention will be described with reference to FIGS. 15A to 15F to FIGS. 20A to 20D.

A method for manufacturing the three-dimensional memory cell array 40 will be described below, focusing on the cross section along A1-A2 and the cross section along A3-A4 of the memory cell 10 included in the three-dimensional memory cell array 40. Although only one memory cell 10 is illustrated in the drawing, the memory cells 10 (e.g., the memory cells 10 (1,1,1) to ($m_1$,1,$m_3$)) on the same plane can be formed at the same time.

First, a substrate over which the selection transistor array 50 is provided is prepared. Note that in the selection transistor array 50, the insulator 132, the semiconductor 134, the insulator 136, and the conductor 120 illustrated in FIG. 12A to 12D have not been formed yet. A known method can be used to fabricate the selection transistor array 50.

First, the insulator 104 is formed. Any of the above-described insulators can be used as the insulator 104.

The insulator 104 can be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD methods can be divided into a metal CVD (MCVD) method and a metal organic CVD (MOCVD) method according to a source gas.

In order to reduce water and hydrogen contained in the insulator 104, the insulator 104 is preferably formed while the substrate is heated.

The top surface or the bottom surface of the semiconductor 106b to be formed later preferably has excellent planarity. Thus, to improve the planarity, the top surface of the insulator 104 may be subjected to planarization treatment such as CMP treatment.

Next, heat treatment is preferably performed. The heat treatment can further reduce water or hydrogen in the insulator 104. In addition, the insulator 104 can contain excess oxygen in some cases. The heat treatment is performed at a temperature higher than or equal to 250° C. and lower than or equal to 650° C., preferably higher than or equal to 450° C. and lower than or equal to 600° C., more preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator 126a and the semiconductor 126b and can remove impurities such as hydrogen and water, for example. For the heat treatment, lamp heating can be performed with use of an RTA apparatus. Heat treatment with an RTA apparatus is effective for an improvement in productivity because it needs short time as compared with the case of using a furnace.

Note that heating is preferably performed at relatively low temperatures (for example, higher than or equal to 350° C. and lower than or equal to 445° C.) suitable for the structure of the selection transistor array 50 and the like, in some cases.

Then, an insulator to be the insulator 106a in a later step is formed. Any of the above-described insulators and semiconductors that can be used for the insulator 106a can be used for the insulator to be the insulator 106a. The insulator can be formed by a sputtering method, a CVD method, an MBE method, a PLD method, an ALD method, or the like.

Next, a semiconductor to be the semiconductor 106b in a later step is formed. Any of the above-described semiconductors that can be used as the semiconductor 106b can be used as the semiconductor. The semiconductor can be formed by a sputtering method, a CVD method, an MBE method, a PLD method, an ALD method, or the like. Note that when the insulator to be the insulator 106a and the semiconductor to be the semiconductor 106b are successively formed without exposure to the air, entry of impurities into the films and their interface can be reduced.

Next, heat treatment is preferably performed. The heat treatment can reduce the hydrogen concentration in the insulator 106a and the semiconductor 106b in some cases. Furthermore, the heat treatment can reduce oxygen vacancies in the insulator 106a and the semiconductor 106b in some cases. The heat treatment can be performed at a temperature higher than or equal to 250° C. and lower than or equal to 650° C., preferably higher than or equal to 450° C. and lower than or equal to 600° C., more preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator 106a and the semiconductor 106b and can remove impurities such as hydrogen and water, for example. For the heat treatment, lamp heating can be performed with use of an RTA apparatus. Heat treatment with an RTA apparatus is effective for an improvement in productivity because it needs short time as compared with the case of using a furnace. By heat treatment, the peak intensity is increased and a full width at half maximum is decreased when a CAAC-OS is used for the insulator 106a and the semiconductor 106b. In other words, the crystallinity of a CAAC-OS is increased by heat treatment.

Note that heating is preferably performed at relatively low temperatures (for example, higher than or equal to 350° C. and lower than or equal to 445° C.) suitable for the structure of the selection transistor array 50 and the like, in some cases.

By the heat treatment, oxygen can be supplied from the insulator 104 to the insulator to be the insulator 106a and the semiconductor to be the semiconductor 106b. Oxygen is supplied to the insulator to be the insulator 106a and the semiconductor to be the semiconductor 106b to reduce oxygen vacancies in this manner, whereby a highly purified intrinsic or substantially highly purified intrinsic oxide semiconductor with a low density of defect states can be obtained.

Furthermore, high-density plasma treatment or the like may be performed. High-density plasma may be generated using microwaves. For the high-density plasma treatment, an oxidizing gas such as oxygen or nitrous oxide may be used, for example. Alternatively, a mixed gas of an oxidizing gas and a rare gas such as He, Ar, Kr, or Xe may be used. In the high-density plasma treatment, a bias may be applied to the substrate. Thus, oxygen ions and the like in the plasma can be extracted to the substrate side. The high-density plasma treatment may be performed while the substrate is heated. In the case where the high-density plasma treatment is performed instead of the heat treatment, for example, an effect similar to that of the heat treatment can be obtained at lower temperatures. The high-density plasma treatment may be performed before the formation of the insulator to be the insulator 106a, before the formation of the insulator 116, or before the formation of the insulator 106c.

Figure 15A:
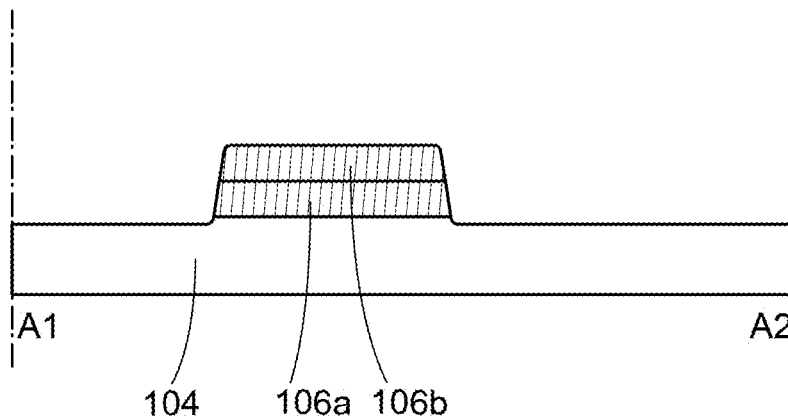
FIGS. 15A to 15F are cross-sectional views illustrating a method for manufacturing a semiconductor device of one embodiment of the present invention.
Figure 15B:
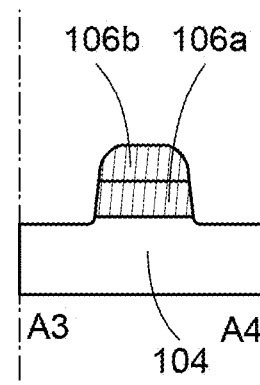

Next, a resist or the like is formed over the insulator to be the insulator 106a and the semiconductor to be the semiconductor 106b and processing is performed using the resist or the like, whereby the insulator 106a and the semiconductor 106b are formed (see FIGS. 15A and 15B). Note that the case where the resist is simply formed also includes the case where an anti-reflective layer is formed below the resist.

The resist is removed after the object is processed by etching or the like. For the removal of the resist, plasma treatment and/or wet etching are/is used. Note that as the plasma treatment, plasma ashing is preferable. In the case where the removal of the resist and the like is not enough, the remaining resist and the like may be removed using ozone water and/or hydrofluoric acid at a concentration higher than or equal to 0.001 volume % and lower than or equal to 1 volume %, and the like.

Next, heat treatment is preferably performed. The heat treatment can further reduce water or hydrogen in the insulator 104. The heat treatment can be performed at a temperature higher than or equal to 250° C. and lower than or equal to 650° C., preferably higher than or equal to 450° C. and lower than or equal to 600° C., more preferably higher than or equal to 520° C. and lower than or equal to 570° C. The heat treatment is preferably performed in an inert gas atmosphere. The heat treatment may be performed in an atmosphere containing an oxidizing gas. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. For the heat treatment, lamp heating can be performed with use of an RTA apparatus. Heat treatment with an RTA apparatus is effective for an improvement in productivity because it needs short time as compared with the case of using a furnace.

Note that heating is preferably performed at relatively low temperatures (for example, higher than or equal to 350° C. and lower than or equal to 445° C.) suitable for the structure of the selection transistor array 50 and the like, in some cases.

Figure 15C:
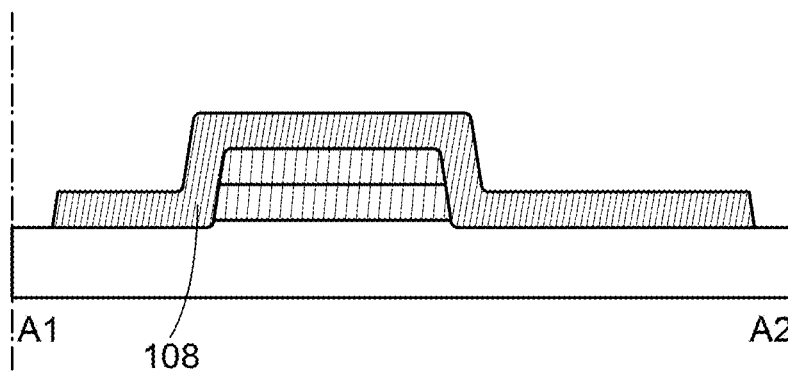
Figure 15D:
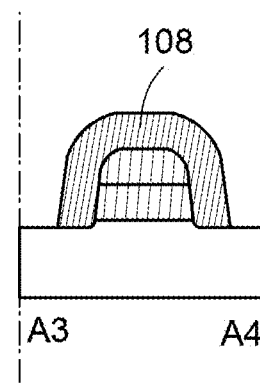

Next, a resist or the like is formed over the conductor and processing is performed using the resist, whereby the conductor 108 is formed (see FIGS. 15C and 15D). As the conductor 108, the above-described conductor that can be used for the conductor 108a and the conductor 108b can be used. The conductor can be formed by the sputtering method, the CVD method, the MBE method, the PLD method, the ALD method, or the like.

Then, the insulator 116 is formed. Any of the above-described insulators can be used as the insulator 116. The insulator 116 can be formed by a sputtering method, a CVD method, an MBE method, a PLD method, an ALD method, or the like.

The insulator 116 is preferably formed by utilizing plasma, more preferably a sputtering method, still more preferably a sputtering method in an atmosphere containing oxygen.

As the sputtering method, a direct current (DC) sputtering method in which a direct-current power source is used as a sputtering power source, a DC sputtering method in which a pulsed bias is applied (i.e., a pulsed DC sputtering method), or a radio frequency (RF) sputtering method in which a high frequency power source is used as a sputtering power source may be used. Alternatively, a magnetron sputtering method using a magnet mechanism inside a chamber, a bias sputtering method in which voltage is also applied to a substrate during deposition, a reactive sputtering method that is performed in a reactive gas atmosphere, or the like may be used. Still alternatively, the above-described PESP or VDSP method may be used. The oxygen gas flow rate or deposition power for sputtering can be set as appropriate in accordance with the amount of oxygen to be added.

When the insulator 116 is formed by a sputtering method, oxygen is added to the vicinity of a surface of the insulator 104 (after the formation of the insulator 116, an interface between the insulator 116 and the insulator 104) at the same time as the formation. Although the oxygen is added to the insulator 104 as an oxygen radical here, for example, the state of the oxygen at the time of being added is not limited thereto. The oxygen may be added to the insulator 104 as an oxygen atom, an oxygen ion, or the like. Note that by addition of oxygen, oxygen in excess of that in the stoichiometric composition is contained in the insulator 104 in some cases, and the oxygen in such a case can be called excess oxygen.

Figure 15E:
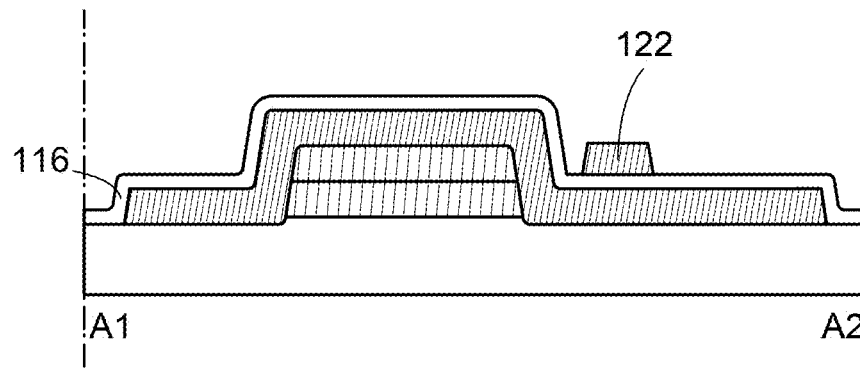
Figure 15F:
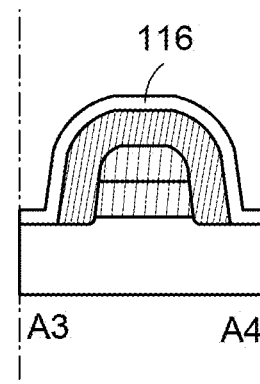

Next, a conductor is formed, a resist or the like is formed over the conductor, and processing is performed using the resist or the like, whereby the conductor 122 is formed (see FIGS. 15E and 15F). As the conductor to be the conductor 122, the above-described conductor that can be used for the conductor 122 can be used. The conductor to be the conductor 122 can be formed by a sputtering method, a CVD method, an MBE method, a PLD method, an ALD method, or the like.

Next, a resist or the like is formed over the conductor 128 and processing is performed using the resist or the like, whereby the conductors 108a and 108b are formed.

Next, an insulator to be the insulator 118 is formed. Any of the above-described insulators can be used as the insulator 118. The insulator to be the insulator 118 can be formed by a sputtering method, a CVD method, an MBE method, a PLD method, an ALD method, or the like.

Figure 16A:
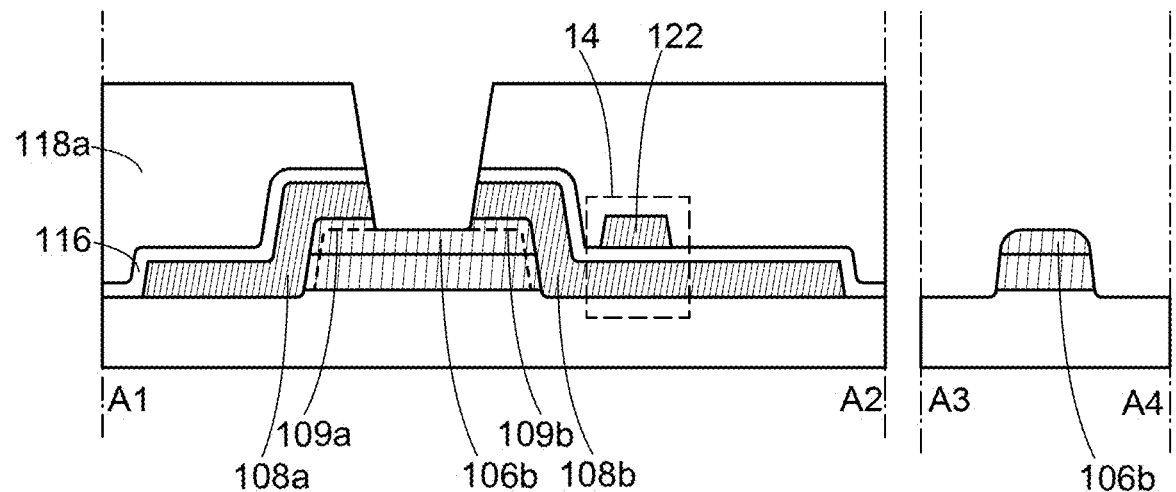
FIGS. 16A to 16F are cross-sectional views illustrating a method for manufacturing a semiconductor device of one embodiment of the present invention.
Figure 16B:
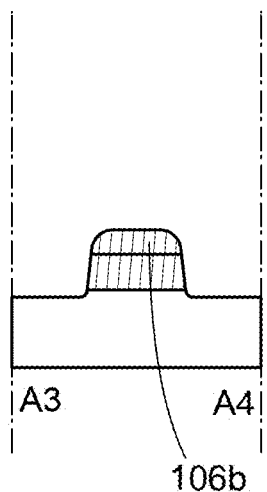

Next, a resist or the like is formed over the insulator to be the insulator 118 and processing is performed using the resist or the like, so that the insulator 118a, the conductor 108a, and the conductor 108b are formed (see FIGS. 16A and 16B).

Here, regions of the semiconductor 106b that are in contact with the conductor 108a and the conductor 108b include the low-resistance region 109a and the low-resistance region 109b in some cases. The semiconductor 106b might have a smaller thickness in a region between the conductor 108a and the conductor 108b than in regions overlapping with the conductor 108a and the conductor 108b. The thin region is formed because part of the top surface of the semiconductor 106b is removed during formation of the conductor 108a and the conductor 108b.

Here, the capacitor 14 including the conductor 108b, the insulator 116, and the conductor 122 is formed.

Then, an insulator 106d to be the insulator 106c in a later step is formed. Any of the above-described insulators and semiconductors that can be used for the insulator 106c can be used for the insulator 106d. The insulator 106d can be formed by a sputtering method, a CVD method, an MBE method, a PLD method, an ALD method, or the like. Before the formation of the insulator 106d, surfaces of the semiconductor 106b and the like may be etched. Rare-gas-containing plasma, for example, can be used for the etching. After the etching, the insulator 106d is formed without being exposed to the air, which can prevent impurities from entering an interface between the insulator 106c and the semiconductor 106b. In some cases, impurities at an interface between films are diffused more easily than impurities in a film. Thus, reduction of the entry of impurities can stabilize the electrical characteristics of the transistor.

Next, an insulator 112a to be the insulator 112 in a later step is formed. Any of the above-described insulators that can be used as the insulator 112 can be used as the insulator 112a. The insulator 112a can be formed by a sputtering method, a CVD method, an MBE method, a PLD method, an ALD method, or the like. Note that successive formation of the insulator 106d and the insulator 112a without exposure to the air can reduce entry of impurities into the films and their interface.

Figure 16C:
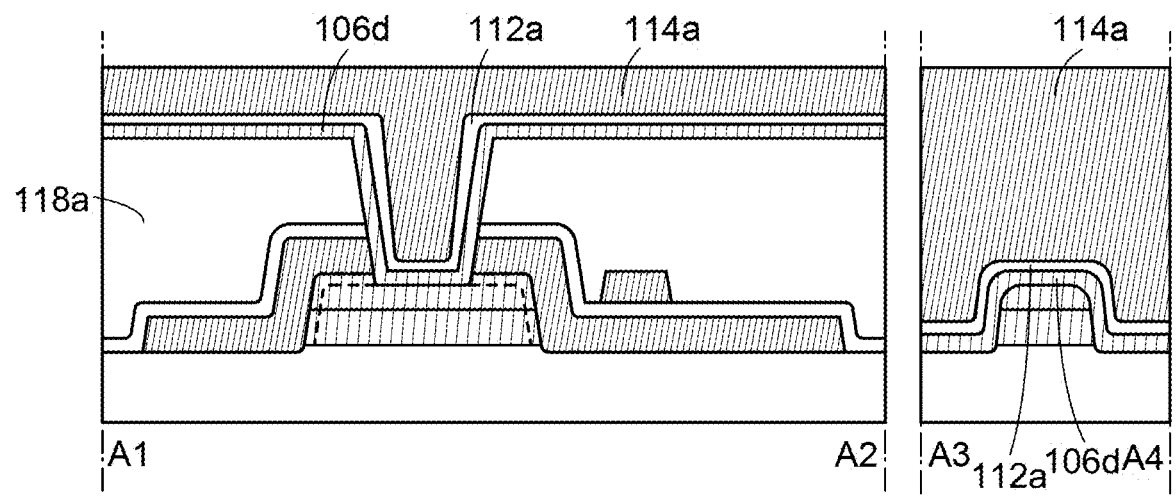
Figure 16D:
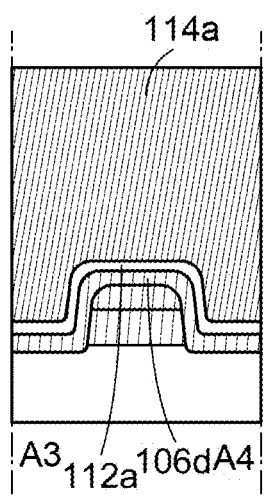

Then, a conductor 114a to be the conductor 114 in a later step is formed (see FIGS. 16C and 16D). Any of the above-described conductors that can be used as the conductor 114 can be used as the conductor 114a. The conductor 114a can be formed by a sputtering method, a CVD method, an MBE method, a PLD method, an ALD method, or the like. Note that successive formation of the insulator 112a and the conductor 114a without exposure to the air can reduce entry of impurities into the films and their interface.

Figure 16E:
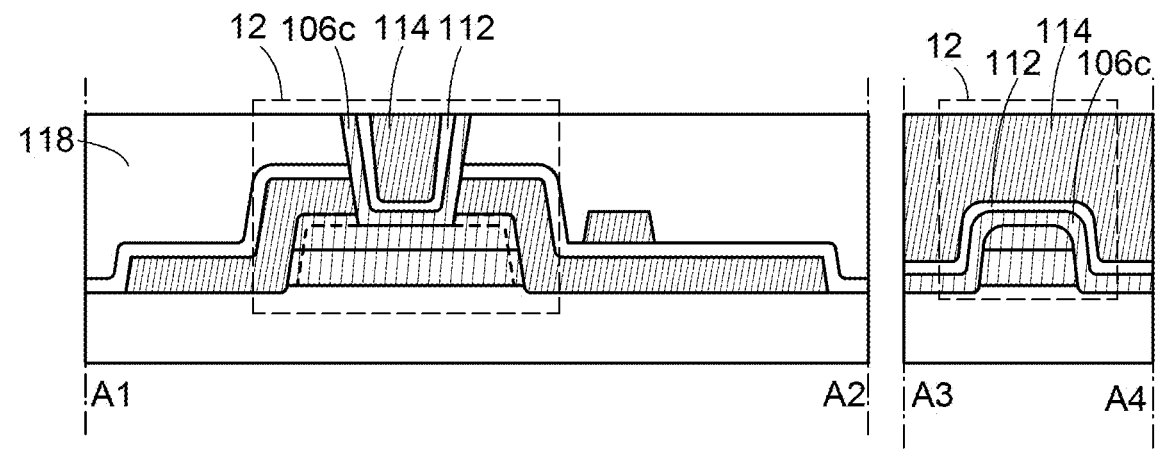
Figure 16F:
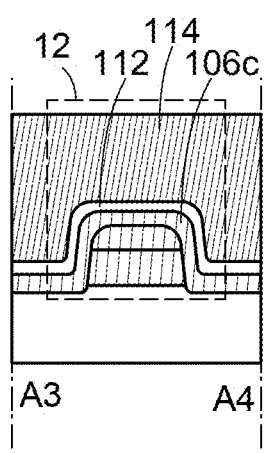

Next, the conductor 114a is polished until the insulator 118a is exposed, so that the conductor 114, the insulator 112, the insulator 106c, and the insulator 118 are formed (see FIGS. 16E and 16F). The conductor 114 serves as a gate electrode of the transistor 12 and the insulator 112 serves as a gate insulator of the transistor 12. As described above, the conductor 114 and the insulator 112 can be formed in a self-aligned manner.

Note that an insulator similar to the insulator 116 may be formed over the insulator 118, the insulator 106c, the insulator 112, and the conductor 114, and oxygen may be added to the insulator 118.

Next, heat treatment is preferably performed. By the heat treatment, oxygen added to the insulator 104 (or the insulator 118) can be diffused to be supplied to the insulator 106a, the semiconductor 106b, and the insulator 106c. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

This heat treatment is preferably performed at a temperature lower than that of the heat treatment performed after formation of the semiconductor 126b. A temperature difference between the heat treatment and the heat treatment performed after formation of the semiconductor 126b is set to higher than or equal to 20° C. and lower than or equal to 150° C., preferably higher than or equal to 40° C. and lower than or equal to 100° C. Accordingly, superfluous release of excess oxygen (oxygen) from the insulator 104 and the like can be inhibited. Note that in the case where heating at the time of formation of the layers (e.g., heating at the time of formation of the insulator 118) doubles as the heat treatment after formation of the insulator 118, the heat treatment after formation of the insulator 118 is not necessarily performed.

By the heat treatment, oxygen added to the insulator 104 (or the insulator 118) is diffused into the insulator 104 or the insulator 112. The insulator 116 is less permeable to oxygen than the insulator 104 and functions as a barrier film that blocks oxygen. Since the insulator 116 is formed over the insulator 104, oxygen diffuses in the insulator 104 not in the upward direction but mainly in the horizontal direction or the downward direction.

The oxygen diffused into the insulator 104 is supplied to the insulator 106a, the insulator 106c, and the semiconductor 106b. The insulator having a function of blocking oxygen is provided below the insulator 104, thereby preventing the oxygen diffused into the insulator 104 from being diffused below the insulator 104. Note that in the case where an insulator similar to the insulator 116 is formed over the insulator 118, oxygen in the insulator 118 is also supplied to the insulator 106a, the insulator 106c, and the semiconductor 106b.

Thus, the oxygen can be effectively supplied to the insulator 106a, the insulator 106c, and the semiconductor 106b, especially to a channel formation region in the semiconductor 106b. Oxygen is supplied to the insulator 106a, the insulator 106c, and the semiconductor 106b to reduce oxygen vacancies in this manner, whereby a highly purified intrinsic or substantially highly purified intrinsic oxide semiconductor with a low density of defect states can be obtained.

In such a manner, the transistor 12 and the capacitor 14 in the memory cell 10 can be fabricated. The above steps are repeatedly performed, whereby the memory cells 10 each including the transistor 12 and the capacitor 14 can be stacked. After the memory cells 10 each including the transistor 12 and the capacitor 14 are stacked, the conductor 120 and the transistor 11 in the three-dimensional memory cell array 40 are formed at a time.

Methods for forming the conductor 120 and the transistor 11 will be described with reference to FIGS. 17A to 17D to FIGS. 20A to 20D. In the following description, attention is given to a cross-sectional view along D1-D2 illustrating the stacked two memory cells 10, a cross-sectional view along D3-D4 corresponding to the vicinity of the conductor 120 in FIGS. 12C and 12D, and a cross-sectional view along D5-D6 corresponding to the vicinity of the transistor 11 in FIGS. 12A and 12B.

First, the method for forming the conductor 120 will be described with reference to FIGS. 17A to 17D.

Figure 17A:
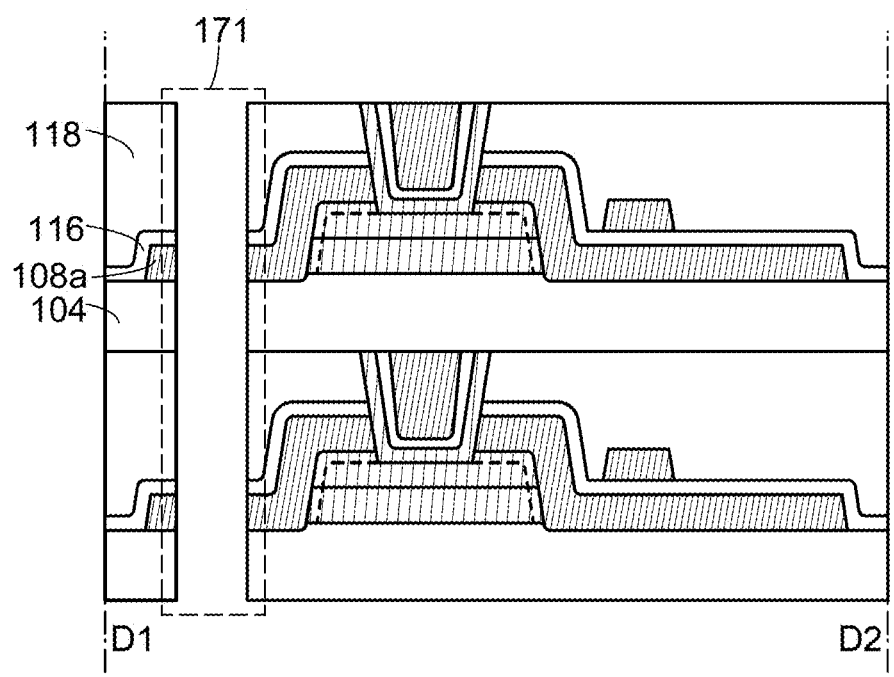
FIGS. 17A to 17D are cross-sectional views illustrating a method for manufacturing a semiconductor device of one embodiment of the present invention.
Figure 17B:
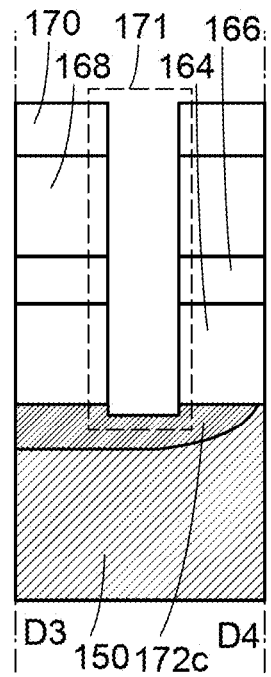

Firstly, a resist or the like is formed over the memory cell 10 at the highest stage, and an opening 171 that reaches the region 172c in the selection transistor cell 60 from the memory cell 10 at the highest stage is formed using the resist or the like (see FIGS. 17A and 17B). The opening 171 is formed at least in the insulator 104, the conductor 108a, the insulator 116, and the insulator 118 in the three-dimensional memory cell array 40, and is formed at least in a region 172a of the semiconductor substrate 150, the insulator 164, the insulator 166, the insulator 168, and the insulator 170 in the selection transistor array 50.

The opening 171 is formed so as to extend substantially perpendicularly to the top surface of the substrate; thus, the aspect ratio of the opening 171 is very high. For this reason, anisotropic etching, in which the etching rate in the direction substantially perpendicular to the top surface of the substrate is high, is preferably employed. For example, dry etching is preferably employed. Note that in forming the opening 171, the region 172c of the semiconductor substrate 150 is sometimes partly overetched, so that a depression is formed on a surface of the semiconductor substrate 150.

Figure 17C:
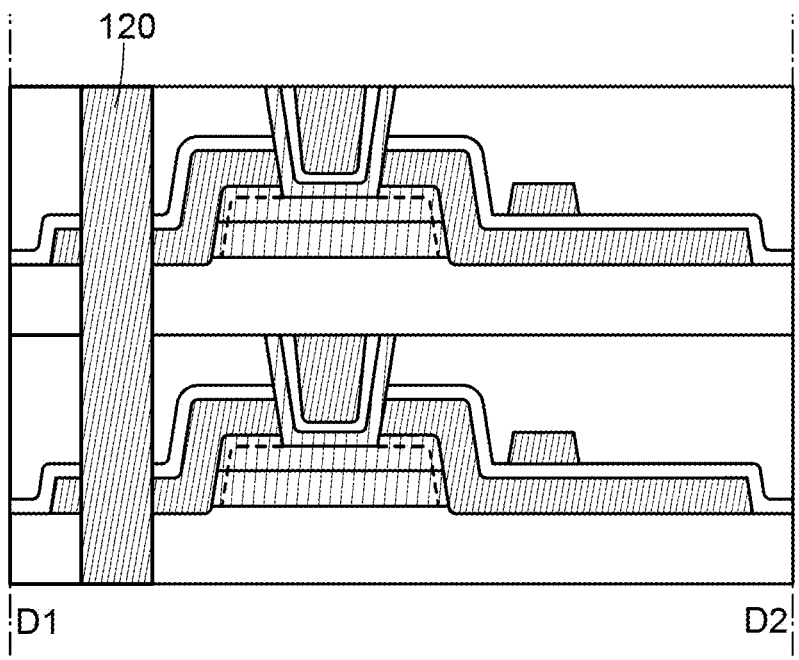
Figure 17D:
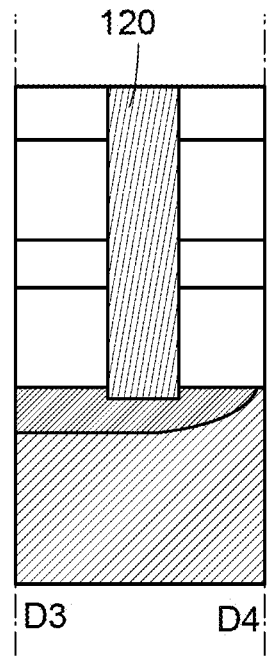

Next, the conductor 120 is formed in the opening 171 (see FIGS. 17C and 17D). Any of the above-described conductors that can be used as the conductor 120 is used as the conductor 120. As described above, the aspect ratio of the opening 171 is very high; thus, the conductor 120 is preferably formed by a ALD method, a CVD method, or the like. In the case where a CVD method is employed, a MOCVD method or a MCVD method is preferably employed.

Note that in the memory cell 10 at the highest stage, the top surface of the conductor 120 is preferably covered with an insulator or the like so as not to be exposed.

Next, the method for forming the transistor 11 will be described with reference to FIGS. 18A to 18D to FIGS. 20A to 20D.

Figure 18A:
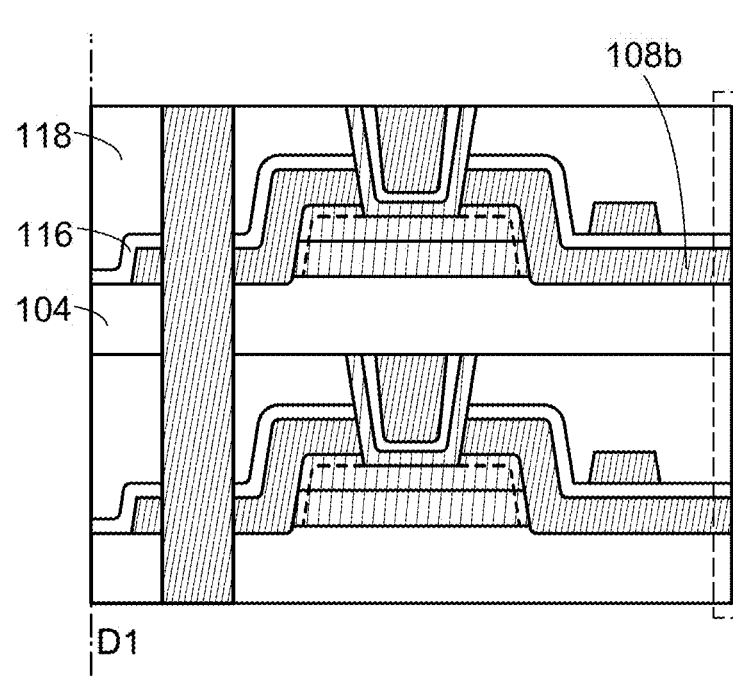
FIGS. 18A to 18D are cross-sectional views illustrating a manufacturing method of a semiconductor device of one embodiment of the present invention.
Figure 18B:
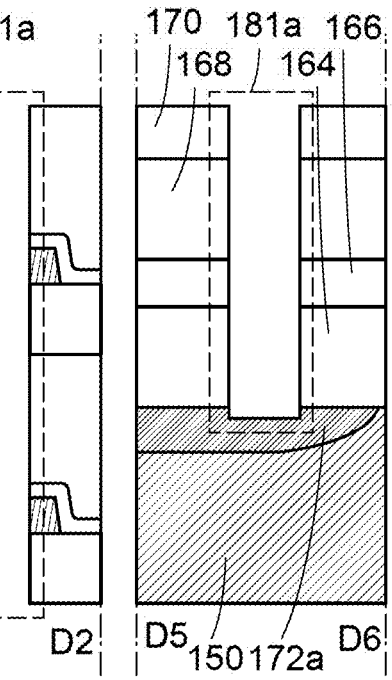

Firstly, a resist or the like is formed over the memory cell 10 at the highest stage, and an opening 181a that reaches the region 172a in the selection transistor cell 60 from the memory cell 10 at the highest stage is formed using the resist or the like (see FIGS. 18A and 18B). Like the opening 171, an opening 181a is formed at least in the insulator 104, the conductor 108a, the insulator 116, and the insulator 118 in the three-dimensional memory cell array 40, and is formed at least in a region 172a of the semiconductor substrate 150, the insulator 164, the insulator 166, the insulator 168, and the insulator 170 in the selection transistor array 50.

The opening 181a is formed so as to extend substantially perpendicularly to the top surface of the substrate; thus, the aspect ratio of the opening 181a is very high. For this reason, anisotropic etching, in which the etching rate in the direction substantially perpendicular to the top surface of the substrate is high, is preferably employed to form the opening 181a as in the case of formation of the opening 171. For example, dry etching can be employed. Note that in forming the opening 181a, the region 172a of the semiconductor substrate 150 is sometimes partly overetched, so that a depression is formed on a surface of the semiconductor substrate 150.

Figure 18C:
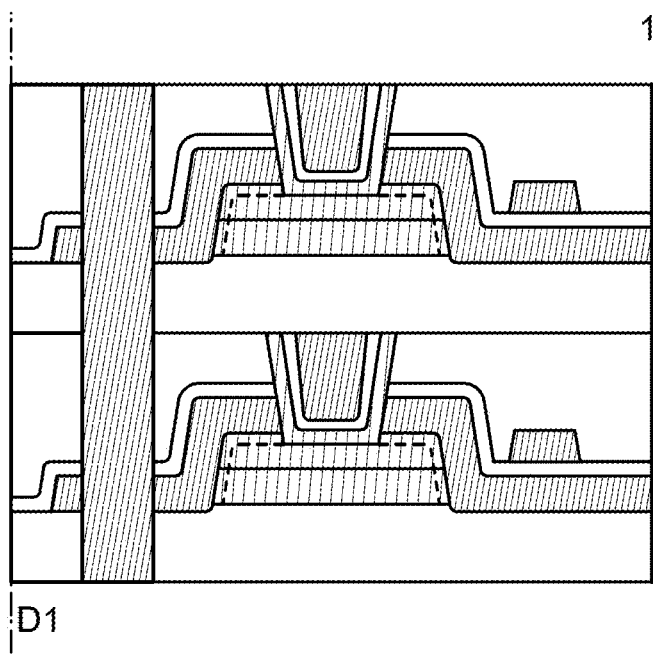
Figure 18D:
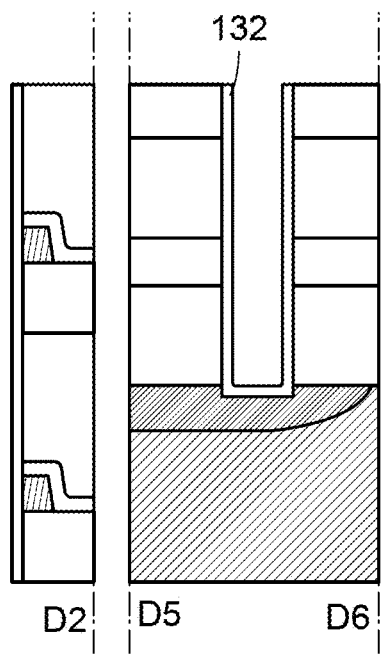

Then, the insulator 132 is formed in contact with the interior wall of the opening 181a (see FIGS. 18C and 18D). Any of the above-described insulators that can be used as the insulator 132 can be used as the insulator 132. As described above, the aspect ratio of the opening 181a is very high; thus, the insulator 132 is preferably formed by a ALD method, a CVD method, or the like. The insulator 132 functions as a gate insulating film of the transistor 11 and thus preferably has high uniformity in thickness. An ALD method is preferred in terms of high thickness controllability.

Figure 19A:
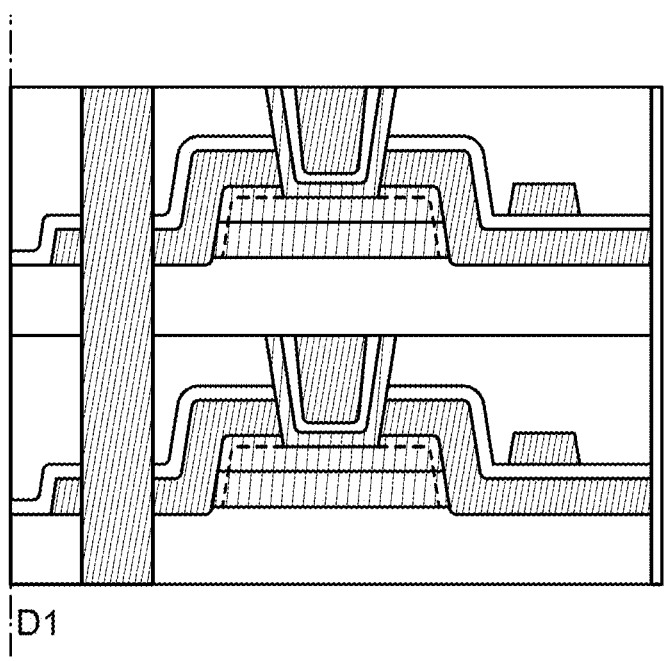
FIGS. 19A to 19D are cross-sectional views illustrating a method for manufacturing a semiconductor device of one embodiment of the present invention.
Figure 19B:
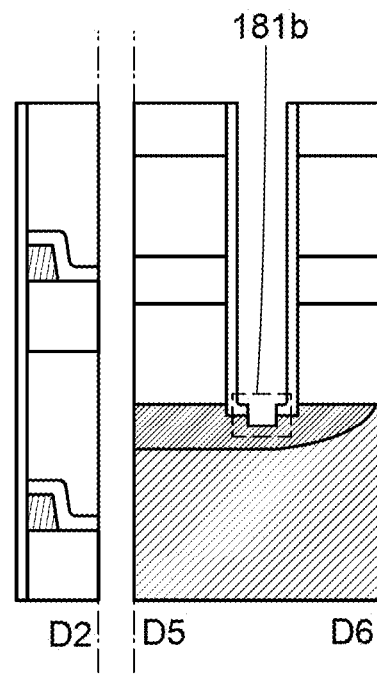

Then, the opening 181b that reaches the region 172a is formed at the bottom of the insulator 132 (see FIGS. 19A and 19B). The opening 181b needs to be formed at least in part of the bottom surface of the insulator 132; thus, the diameter of the opening 181b is smaller than that of the opening 181a in many cases.

In forming the opening 181b, at least part of the bottom surface of the insulator 132 needs to be removed without removing the insulator 132 formed on the interior wall of the opening 181a. For this reason, anisotropic etching, in which the etching rate in the direction substantially perpendicular to the top surface of the substrate is high, is preferably employed to form the opening 181b as in the case of formation of the opening 181a. For example, dry etching can be employed. Note that in forming the opening 181b, the region 172a of the semiconductor substrate 150 is sometimes partly overetched, so that a depression is formed on a surface of the semiconductor substrate 150.

Figure 19C:
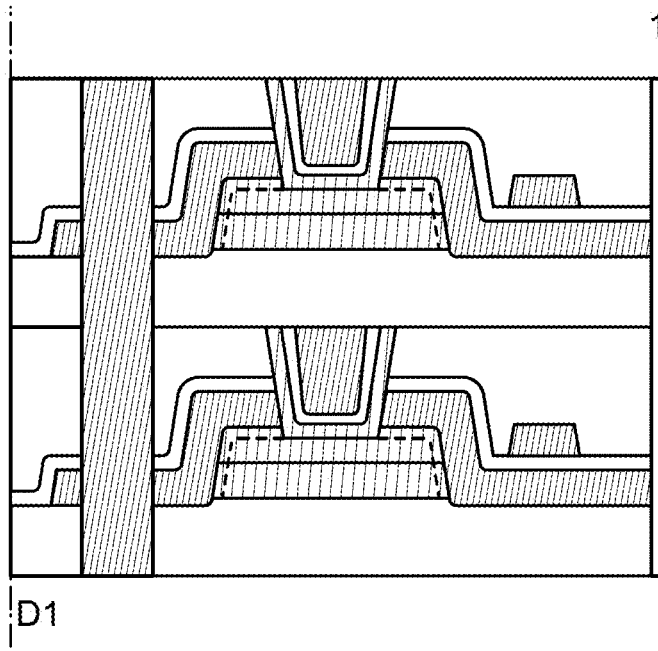
Figure 19D:
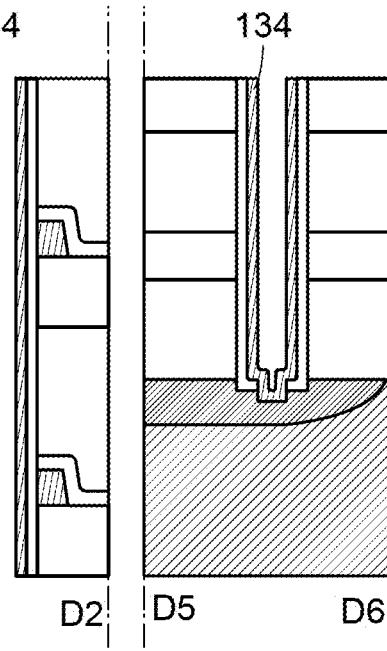

Then, the semiconductor 134 is formed so as to be located inward from the insulator 132 (FIGS. 19C and 19D). Any of the above-described semiconductors that can be used as the semiconductor 134 is used as the semiconductor 134. Here, the semiconductor 134 is provided in contact with the region 172a.

As described above, the aspect ratio of the opening 181a is very high; thus, the semiconductor 134 is preferably formed by a ALD method, a CVD method, an epitaxial growth method, or the like. Such a method allows, for example, single crystal silicon or polycrystalline silicon to be deposited as the semiconductor 134. Alternatively, amorphous silicon is deposited and then crystallized by heat treatment or the like to form the semiconductor 134 of polycrystalline silicon.

In the case where polycrystalline silicon is used as the semiconductor 134, the thickness of the semiconductor 134 is preferably thin, for example, smaller than or equal to 20 nm, more preferably smaller than or equal to 10 nm. When the semiconductor 134 has a thickness of smaller than or equal to 20 nm, variations in characteristics of the transistor 11 can be reduced.

Note that the semiconductor 134 may be formed so as to include an impurity imparting p-type conductivity and an impurity imparting n-type conductivity.

Figure 20A:
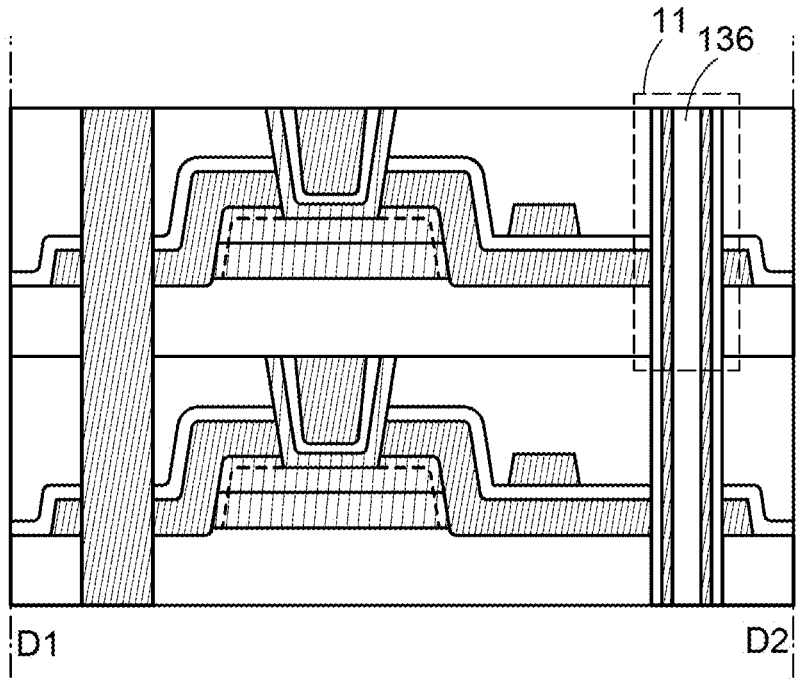
FIGS. 20A to 20D are cross-sectional views illustrating a manufacturing method of a semiconductor device of one embodiment of the present invention.
Figure 20B:
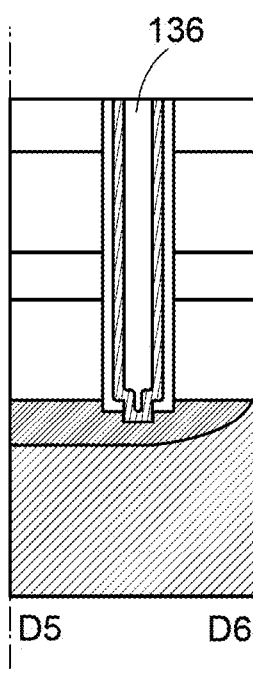

Then, the insulator 136 is formed so as to be located inward from the semiconductor 134 (see FIGS. 20A and 20B). Any of the above-described insulators that can be used for the insulator 136 can be used as the insulator 136. The insulator 136 is preferably formed by an ALD method, a CVD method, or the like.

In the case where polycrystalline silicon or the like is used as the semiconductor 134, hydrogen may be made to be contained in the insulator 136 and heat treatment or the like may be performed so that the hydrogen terminates a dangling bond in the semiconductor 134. In that case, the use of an insulator that has an effect of blocking hydrogen, water, and the like as the insulator 132 can prevent outward diffusion of hydrogen in heat treatment, so that a dangling bond in the semiconductor 134 can be terminated effectively.

Figure 20C:
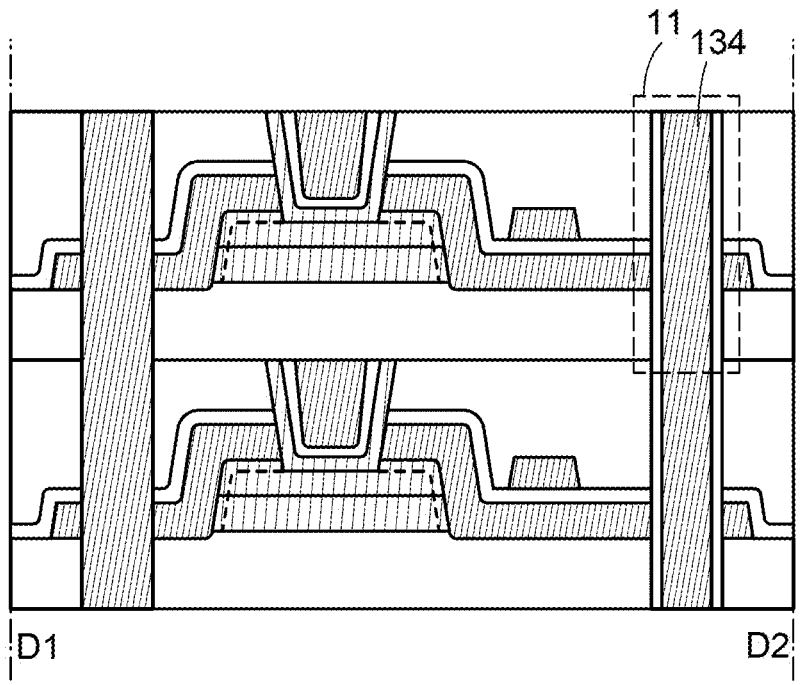
Figure 20D:
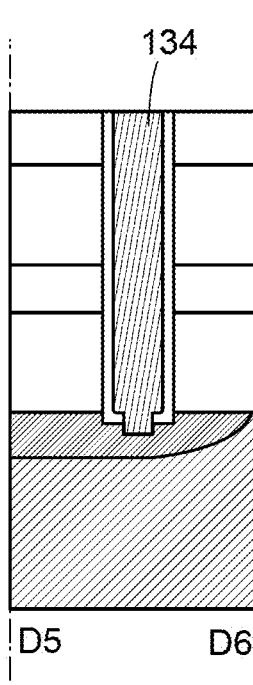

After the step illustrated in FIGS. 19A and 19B, the semiconductor 134 having a cylindrical shape may be formed so as to be embedded in a space surrounded by the insulator 132 (see FIGS. 20C and 20D).

Note that it is preferred that in the memory cell 10 at the highest stage, a conductor be formed in contact with the top surface of the semiconductor 134 so as to be electrically connected to a low power supply potential line.

Through the above process, the upright transistor 11 including the conductor 108b, the insulator 132, the semiconductor 134, and the insulator 136 can be fabricated. The above method enables the plurality of transistors 11 included in the three-dimensional memory cell array 40 to be fabricated at a time. Thus, the transistors 11 can be fabricated through a very simple process, resulting in a reduction in processing time and an increase in productivity.

Through the above steps, the semiconductor device of one embodiment of the present invention can be manufactured.

The above manufacturing method allows fabrication of a semiconductor device with a large storage capacity per unit area or a semiconductor device with a novel structure in which memory cells are stacked.

The structures, the methods, and the like described in this embodiment can be combined as appropriate with any of the structures, the methods, and the like described in the other embodiments.

Embodiment 4

In this embodiment, an oxide semiconductor included in a semiconductor device of one embodiment of the present invention will be described below in detail.

<Structure of Oxide Semiconductor>

The structure of an oxide semiconductor will be described below.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is an oxide semiconductor having a plurality of c-axis aligned crystal parts (also referred to as pellets).

Figure 21A:
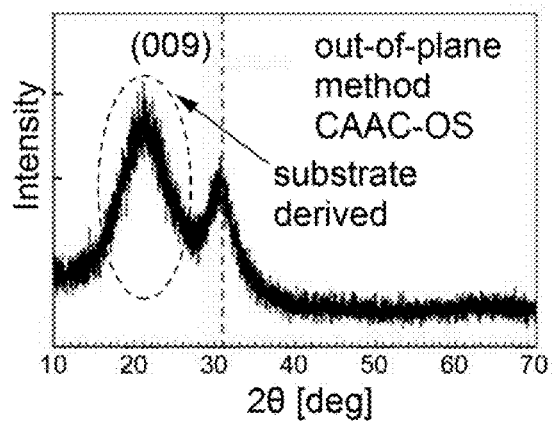
FIGS. 21A to 21E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an $InGaZnO_4$ crystal that is classified as the space group R-3m is analyzed by an out-of-plane method, a peak appears at a diffraction angle (2θ) of around 31° as shown in FIG. 21A. This peak is derived from the (009) plane of the $InGaZnO_4$ crystal, which indicates that crystals in the CAAC-OS have c-axis alignment, and that the c-axes are aligned in the direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 21B:
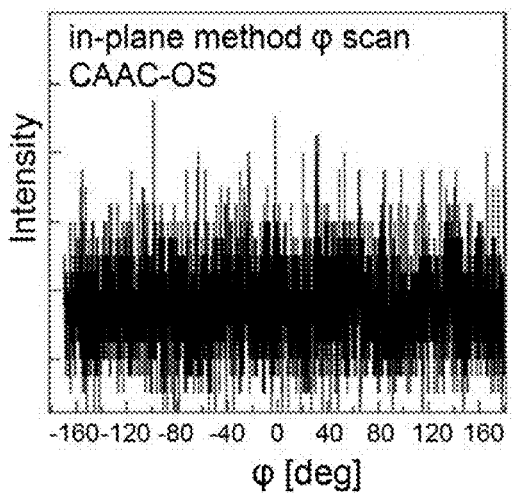
Figure 21C:
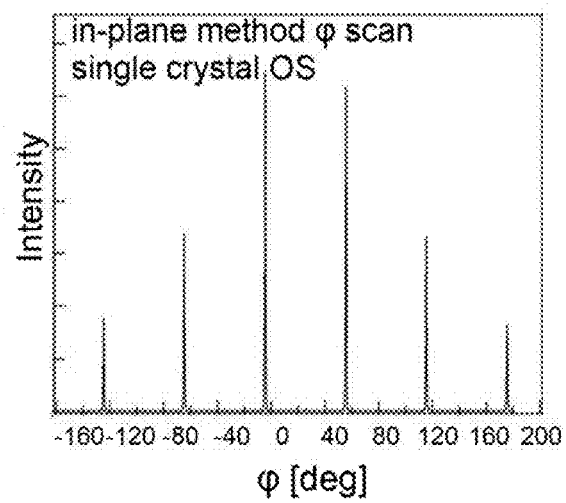

On the other hand, in structural analysis of the CAAC-OS by an in-plane method in which an X-ray is incident on the CAAC-OS in the direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), a peak is not clearly observed as shown in FIG. 21B. In contrast, in the case where single crystal $InGaZnO_4$ is subjected to φ scan with 2θ fixed at around 56°, six peaks which are derived from crystal planes equivalent to the (110) plane are observed as shown in FIG. 21C. Accordingly, the structural analysis using XRD shows that the directions of a-axes and b-axes are irregularly oriented in the CAAC-OS.

Figure 21D:
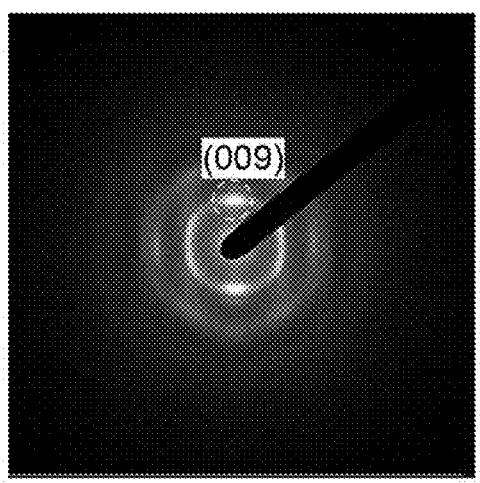
Figure 21E:
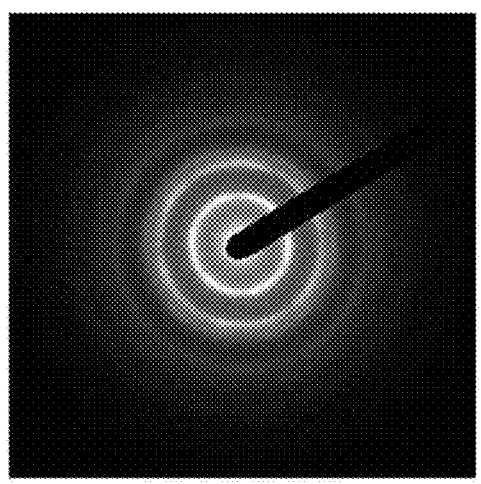

Next, a CAAC-OS analyzed by electron diffraction will be described. For example, when an electron beam with a probe diameter of 300 nm is incident on a CAAC-OS including an $InGaZnO_4$ crystal in the direction parallel to the formation surface of the CAAC-OS, such a diffraction pattern (also referred to as a selected-area transmission electron diffraction pattern) as is shown in FIG. 21D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 21E shows a diffraction pattern obtained in such a manner that an electron beam with a probe diameter of 300 nm is incident on the same sample in the direction perpendicular to the sample surface. As shown in FIG. 21E, a ring-like diffraction pattern is observed. Thus, the electron diffraction using an electron beam with a probe diameter of 300 nm also indicates that the a-axes and b-axes of the pellets included in the CAAC-OS do not have regular alignment. The first ring in FIG. 21E is considered to be derived from the (010) plane, the (100) plane, and the like of the InGaZnO$_4$ crystal. The second ring in FIG. 21E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 22A:
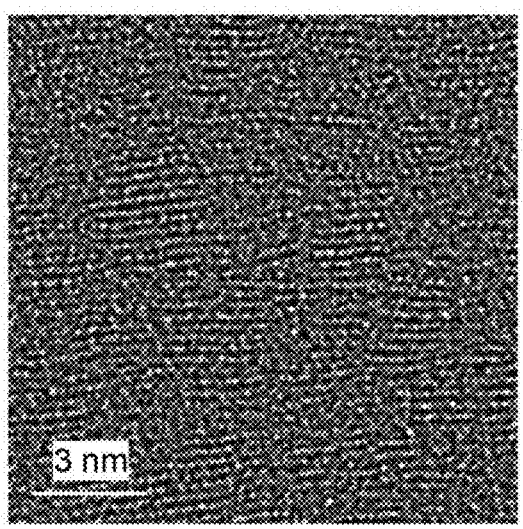
FIGS. 22A to 22E show a cross-sectional TEM image and plan-view TEM images of a CAAC-OS and images obtained through analysis thereof.

FIG. 22A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 22A shows pellets in which metal atoms are arranged in a layered manner. FIG. 22A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 22B:
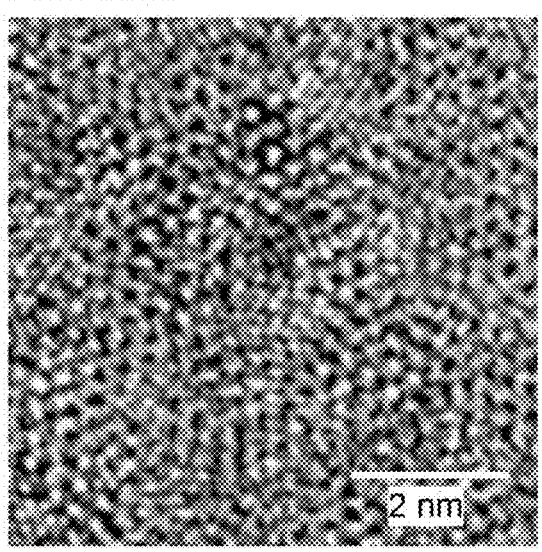
Figure 22C:
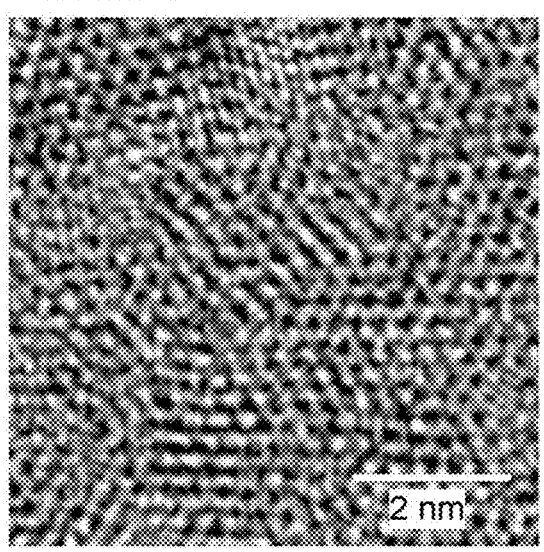
Figure 22D:
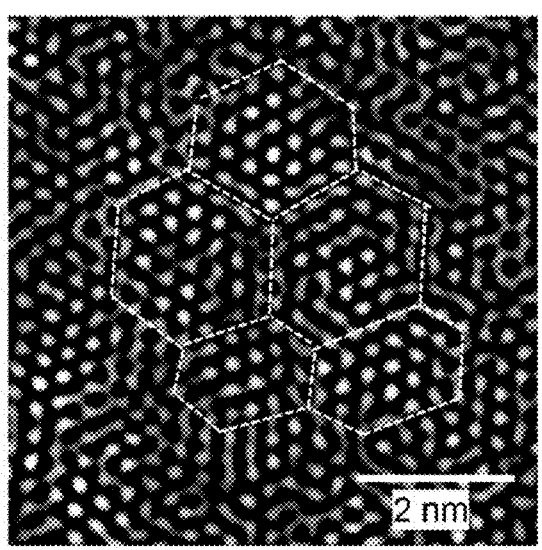
Figure 22E:
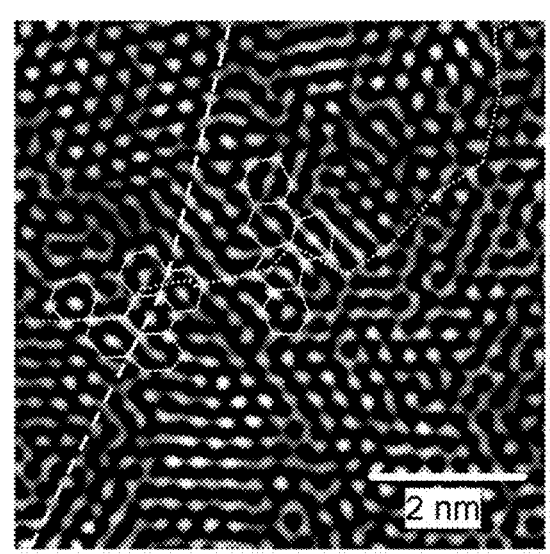

FIGS. 22B and 22C show Cs-corrected high-resolution TEM images of a plane of the CAAC-OS observed from the direction substantially perpendicular to the sample surface. FIGS. 22D and 22E are images obtained through image processing of FIGS. 22B and 22C. The method of image processing is as follows. The image in FIG. 22B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 22D, a portion where a lattice arrangement is broken is shown by dashed lines. A region surrounded by dashed lines is one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 22E, a dotted line denotes a portion between a region with a regular lattice arrangement and another region with a regular lattice arrangement, and a dashed line denotes the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of atomic arrangement in the a-b plane direction, an interatomic bond distance changed by substitution of a metal element, and the like.

As described above, the CAAC-OS has c-axis alignment, its pellets (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, the impurity contained in the oxide semiconductor might serve as a carrier trap or serve as a carrier generation source. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, more preferably lower than $1\times10/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 23A:
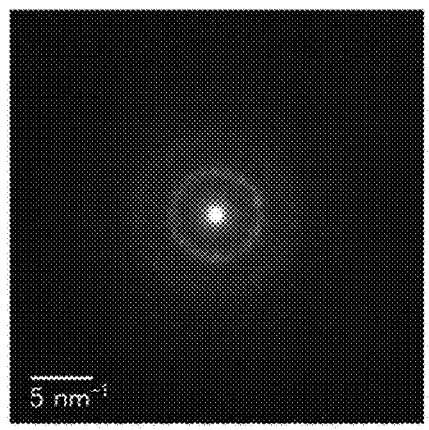
FIGS. 23A to 23D show electron diffraction patterns and a cross-sectional TEM image of an nc-OS.
Figure 23B:
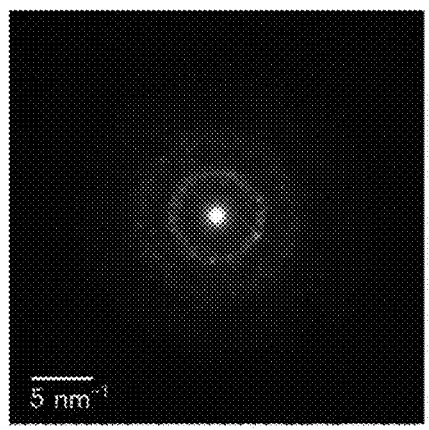

For example, when an electron beam with a probe diameter of 50 nm is incident on a 34-nm-thick region of thinned nc-OS including an InGaZnO$_4$ crystal in the direction parallel to the formation surface, a ring-shaped diffraction pattern (a nanobeam electron diffraction pattern) shown in FIG. 23A is observed. FIG. 14B shows a diffraction pattern obtained when an electron beam with a probe diameter of 1 nm is incident on the same sample. As shown in FIG. 23B, a plurality of spots are observed in a ring-like region. In other words, ordering in an nc-OS is not observed with an electron beam with a probe diameter of 50 nm but is observed with an electron beam with a probe diameter of 1 nm.

Figure 23C:
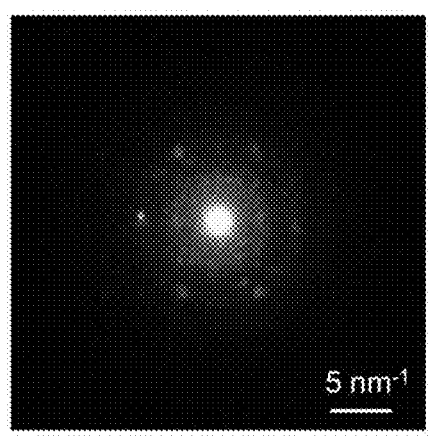

Furthermore, an electron diffraction pattern in which spots are arranged in an approximately hexagonal shape is observed in some cases as shown in FIG. 23C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 23D:
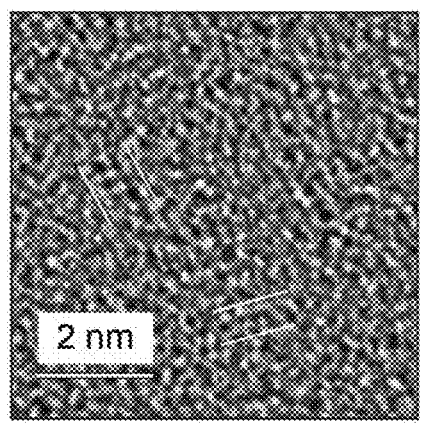

FIG. 23D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 23D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

Figure 24A:
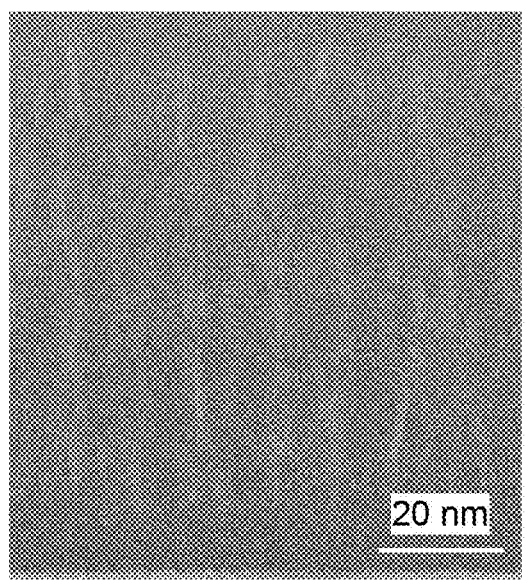
FIGS. 24A and 24B show cross-sectional TEM images of an a-like OS.
Figure 24B:
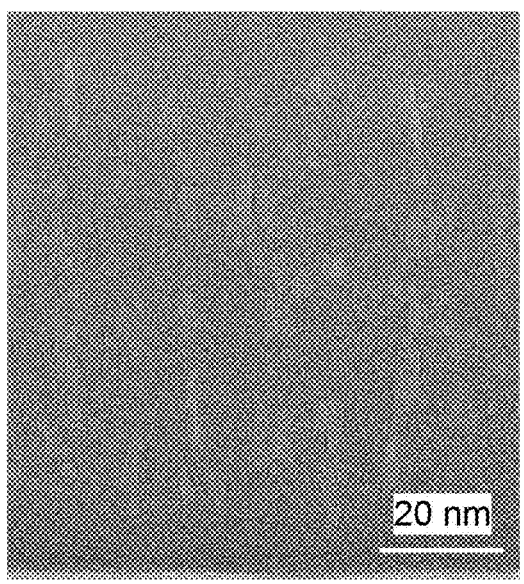

FIGS. 24A and 24B are high-resolution cross-sectional TEM images of an a-like OS. FIG. 24A is the high-resolution cross-sectional TEM image of the a-like OS at the start of the electron irradiation. FIG. 24B is the high-resolution cross-sectional TEM image of the a-like OS after the electron (e$^-$) irradiation at 4.3×10$^8$ e$^-$/nm$^2$. FIGS. 24A and 24B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 25:
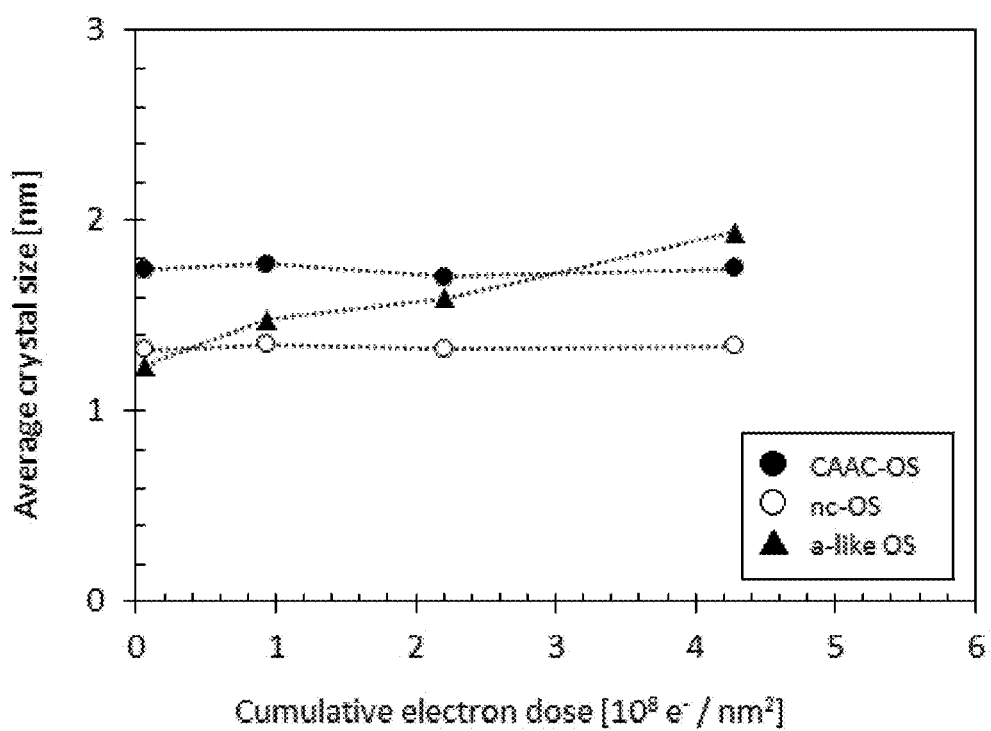
FIG. 25 shows a change in crystal part of an In—Ga—Zn oxide induced by electron irradiation.

FIG. 25 shows change in the average size of crystal parts (at 22 points to 30 points) in each sample. Note that the crystal part size corresponds to the length of a lattice fringe. FIG. 25 indicates that the crystal part size in the a-like OS increases with an increase in the cumulative electron dose in obtaining TEM images, for example. As shown in FIG. 25, a crystal part of approximately 1.2 nm (also referred to as an initial nucleus) at the start of TEM observation grows to a size of approximately 1.9 nm at a cumulative electron (e$^-$) dose of 4.2×10$^8$ e$^-$/nm$^2$. In contrast, the crystal part size in the nc-OS and the CAAC-OS shows little change from the start of electron irradiation to a cumulative electron dose of 4.2×10$^8$ e$^-$/nm$^2$. As shown in FIG. 25, the average size of crystal parts in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations are as follows: the accelerating voltage is 300 kV; the current density is 6.7×10$^5$ e$^-$/(nm$^2$·s); and the diameter of irradiation region is 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition.

Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

The structures and the methods described in this embodiment can be combined as appropriate with any of the structures and the methods described in the other embodiments.

Embodiment 5

In this embodiment, application examples of the storage device using the semiconductor device described in the above embodiment will be described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computer refers to not only a tablet computer, a lap-top computer, and a desk-top computer, but also a large computer such as a server system. Alternatively, the semiconductor device described in the above embodiment is applied to removable storage devices such as memory cards (e.g., SD cards), USB memories, and solid state drives (SSD). FIGS. 26A to 26E schematically illustrate some structural examples of removable storage devices. A packaged memory chip including the semiconductor device described in the above embodiment is used in a variety of storage devices and removable memories, for example.

FIG. 26A is a schematic diagram of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

FIG. 26B is a schematic external diagram of an SD card, and FIG. 26C is a schematic diagram illustrating the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the back side of the substrate 1113, the capacity of the SD card 1110 can be increased. In addition, a wireless chip with a radio communication function may be provided on the substrate 1113. With such a wireless chip, the memory chip 1114 can read and write data by radio communication between the host device and the SD card 1110. The semiconductor device described in the above embodiment can be incorporated in the memory chip 1114 or the like on the substrate 1113.

FIG. 26D is a schematic external diagram of an SSD, and FIG. 26E is a schematic diagram illustrating the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory of the controller chip 1156, and a DRAM chip may be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

This application is based on Japanese Patent Application serial No. 2015-106761 filed with Japan Patent Office on May 26, 2015, the entire contents of which are hereby incorporated by reference.

What is claimed is:

1. A semiconductor device comprising:
a first transistor comprising silicon in a channel formation region;
a first insulating layer over the channel formation region of the first transistor;
a first gate electrode of the first transistor over the first insulating layer;
a plurality of second transistors over the first transistor, the plurality of second transistors overlapping each other in a cross-sectional view;
a plurality of third transistors over the first transistor, two transistors of the plurality of third transistors being arranged adjacent to each other in a top view; and
a plurality of fourth transistors over the first transistor, the plurality of fourth transistors overlapping each other in the cross-sectional view,
wherein one of the plurality of the second transistors and one of the plurality of third transistors are provided adjacent to each other,
wherein a semiconductor in which a channel of a fifth transistor of the plurality of fourth transistors and a channel of a sixth transistor of the plurality of fourth transistors are formed extends in a first direction perpendicular to a top surface of a substrate over which the plurality of fourth transistors are provided,
wherein one of a source electrode and a drain electrode of a seventh transistor of the plurality of second transistors is electrically connected to one of a source electrode and a drain electrode of the first transistor, and
wherein a first conductor extending in the first direction is configured to be electrically connected to the one of the source electrode and the drain electrode of the seventh transistor of the plurality of second transistors and one of a source electrode and a drain electrode of an eighth transistor of the plurality of second transistors.

2. The semiconductor device according to claim 1,
wherein the channel formation region of the first transistor is provided in the substrate, and
wherein a channel formation region of the one of the plurality of second transistors comprises an oxide semiconductor.

3. The semiconductor device according to claim 1,
wherein a plurality of gate electrodes of the plurality of third transistors are electrically connected to each other, and
wherein first electrodes of a plurality of capacitors are electrically connected to each other and provided parallel to the plurality of gate electrodes of the plurality of third transistors in the top view.

4. The semiconductor device according to claim 1,
wherein the semiconductor comprises a source electrode region and a drain electrode region of the fifth transistor of the plurality of fourth transistors and a source electrode region and a drain electrode region of the sixth transistor of the plurality of fourth transistors.

5. A semiconductor device comprising:
a first transistor comprising silicon in a channel formation region;
a first insulating layer over the channel formation region of the first transistor;
a first gate electrode of the first transistor over the first insulating layer;
a plurality of second transistors over the first transistor, the plurality of second transistors overlapping each other in a cross-sectional view;
a plurality of third transistors over the first transistor, two transistors of the plurality of third transistors being arranged adjacent to each other in a top view; and
a plurality of fourth transistors over the first transistor, the plurality of fourth transistors overlapping each other in the cross-sectional view,
wherein one of the plurality of the second transistors and one of the plurality of third transistors are provided adjacent to each other,
wherein a channel formation region of the one of the plurality of second transistors comprises an oxide semiconductor,
wherein a semiconductor in which a channel of a fifth transistor of the plurality of fourth transistors and a channel of a sixth transistor of the plurality of fourth transistors are formed extends in a first direction perpendicular to a top surface of a substrate over which the plurality of fourth transistors are provided,
wherein one of a source electrode and a drain electrode of a seventh transistor of the plurality of second transistors is electrically connected to one of a source electrode and a drain electrode of the first transistor,
wherein a first conductor extending in the first direction is configured to be electrically connected to the one of the source electrode and the drain electrode of the seventh transistor of the plurality of second transistors and one of a source electrode and a drain electrode of an eighth transistor of the plurality of second transistors, and
wherein a second conductor comprises a first region configured to function as the other of the source electrode and the drain electrode of the seventh transistor of the plurality of second transistors, a second region configured to function as a first electrode of a capacitor, and a third region configured to function as a gate electrode of the fifth transistor of the plurality of fourth transistors.

6. The semiconductor device according to claim 5,
wherein a plurality of gate electrodes of the plurality of third transistors are electrically connected to each other, and
wherein first electrodes of a plurality of capacitors are electrically connected to each other and provided parallel to the plurality of gate electrodes of the plurality of third transistors in the top view.

7. A semiconductor device comprising:
a first transistor comprising silicon in a channel formation region;
a first insulating layer over the channel formation region of the first transistor;
a first gate electrode of the first transistor over the first insulating layer;
a plurality of second transistors over the first transistor, the plurality of second transistors overlapping each other in a cross-sectional view;
a plurality of third transistors over the first transistor, two transistors of the plurality of third transistors being arranged adjacent to each other in a top view; and
a plurality of fourth transistors over the first transistor, the plurality of fourth transistors overlapping each other in the cross-sectional view,
wherein one of the plurality of the second transistors and one of the plurality of third transistors are provided adjacent to each other,
wherein one of a source electrode and a drain electrode of a fifth transistor of the plurality of second transistors is electrically connected to one of a source electrode and a drain electrode of the first transistor,
wherein a first conductor extending in a first direction perpendicular to a top surface of a substrate is configured to be electrically connected to the one of the source electrode and the drain electrode of the fifth transistor of the plurality of second transistors and one of a source electrode and a drain electrode of a sixth transistor of the plurality of second transistors, and
wherein the other of the source electrode and the drain electrode of the fifth transistor of the plurality of second transistors, a first electrode of a capacitor, and a gate electrode of a seventh transistor of the plurality of fourth transistors are electrically connected to each other.

8. The semiconductor device according to claim 7,
wherein the channel formation region of the first transistor is provided in the substrate, and
wherein a channel formation region of the one of the plurality of second transistors comprises an oxide semiconductor.

9. The semiconductor device according to claim 7,
wherein a plurality of gate electrodes of the plurality of third transistors are electrically connected to each other, and
wherein first electrodes of a plurality of capacitors are electrically connected to each other and provided parallel to the plurality of gate electrodes of the plurality of third transistors in the top view.

10. The semiconductor device according to claim 7,
wherein a channel formation region of the fifth transistor is provided in a semiconductor extending in the first direction.

* * * * *